(12) United States Patent
Kato et al.

(10) Patent No.: US 11,200,703 B2
(45) Date of Patent: Dec. 14, 2021

(54) INFORMATION PROCESSING DEVICE AND METHOD

(71) Applicant: Sony Corporation, Tokyo (JP)

(72) Inventors: Tsuyoshi Kato, Kanagawa (JP); Satoru Kuma, Tokyo (JP); Ohji Nakagami, Tokyo (JP); Koji Yano, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/651,358

(22) PCT Filed: Sep. 21, 2018

(86) PCT No.: PCT/JP2018/034982
§ 371 (c)(1),
(2) Date: Mar. 27, 2020

(87) PCT Pub. No.: WO2019/069711
PCT Pub. Date: Apr. 11, 2019

(65) Prior Publication Data
US 2020/0273211 A1 Aug. 27, 2020

(30) Foreign Application Priority Data
Oct. 5, 2017 (JP) .............................. JP2017-195065

(51) Int. Cl.
*G06T 9/40* (2006.01)
*G06T 19/00* (2011.01)

(52) U.S. Cl.
CPC ............... *G06T 9/40* (2013.01); *G06T 19/00* (2013.01); *G06T 2210/56* (2013.01)

(58) Field of Classification Search
CPC ....... G06T 9/40; G06T 19/00; G06T 2210/56; G06T 17/005; G06T 9/005; H04N 13/161;
(Continued)

(56) References Cited

U.S. PATENT DOCUMENTS 8,027,545 B2 9/2011 Lee et al.
2014/0307770 A1* 10/2014 Jiang ................... H04N 13/161
375/240.01

FOREIGN PATENT DOCUMENTS

EP 2 786 601 10/2014
JP 2005-235210 A 9/2005
(Continued)

OTHER PUBLICATIONS

International Search Report and Written Opinion dated Dec. 11, 2018 for PCT/JP2018/034982 filed on Sep. 21, 2018, 8 pages including English Translation of the International Search Report.
(Continued)

*Primary Examiner* — Jennifer Mehmood
*Assistant Examiner* — Andrew Shin
(74) *Attorney, Agent, or Firm* — Xsensus LLP

(57) ABSTRACT

An information processing device and method for enabling partial control of the resolution of a data group that can be turned into a tree structure. Data of an Octree pattern is encoded, so that a bit stream containing depth control information indicating that a leaf node is to be formed at a different level from the lowest level based on information specifying the depth of the Octree pattern is generated. Also, a bit stream is decoded, so that an Octree pattern including a leaf node at a different level from the lowest level is constructed, on the basis of depth control information indicating that the leaf node is to be formed at a different level from the lowest level based on information specifying the depth of the Octree pattern. The present disclosure can be applied to an information processing device, an image processing device, an electronic apparatus, an information processing method, a program, or the like, for example.

9 Claims, 29 Drawing Sheets

(58) Field of Classification Search
CPC ....... H04N 19/10; H04N 19/119; H03M 7/30; H03M 7/70; H03M 7/3059; H03M 7/3079
See application file for complete search history.

(56) References Cited

FOREIGN PATENT DOCUMENTS

| | | |
|---|---|---|
| JP | 2015-502100 A | 1/2015 |
| WO | 2013/078958 A1 | 6/2013 |

OTHER PUBLICATIONS

Mekuria, R., et al., "Design, Implementation and Evaluation of a Point Cloud Codec for Tele Immersive Video," IEEE Transactions on Circuits and Systems for Video Technology, vol. 27, No. 4, Apr. 2017, pp. 1-14.

Anonymous: "Octree", Wikipedia, Apr. 6, 2017 (Apr. 6, 2017), XP055737723, Retrieved from the Internet: URL:https://en.wikipedia.org/w/index.php?title=Octree&oldid=774135880 [retrieved on Oct. 7, 2020].

Extended European Search Report dated Oct. 19, 2020, in corresponding European Patent Application No. 18865014.7.

\* cited by examiner

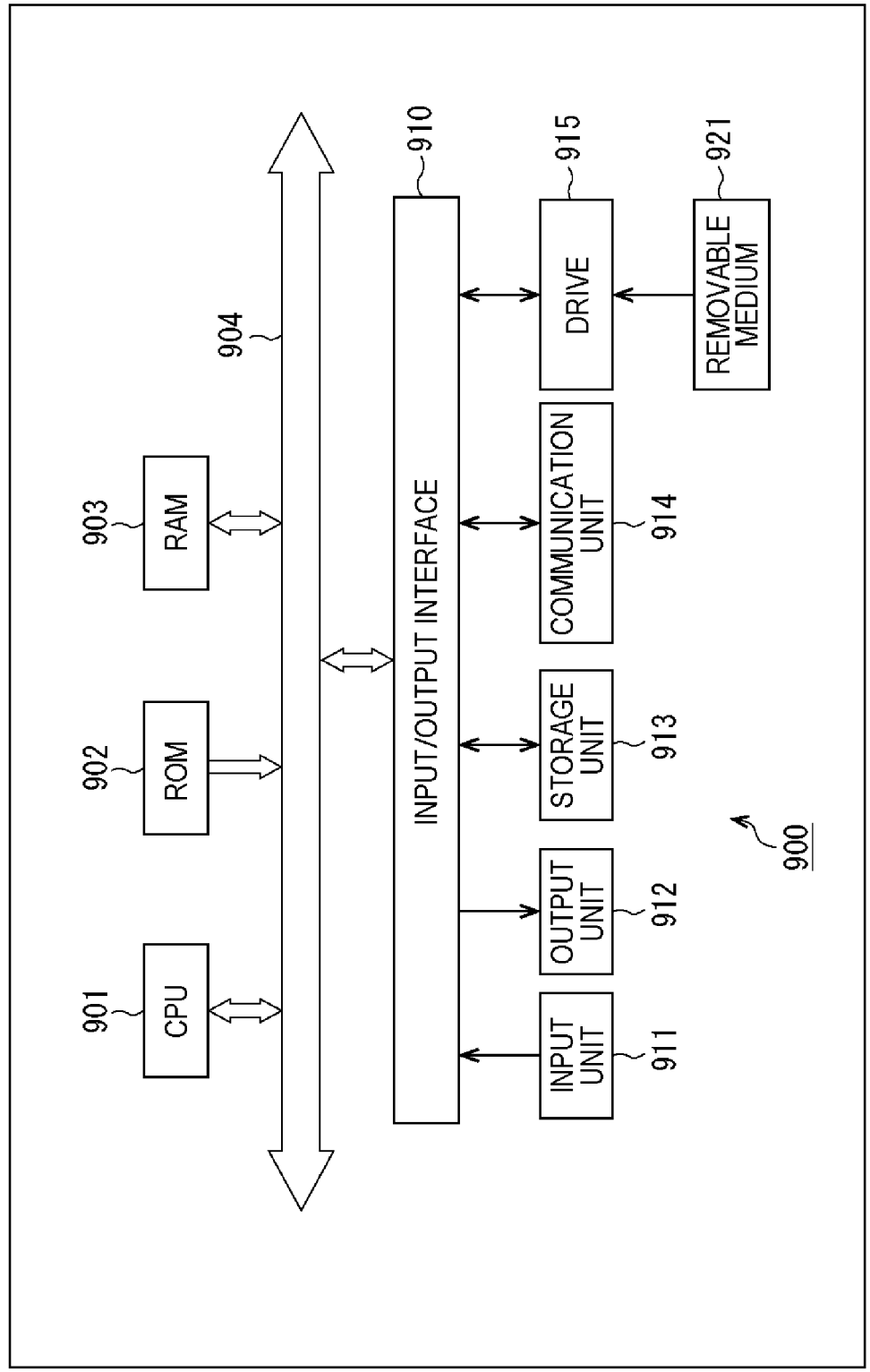

INFORMATION PROCESSING DEVICE AND METHOD

CROSS-REFERENCE TO RELATED APPLICATIONS

The present application is based on PCT filing PCT/JP2018/034982, filed Sep. 21, 2018, which claims priority to JP 2017-195065, filed Oct. 5, 2017, the entire contents of each are incorporated herein by reference.

TECHNICAL FIELD

The present disclosure relates to an information processing device and method, and more particularly, to an information processing device and method designed to be able to partially control the resolution of a data group that can be turned into a tree structure.

BACKGROUND ART

Examples of conventional methods for compressing vertex data of a point cloud that represents a three-dimensional structure with positional information, attribute information, and the like about a point group, or a mesh that is formed with vertices, edges, and planes and defines a three-dimensional shape using polygonal representation include quantization using voxels, such as Octree (see Non-Patent Document 1, for example).

CITATION LIST

Non-Patent Document

Non-Patent Document 1: R. Mekuria, Student Member IEEE, K. Blom, P. Cesar., Member, IEEE, "Design, Implementation and Evaluation of a Point Cloud Codec for Tele-Immersive Video", tcsvt paper submitted february.pdf

SUMMARY OF THE INVENTION

Problems to be Solved by the Invention

In an Octree pattern, however, all points are expressed at the same resolution. For this reason, it is difficult to apply Octree encoding when the resolution of points in some regions is different from the resolution in other regions in a point cloud.

The present disclosure has been made in view of such circumstances, and is to enable partial control of the resolution of a data group that can be turned into a tree structure.

Solutions to Problems

An information processing device of one aspect of the present technology is an information processing device that includes an encoding unit that encodes Octree pattern data that is the data of an Octree pattern, to generate a bit stream containing depth control information indicating that a leaf node is to be formed at a different level from the lowest level based on information specifying the depth of the Octree pattern.

An information processing method of one aspect of the present technology is an information processing method that includes encoding Octree pattern data that is the data of an Octree pattern, to generate a bit stream containing depth control information indicating that a leaf node is to be formed at a different level from the lowest level based on information specifying the depth of the Octree pattern.

An information processing device of another aspect of the present technology is an information processing device that includes a decoding unit that decodes a bit stream, to construct an Octree pattern including a leaf node at a different level from the lowest level, on the basis of depth control information indicating that the leaf node is to be formed at a different level from the lowest level based on information specifying the depth of the Octree pattern.

An information processing method of another aspect of the present technology is an information processing method that includes decoding a bit stream, to construct an Octree pattern including a leaf node at a different level from the lowest level, on the basis of depth control information indicating that the leaf node is to be formed at a different level from the lowest level based on information specifying the depth of the Octree pattern.

In the information processing device and method of one aspect of the present technology, Octree pattern data that is the data of an Octree pattern is encoded, so that a bit stream containing depth control information indicating that a leaf node is to be formed at a different level from the lowest level based on information specifying the depth of the Octree pattern is generated.

In the information processing device and method of another aspect of the present technology, a bit stream is decoded, so that an Octree pattern including a leaf node at a different level from the lowest level is constructed, on the basis of depth control information indicating that the leaf node is to be formed at a different level from the lowest level based on information specifying the depth of the Octree pattern.

Effects of The Invention

According to the present disclosure, information can be processed. Particularly, the resolution of a data group that can be turned into a tree structure can be partially controlled.

BRIEF DESCRIPTION OF DRAWINGS

FIG. 29 is a block diagram showing a principal example configuration of a computer.

MODE FOR CARRYING OUT THE INVENTION

The following is a description of modes for carrying out the present disclosure (these modes will be hereinafter referred to as embodiments). Note that explanation will be made in the following order.
1. Partial depth control on an Octree pattern
2. First embodiment (a terminal identification bit pattern)
3. Second embodiment (end_of_node_one_bit)
4. Third embodiment (split_voxel_flag)
5. Other aspects 1. Partial Depth Control on an Octree Pattern <Point Cloud>
There have been data such as point clouds that represent three-dimensional structures with positional information, attribute information, and the like about point groups, and meshes that are formed with vertices, edges, and planes, and define three-dimensional shapes using polygonal representations.

Figure 1:
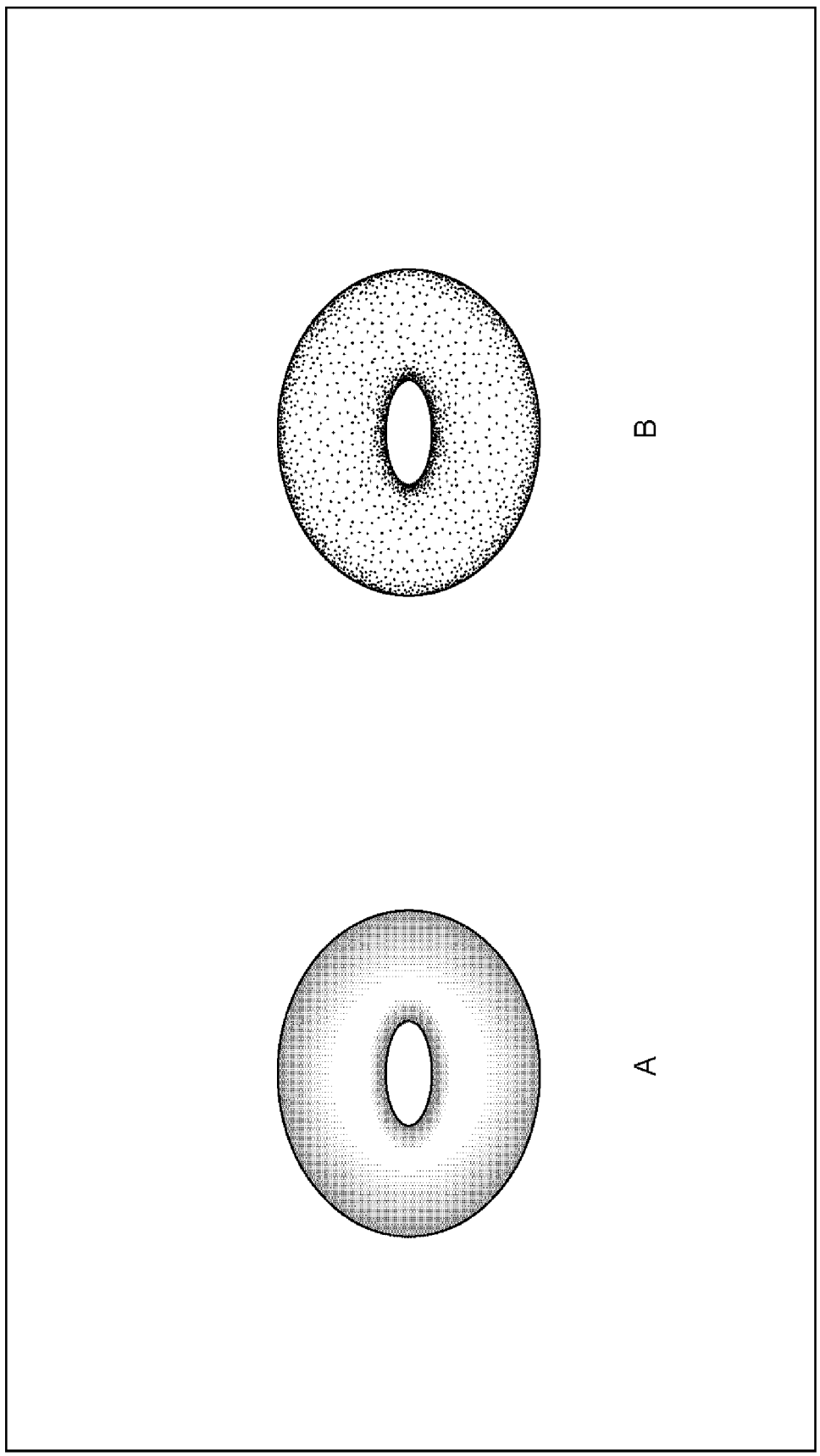
FIG. 1 is a diagram for explaining an example of a point cloud.

In the case of a point cloud, for example, a three-dimensional structure as shown in A of FIG. 1 is expressed as a set of a large number of points (a point group) (point data) as shown in B of FIG. 1. That is, the data of a point cloud (also referred to as point cloud data) is formed with positional information and attribute information (colors and the like, for example) about the respective points in the point group. Accordingly, the data structure is relatively simple, and any desired three-dimensional structure can be expressed with a sufficiently high accuracy with the use of a sufficiently large number of points.

However, the data amount of such a point cloud, a mesh, or the like is relatively large. Therefore, there is a demand for compression of the data amount by encoding or the like. For example, an encoding method using voxels, such as Octree or KDtree has been considered. A voxel is a data structure for quantizing positional information about an encoding target.

<Octree Encoding>
The data of such a voxel structure (the data is also referred to as voxel data) is single-layer data. That is, all voxels have the same size. Octree encoding is to convert such voxel data into a maximum octree structure (also called an Octree pattern) in which the space having points existing therein is recursively divided into 2×2×2 spaces (two divisional spaces in each of the x, y, and z directions). As the spaces having no points existing therein can be integrated (as an upper level) in this manner, the amount of information can be reduced.

That is, in an Octree pattern, the regions in which points exist are regarded as nodes. Each node is set with a bit string indicating whether or not there is a point for each region (space) obtained by dividing the region (space) into 2×2×2 regions (eight divisions). For example, each node is set with an 8-bit string in which the presence/absence of points in each region is expressed by one bit (the value "0" indicates that no points exist, and the value "1" indicates that points exist). A child node is formed only for a region corresponding to a bit whose value in the bit string is "1". That is, the maximum is an octree. When such tree dividing is repeated, and the level reaches the depth set by a parameter set or the like (which is the lowest level), the tree dividing comes to an end.

That is, in an Octree pattern, nodes (leaf nodes) having no child nodes are formed only at the lowest level corresponding to the depth of the Octree pattern set in the parameter set or the like. Accordingly, the depth (the number of levels) of this Octree pattern is the same for all the regions in which points exist, as in the tree structure shown in A of FIG. 2. In other words, all the points are expressed with the same resolution.

Meanwhile, there is a demand for a function for partially controlling the resolution of the points in a point cloud. The partial control is, for example, to make the resolution of all the points not uniform. For example, the resolution of some points is made different from the resolution of other points.

For example, when a region of interest (ROI) exists in a point cloud, it is conceivable that the points in the region of interest are made higher in resolution than the points in the other regions. In this manner, subjective image quality can be increased depending on demand. Further, encoding efficiency can also be increased.

Further, there might be a case where points match the voxel grid, and the points can be expressed without an increase in the resolution (even if the resolution is lower than the other points), for example. In this manner, it is possible to prevent an increase in the number of unnecessary nodes in the Octree pattern, and prevent a decrease in encoding efficiency.

Further, there might be a case where Octree encoding and some other encoding tool are combined, and some nodes are made to have a higher resolution by the other encoding tool, for example.

However, leaf nodes are formed only at the lowest level in an Octree pattern as described above, and therefore, such partial control of the resolution of points cannot be expressed. That is, it is difficult to partially control the resolution of a data group that can be turned into a tree structure. In other words, when the resolution of the points in a point cloud is partially controlled as described above, it is difficult to apply Octree encoding, which might result in a lower encoding efficiency. That is, when the resolution of a data group is partially controlled, it is difficult to turn the data group into a tree structure, which might result in a lower encoding efficiency.

<Depth Control>

Therefore, Octree pattern data that is the data of an Octree pattern is encoded, so that a bit stream containing "depth control information" indicating that a leaf node is to be formed at a different level from the lowest level based on the information specifying the depth of the Octree pattern is generated.

For example, an information processing device includes an encoding unit that encodes Octree pattern data that is the data of an Octree pattern, to generate a bit stream containing "depth control information" indicating that a leaf node is to be formed at a different level from the lowest level based on the information specifying the depth of the Octree pattern.

Figure 2:
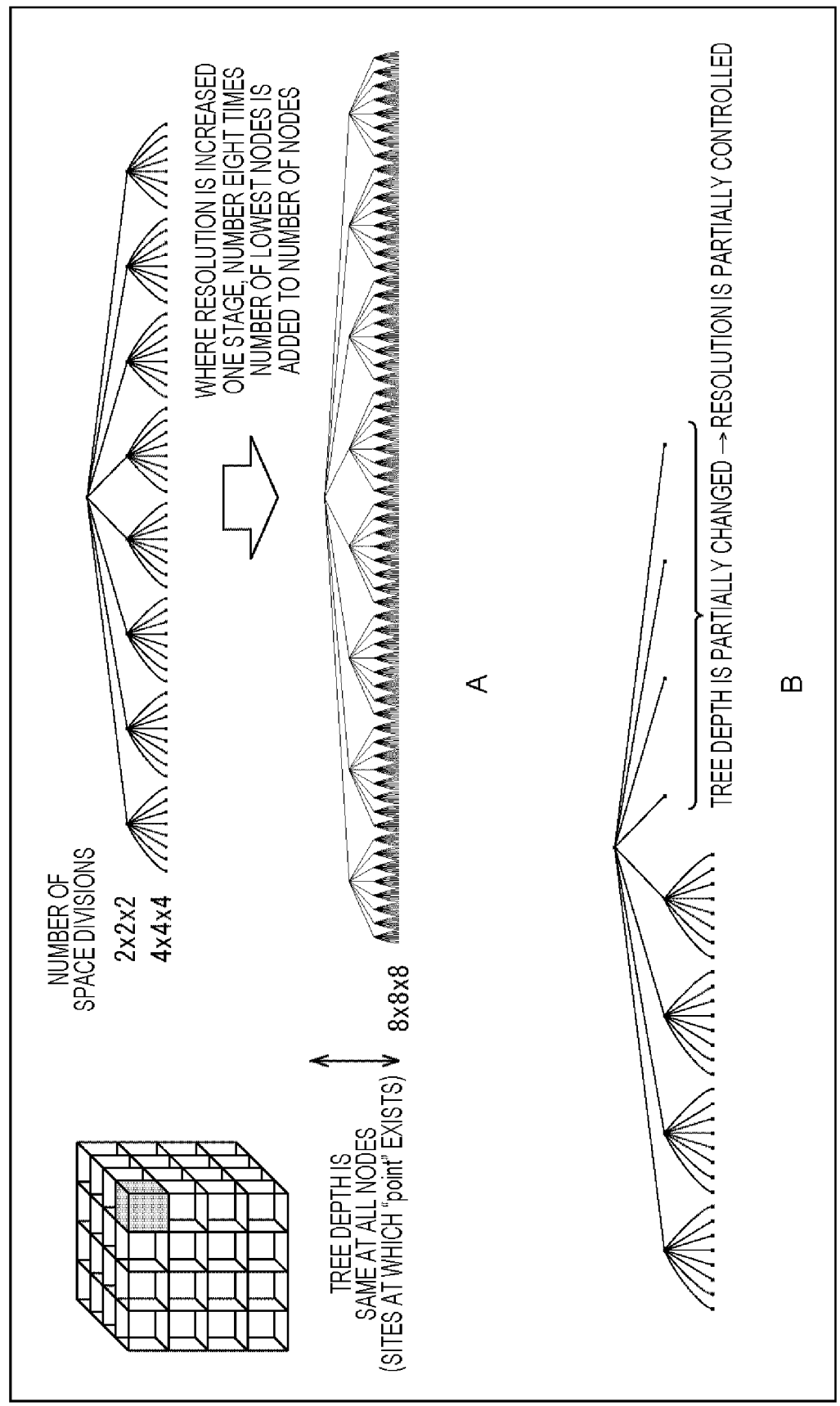
FIG. 2 is a diagram for explaining an example of depth control on an Octree pattern.

In this manner, the depth of the Octree pattern can be partially controlled, as in the tree structure shown in B of FIG. 2, for example. That is, the resolution of points can be partially controlled in a point cloud to be subjected to Octree encoding. That is, the resolution of a data group that can be turned into a tree structure can be partially controlled.

Further, in other words, when the resolution of the points in a point cloud is partially controlled, Octree encoding can be applied, and a decrease in encoding efficiency can be prevented. That is, when the resolution of a data group is partially controlled, the data group can also be turned into a tree structure, and a decrease in encoding efficiency can be prevented.

Note that, in the description below, an example case where the present technology is applied to Octree pattern data will be explained. However, the present technology can be applied to data having any appropriate tree structure such as KDtree, a binary tree structure, or a quadtree structure, for example. Further, in the description below, an example of point cloud data (voxel data generated by quantizing point cloud data) will be explained. However, this data may have any appropriate contents, as long as the data resolution can be partially controlled. For example, this data may be data of some other type relating to a three-dimensional structure such as a mesh, or may be data relating to a structure other than a three-dimensional structure.

<Encoding Device>

Figure 3:
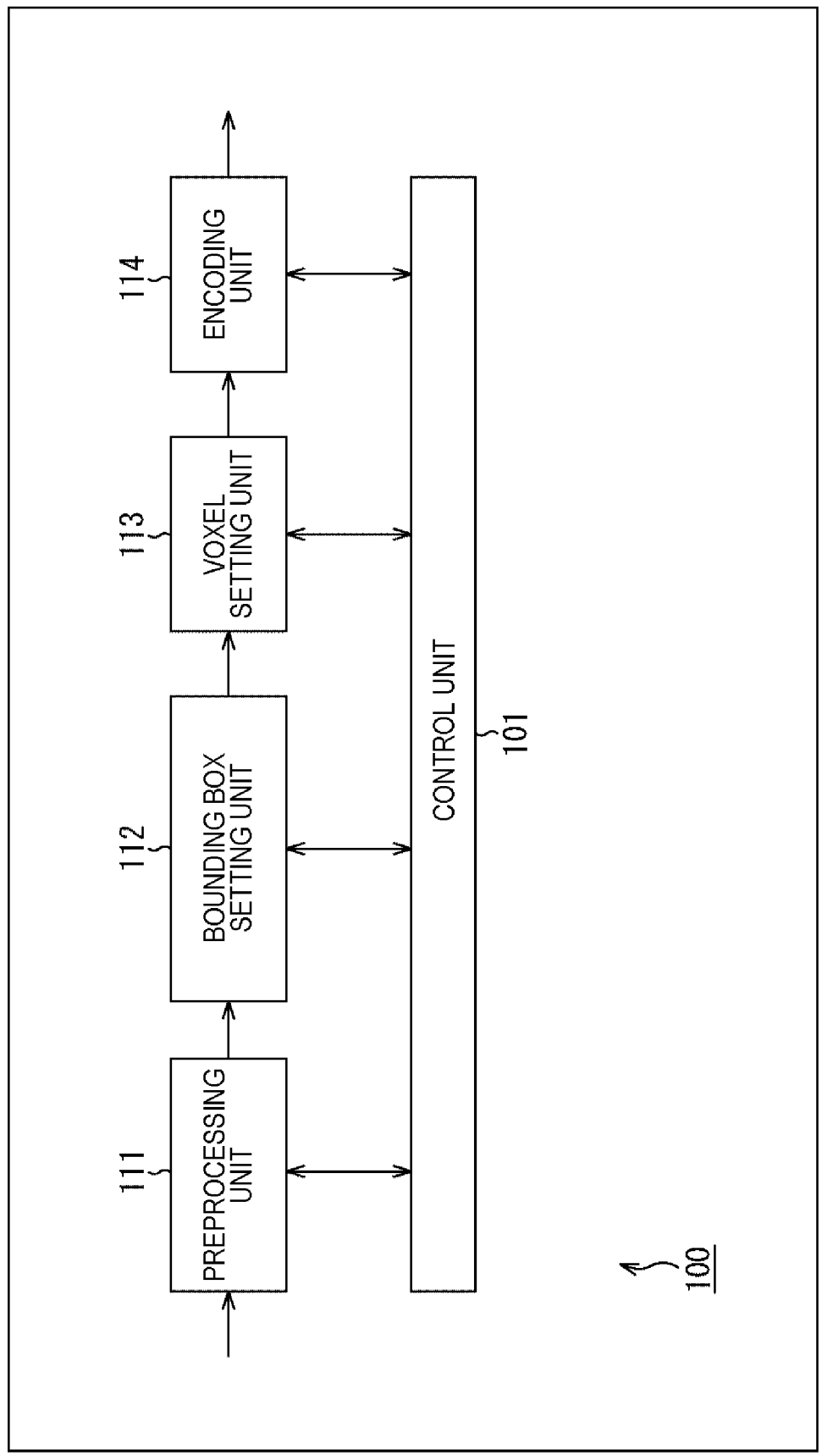
FIG. 3 is a block diagram showing a principal example configuration of an encoding device.

FIG. 3 is a block diagram showing a principal example configuration of an encoding device as an embodiment of an information processing device to which the present technology is applied. An encoding device 100 shown in FIG. 3 encodes point cloud data that has been input as an encoding target, using voxels. The encoding device 100 outputs the obtained encoded data and the like. In doing so, the encoding device 100 performs the encoding by a method to which the present technology is applied as described below.

As shown in FIG. 3, the encoding device 100 includes a control unit 101, a preprocessing unit 111, a bounding box setting unit 112, a voxel setting unit 113, and an encoding unit 114.

The control unit 101 performs processing relating to control on the respective processing units in the encoding device 100. For example, the control unit 101 controls execution or skips (omission) of processing by the respective processing units. For example, the control unit 101 performs such control on the basis of predetermined control information. By doing so, the control unit 101 can prevent execution of unnecessary processing, and reduce the increase in load.

The control unit 101 may have any configuration. For example, the control unit 101 includes a central processing unit (CPU), a read only memory (ROM), a random access memory (RAM), and the like, and may perform processing as the CPU loads a program and data stored in the ROM or the like into the RAM and executes the program.

The preprocessing unit 111 is controlled by the control unit 101, performs predetermined processing as preprocessing on the point cloud data (the encoding target) input to the encoding device 100, and supplies the processed data to the bounding box setting unit 112.

Note that the point cloud to be encoded may be a moving image or a still image.

For example, in accordance with control information that allows or prohibits execution of preprocessing, the control unit 101 causes the preprocessing unit 111 to perform preprocessing when execution of preprocessing is allowed (not prohibited). Also, in accordance with control information indicating an encoding target range in which execution of preprocessing is to be allowed or prohibited, for example, the control unit 101 causes the preprocessing unit 111 to perform preprocessing on an encoding target for which execution of preprocessing is allowed (not prohibited). Further, in accordance with control information designating the contents of processing to be allowed or prohibited to be performed, for example, the control unit 101 causes the preprocessing unit 111 to perform processing allowed (not prohibited) to be performed. By doing so, the control unit 101 can prevent execution of unnecessary preprocessing, and reduce the increase in load.

Note that the contents of preprocessing may be any appropriate contents. For example, the preprocessing unit 111 may perform a noise reduction process as preprocessing, or may perform a process of changing resolution (the number of points) as preprocessing. Alternatively, the arrangement of the respective points may be updated so that the density of the point group is equalized, or a desired bias is provided, for example. Further, non-point-cloud data such as image information including depth information may be input to the encoding device 100, and the preprocessing unit 111 may perform conversion of the input data into point cloud data as preprocessing, for example.

The preprocessing unit 111 may have any configuration. For example, the preprocessing unit 111 may include a CPU, a ROM, a RAM, and the like, and the CPU may load a program and data stored in the ROM or the like into the RAM, and execute the program, to perform preprocessing.

The bounding box setting unit 112 is controlled by the control unit 101, and performs a process relating to setting of a bounding box for normalizing the positional information about an encoding target.

For example, in accordance with control information that allows or prohibits setting of a bounding box, the control unit 101 causes the bounding box setting unit 112 to set a bounding box when setting of the bounding box is allowed (not prohibited). Also, in accordance with control information indicating an encoding target range in which setting of a bounding box is allowed or prohibited, for example, the control unit 101 causes the bounding box setting unit 112 to set a bounding box for an encoding target for which setting of the bounding box is allowed (not prohibited). Further, in accordance with control information regarding allowance or prohibition of parameters to be used in setting a bounding box, for example, the control unit 101 causes the bounding box setting unit 112 to set a bounding box, using the parameters allowed (not prohibited) to be used. By doing so, the control unit 101 can prevent setting of an unnecessary bounding box and the use of unnecessary parameters, and reduce the increase in load.

For example, the bounding box setting unit 112 sets a bounding box for each object to be encoded. For example, as shown in A of FIG. 4, when an object 131 and an object 132 are expressed by point cloud data, the bounding box setting unit 112 sets a bounding box 141 and a bounding box 142 so as to contain the object 131 and the object 132, respectively, as shown in B of FIG. 4. Referring back to FIG. 3, after setting the bounding boxes, the bounding box setting unit 112 supplies information regarding the bounding boxes to the voxel setting unit 113.

Note that the bounding box setting unit 112 may have any configuration. For example, the bounding box setting unit 112 may include a CPU, a ROM, a RAM, and the like, and the CPU may load a program and data stored in the ROM or the like into the RAM, and execute the program, to perform a process relating to setting of bounding boxes.

The voxel setting unit 113 is controlled by the control unit 101, and performs a process relating to setting of voxels for quantizing the positional information about an encoding target.

For example, in accordance with control information allowing or prohibiting setting of voxels, the control unit 101 causes the voxel setting unit 113 to set voxels when setting of the voxels is allowed (not prohibited). Also, in accordance with control information indicating an encoding target range in which setting of voxels is allowed or prohibited, for example, the control unit 101 causes the voxel setting unit 113 to set voxels for an encoding target for which setting of the voxels is allowed (not prohibited). Further, in accordance with control information regarding allowance or prohibition of parameters to be used in setting voxels, for example, the control unit 101 causes the voxel setting unit 113 to set voxels using the parameters allowed (not prohibited) to be used. By doing so, the control unit 101 can prevent setting of unnecessary voxels and the use of unnecessary parameters, and reduce the increase in load.

For example, the voxel setting unit 113 sets voxels in the bounding boxes set by the bounding box setting unit 112. For example, the voxel setting unit 113 sets a voxel 151 by dividing the bounding box 141, as shown in C of FIG. 4. That is, the voxel setting unit 113 quantizes (or voxelizes) the point cloud data in the bounding box with voxels. Note that, when there is a plurality of bounding boxes, the voxel setting unit 113 voxelizes the point cloud data for each bounding box. That is, in the case of the example shown in B of FIG. 4, the voxel setting unit 113 performs a similar process on the bounding box 142. Referring back to FIG. 3, after setting the voxels as described above, the voxel setting unit 113 supplies the encoding unit 114 with the voxelized point cloud data (also referred to as voxel data) (information regarding the data structure for quantizing the positional information), attribute information, and the like.

Note that the voxel setting unit 113 may have any configuration. For example, the voxel setting unit 113 may include a CPU, a ROM, a RAM, and the like, and the CPU may load a program and data stored in the ROM or the like into the RAM, and execute the program, to perform a process relating to setting of voxels.

The encoding unit 114 is controlled by the control unit 101, and performs a process relating to encoding.

For example, in accordance with control information that allows or prohibits encoding, the control unit 101 causes the encoding unit 114 to encode voxel data when encoding is allowed (not prohibited). Also, in accordance with control information indicating an encoding target range in which encoding is to be allowed or prohibited, for example, the control unit 101 causes the encoding unit 114 to perform encoding on an encoding target for which encoding of voxel data is allowed (not prohibited). By doing so, the control unit 101 can prevent unnecessary encoding, and reduce the increase in load.

Figure 4:
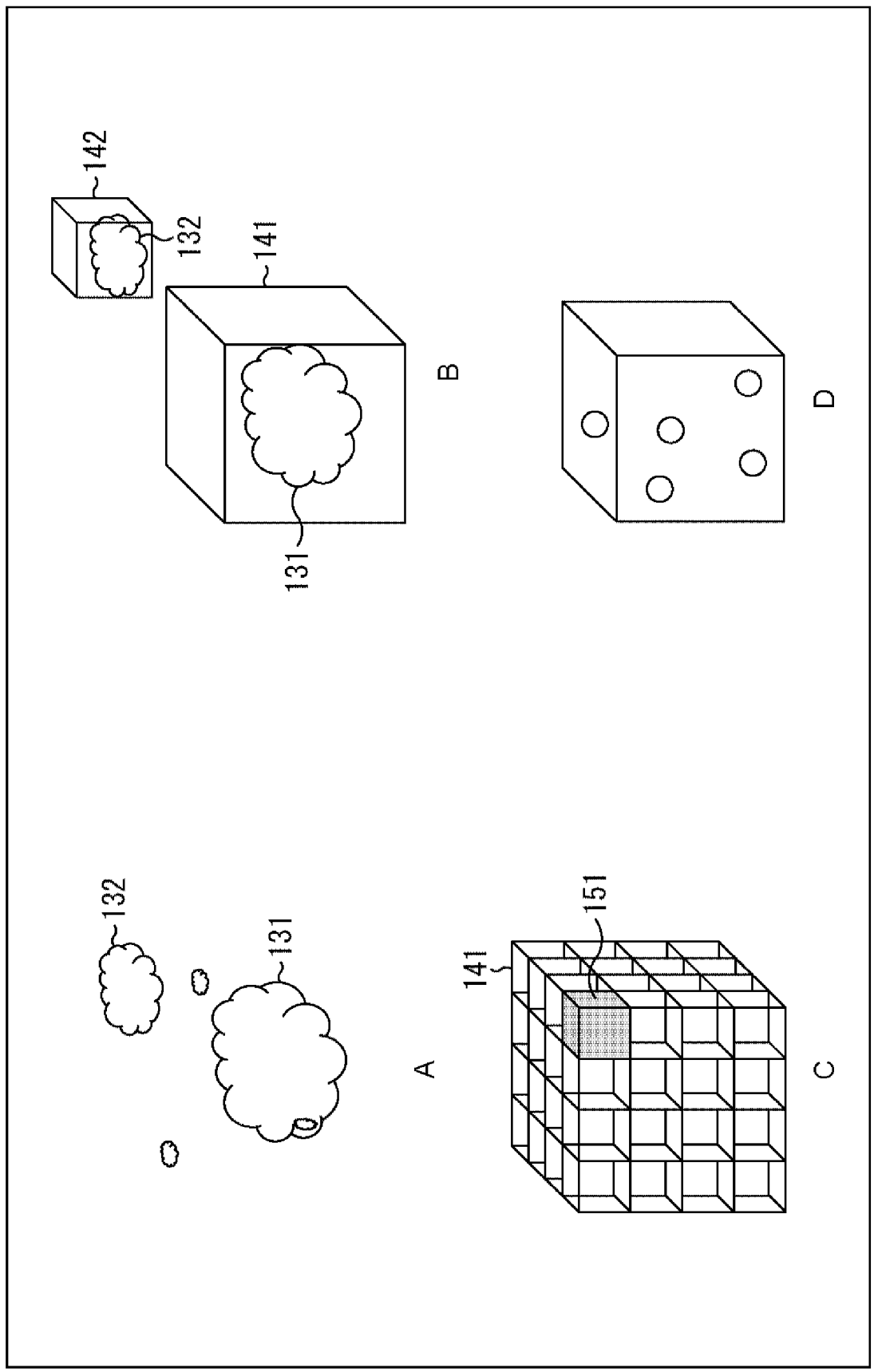
FIG. 4 is a diagram for explaining an example outline of encoding.

The encoding unit 114 encodes voxel data obtained by quantizing point cloud data (such as voxel data generated by the voxel setting unit 113 as shown in C of FIG. 4), for example, and generates encoded data (a bit stream). D of FIG. 4 shows an example state of an encoded signal sequence.

The encoding unit 114 also encodes, as appropriate, related information other than point cloud data, such as control information, for example, and stores the encoded information into a header, a parameter set, or the like. For example, the encoding unit 114 stores information specifying the depth (the number of levels) of an Octree pattern into a header, a parameter set, or the like.

The encoding unit 114 associates the bit streams of the above various kinds of information with one another. Here, the term "to associate" means to enable use of other data (or a link to other data) while data is processed, for example. That is, pieces of data associated with each other may be integrated as one piece of data, or may be regarded as separate pieces of data.

For example, control information associated with encoded data may be transmitted through a transmission path different from the encoded data. Further, control information associated with encoded data may be recorded in a recording medium different from the encoded data (or in a different recording area of the same recording medium), for example. Note that this "association" may apply to some of the data, instead of the entire data. For example, encoded data and control information may be associated with each other for any appropriate unit, such as for a plurality of frames, each frame, or some portion in each frame.

The encoding unit 114 outputs the encoded data (bit streams) obtained by such encoding to the outside of the encoding device 100. The data (encoded data and control information) output from the encoding device 100 may be decoded by a processing unit (not shown) in a subsequent stage, for example, so that the data of point clouds can be restored. Alternatively, the data may be transmitted by a communication unit (not shown) to another device such as a decoding device via a predetermined transmission path, or may be recorded into a recording medium (not shown).

Note that the encoding unit 114 may have any configuration. For example, the encoding unit 114 may include a CPU, a ROM, a RAM, and the like, and the CPU may load a program and data stored in the ROM or the like into the RAM, and execute the program, to perform a process relating to encoding.

2. First Embodiment

<Terminal Identification Bit Pattern>

The encoding unit 114 performs Octree encoding on voxel data supplied from the voxel setting unit 113, to generate the data of an Octree pattern (Octree pattern data). The encoding unit 114 also performs lossless encoding on the generated Octree pattern data, to generate a bit stream.

When the encoding unit 114 terminates a node that is not a node at the lowest level of the Octree pattern in the Octree encoding (turns the node into a leaf node), the encoding unit 114 applies the present technology, and generates a bit stream containing "depth control information indicating that a leaf node is to be formed at a level other than the lowest level based on information specifying the depth of the Octree pattern".

This depth control information is any appropriate information, but may be a predetermined bit string indicating that "a particular node corresponding to the depth control information at a higher level than the lowest level of the Octree pattern is a leaf node", for example.

With this arrangement, the "predetermined bit string" is detected on the decoding side, so that "the particular node being a leaf node" can be easily recognized.

Figure 5:
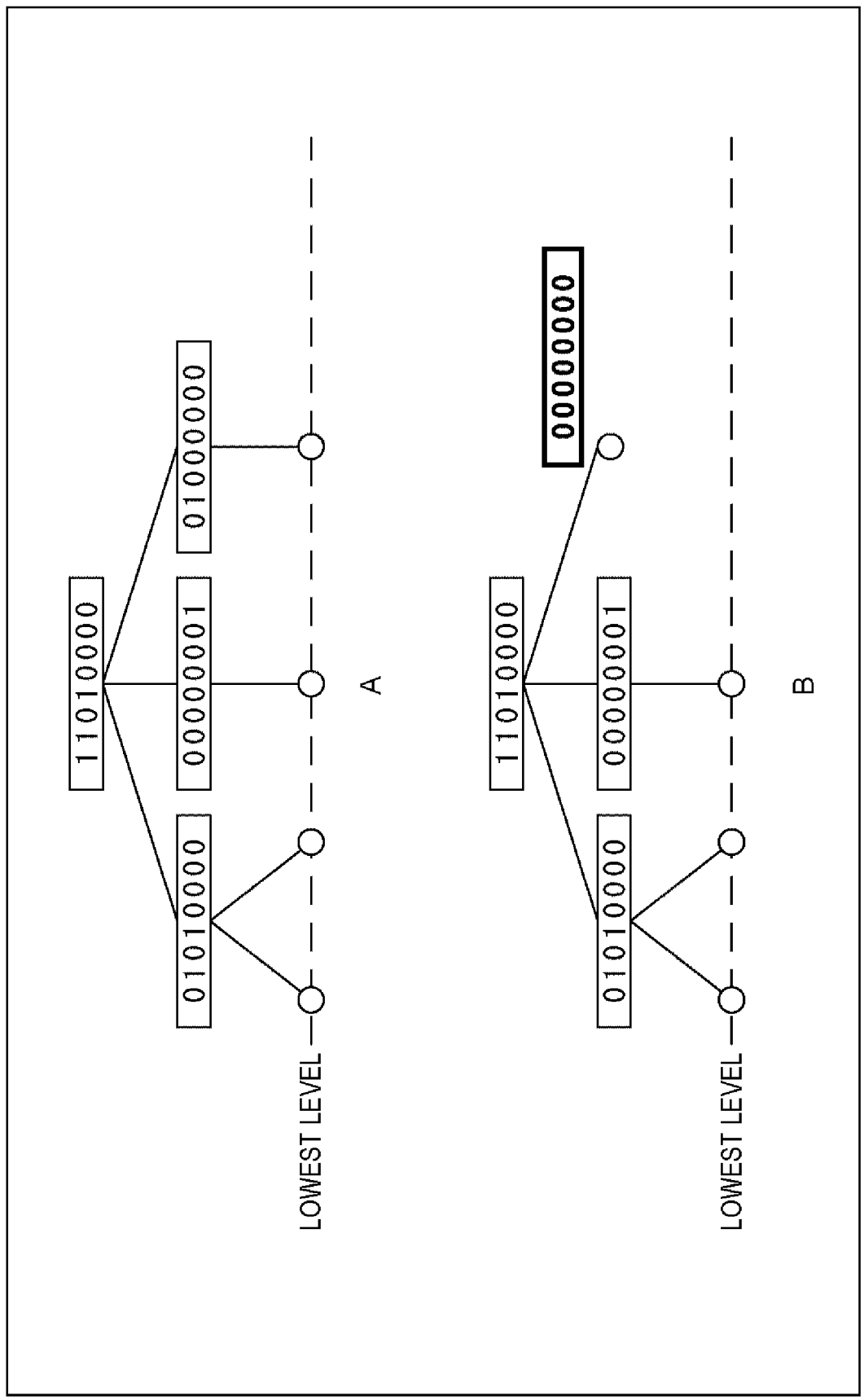
FIG. 5 is a diagram for explaining an example of depth control information.

For example, in a general Octree pattern, the regions having nodes existing therein are formed as nodes, as shown in A of FIG. 5. For each node (other than the nodes at the lowest level), the region is divided into eight regions, and an 8-bit bit string (a Child mask) indicating in which one of the eight divided regions a point exists is set. This bit string indicates that a point exists in the region corresponding to the bit having the value "1" among the eight divided regions (or indicates that any point does not exist in the regions corresponding to the bits having the value "0").

In the case of a general Octree pattern, descendant nodes are formed even at the lowest level without branching, as shown in A of FIG. 5. For example, the node on the right side at the level that is one level higher than the lowest level has only one child node (without branching), but a bit string having a bit pattern "01000000" is set, and the position of a point at the lowest level is shown. The node at the center has a similar structure. In the center node, a bit pattern "00000001" is set without branching, and the position of a point at the lowest level is shown. Therefore, in this case, the positions (resolutions) of all the points are shown at the lowest level.

On the other hand, the encoding unit 114 sets, as the "depth control information" described above, a bit string having a bit pattern indicating that the node to be terminated (the node having no descendant nodes to be formed) at a level higher than the lowest level is a leaf node (a terminal), as shown in B of FIG. 5. The encoding unit 114 then sets the node as a leaf node, and skips the formation of descendant nodes. The encoding unit 114 then performs lossless encoding on the Octree pattern data including the node for which the "bit string (depth control information)" has been set, and generates a bit stream containing the "bit string (depth control information)".

In other words, the "predetermined bit string", which is the "depth control information" in this case, is set in a node at a level higher than the lowest level of the Octree pattern in the Octree pattern data, and has a bit pattern indicating that the node having the "predetermined bit string" set therein is a leaf node. The encoding unit 114 then generates a bit stream by encoding the Octree pattern data in which "predetermined bit string" is set in the leaf node at the higher level than the lowest level of the Octree pattern.

That is, the position of the leaf node at the higher level than the lowest level of the Octree pattern is indicated by the position of the "bit string (depth control information)". Accordingly, on the decoding side, when the bit stream is decoded to reconstruct the Octree pattern, the position of the "bit string (depth control information)" is checked, so that the leaf node at the higher level than the lowest level of the Octree pattern can be detected. That is, it is possible to correctly decode an Octree pattern including a leaf node at a higher level than the lowest level.

In other words, with such a "bit string (depth control information)", it is possible to express partial control on the resolution of the points in an Octree pattern. That is, the resolution of points can be partially controlled in a point cloud to be subjected to Octree encoding (or the resolution of a data group that can be turned into a tree structure can be partially controlled).

In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

Note that the bit pattern of the "predetermined bit string" (the bit pattern is also referred to as the terminal identification bit pattern) may be a bit pattern not to be used for a bit string to be set in a node that is not a leaf node of the Octree pattern. For example, in the example case illustrated in B of FIG. 5, a bit string having a bit pattern "00000000" (a terminal identification bit pattern) is assigned to the right node (a leaf node) at the level that is one level higher than the lowest level. The bit pattern "00000000" indicates that there are no points existing in any of the divided eight regions. In a general Octree pattern, however, such a node does not exist at any higher level than the lowest level.

With this arrangement, a leaf node at a level other than the lowest level can be expressed by a bit string having the same specification as the bit strings that are set in the other nodes. That is, a bit string having the same structure as that of the other nodes can be set in a leaf node. Accordingly, the amount of specification change from general Octree encoding can be reduced, and the present technology can be more readily applied.

However, the terminal identification bit pattern may be any appropriate pattern as long as it can indicate that the node is a "leaf node", and is not limited to the above example ("00000000"). For example, the bit depth may be different from that in the other bit strings that are set in the nodes that are not leaf nodes.

Note that the bit string of the terminal identification bit pattern may be stored at a position other than the position of the corresponding node, if the correspondence relationship with the leaf node has been made clear. For example, the bit string of the terminal identification bit pattern may be collectively stored in a header, a parameter set, or the like. Alternatively, this bit string may be included in a bit stream different from the bit stream of the Octree pattern data. In these cases, information indicating which bit string corresponds to which leaf node is also necessary.

<Encoding Unit>

Figure 6:
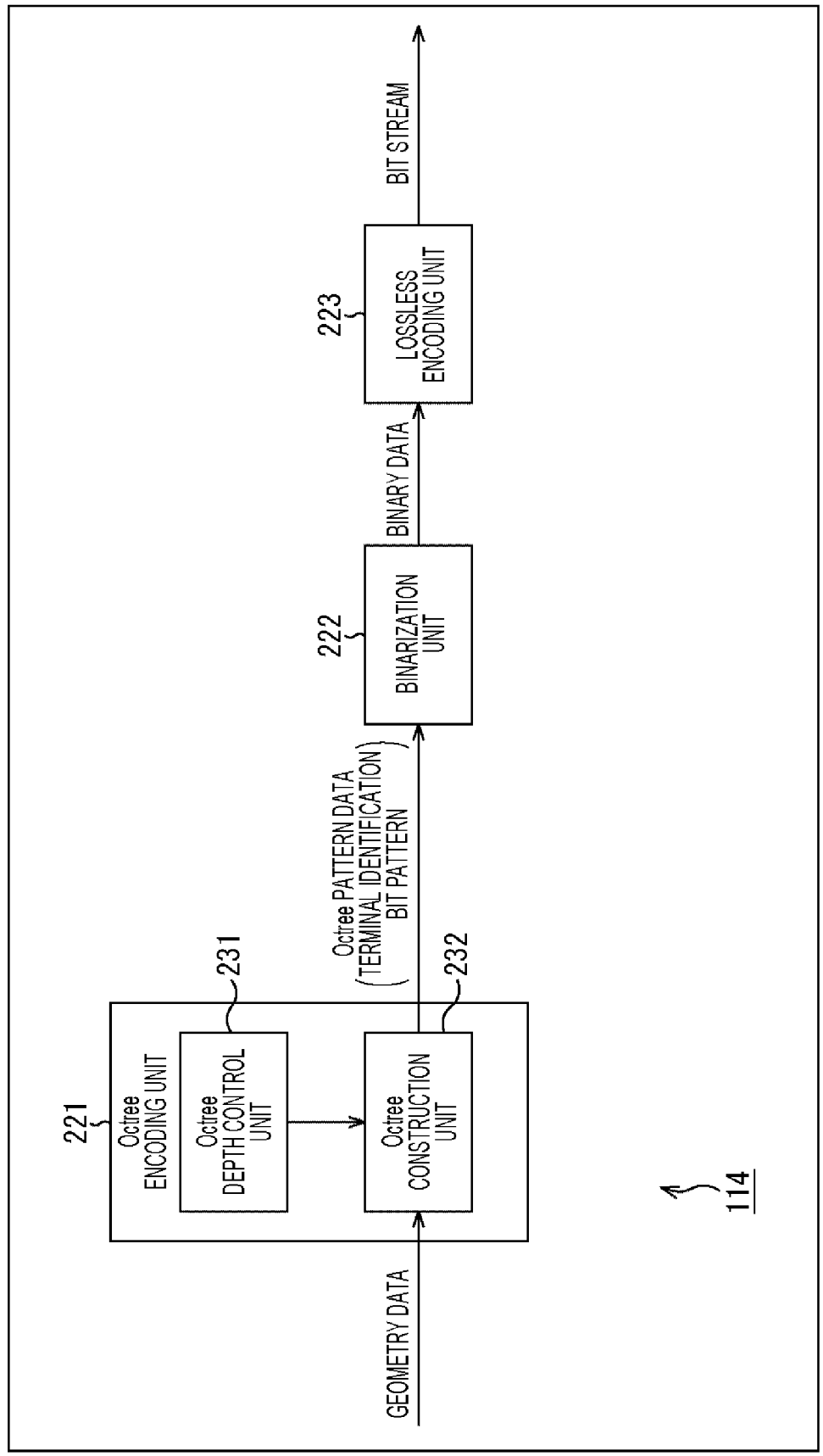
FIG. 6 is a block diagram showing a principal example configuration of an encoding unit.

FIG. 6 is a block diagram showing a principal example configuration of the encoding unit 114 (FIG. 3). As shown in FIG. 6, the encoding unit 114 includes an Octree encoding unit 221, a binarization unit 222, and a lossless encoding unit 223.

The Octree encoding unit 221 performs a process relating to Octree encoding. For example, the Octree encoding unit 221 performs Octree encoding on the geometry data (positional information) of voxel data supplied from the voxel setting unit 113, to generate Octree pattern data. When a desired node at a different level from the lowest level is to be turned into a leaf node in that stage, the Octree encoding unit 221 sets the above "bit string of the terminal identification bit pattern" (such as a bit string having a bit pattern "00000000", for example) in the desired node.

As shown in FIG. 6, the Octree encoding unit 221 includes an Octree depth control unit 231 and an Octree construction unit 232.

The Octree depth control unit 231 performs control relating to the depth of an Octree pattern. The Octree construction unit 232 performs a process relating to construction of an Octree pattern. For example, the Octree construction unit 232 constructs an Octree pattern on the basis of geometry data, and generates Octree pattern data corresponding to the geometry data. The Octree depth control unit 231 controls the construction of the Octree pattern, to control the depth of the Octree pattern.

For example, when the Octree construction unit 232 generates an Octree pattern by performing Octree encoding on geometry data, the Octree depth control unit 231 controls the Octree construction unit 232, so that a desired node at a higher level than the lowest level of the Octree pattern can be turned into a leaf node. That is, a node can be terminated (not to form any descendant node) at a higher level than the lowest level of the Octree pattern. In that case, the Octree depth control unit 231 may control the Octree construction unit 232, to set the above "bit string of the terminal identification bit pattern" in the desired node.

The Octree encoding unit 221 (the Octree construction unit 232) supplies the binarization unit 222 with Octree pattern data including the "bit string of the terminal identification bit pattern".

By doing so, the encoding unit 114 can set the "bit string of the terminal identification bit pattern" in the node to be a leaf node, while forming an Octree pattern.

Note that the Octree encoding unit 221 (each of the Octree depth control unit 231 and the Octree construction unit 232) may have any configuration. For example, the Octree encoding unit 221 may include a CPU, a ROM, a RAM, and the like, and the CPU may load a program and data stored in the ROM or the like into the RAM, and execute the program, to perform a process relating to Octree encoding.

The binarization unit 222 performs a process relating to binarization. For example, the binarization unit 222 binarizes the Octree pattern data supplied from the Octree encoding unit 221, to generate binary data. The binarization unit 222 supplies the generated binary data to the lossless encoding unit 223.

Note that the binarization unit 222 may have any configuration. For example, the binarization unit 222 may include a CPU, a ROM, a RAM, and the like, and the CPU may load a program and data stored in the ROM or the like into the RAM, and execute the program, to perform a process relating to binarization.

The lossless encoding unit 223 performs a process relating to lossless encoding. For example, the lossless encoding unit 223 performs lossless encoding on the binary data supplied from the binarization unit 222, to generate a bit stream (which is the encoded data of the Octree pattern data). Any appropriate method may be used for this lossless encoding. For example, context-based adaptive binary arithmetic code (CABAC) may be used.

The lossless encoding unit 223 also stores information specifying the depth (the number of levels) of the Octree pattern of the Octree pattern data into a header, a parameter set, or the like, which is included in the bit stream, for example.

The lossless encoding unit 223 outputs the generated bit stream to the outside of the encoding unit 114 (in other words, the outside of the encoding device 100).

Note that the lossless encoding unit 223 may have any configuration. For example, the lossless encoding unit 223 may include a CPU, a ROM, a RAM, and the like, and the CPU may load a program and data stored in the ROM or the like into the RAM, and execute the program, to perform a process relating to lossless encoding.

As described above, when a node is terminated at a higher level than the lowest level of an Octree pattern, the Octree pattern data generated by the Octree encoding unit 221 includes the bit string of the terminal identification bit pattern. That is, the lossless encoding unit 223 generates a bit stream containing the bit string (depth control information) of the terminal identification bit pattern.

Thus, the resolution of points can be partially controlled in a point cloud to be subjected to Octree encoding (or the resolution of a data group that can be turned into a tree structure can be partially controlled). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

Note that any appropriate method may be used for encoding Octree pattern data. For example, Octree pattern data may be encoded with context-based adaptive variable length code (CAVLC). In that case, instead of the binarization unit 222 and the lossless encoding unit 223, a lossless encoding unit that conducts CAVLC may be provided.

<Flow in an Encoding Process>

An example flow in an encoding process to be performed by the encoding device 100 having the above configuration is now described with reference to the flowchart shown in FIG. 7.

When an encoding process is started, the preprocessing unit 111 performs preprocessing on input data in step S101.

In step S102, the bounding box setting unit 112 sets a bounding box for the data subjected to the preprocessing.

In step S103, the voxel setting unit 113 sets voxels in the bounding box that has been set in step S102.

In step S104, the encoding unit 114 encodes geometry data of the voxel data generated by the process in step S103.

In step S105, the encoding unit 114 outputs the bit stream obtained by the encoding to the outside of the encoding device 100. This bit stream is transmitted to a decoding side (a decoding device or the like), or is recorded into a recording medium, for example. When the process in step S105 is completed, the encoding process comes to an end. When the encoding target is a moving image, for example, this series of processes is performed for each frame.

<Flow in the Geometry Data Encoding Process>

Figure 7:
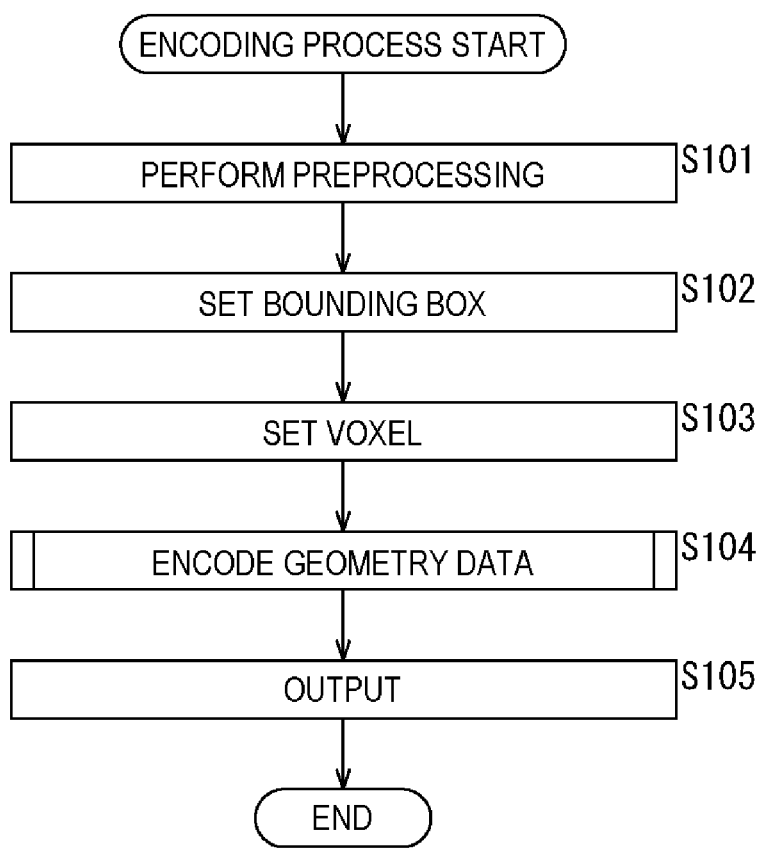
FIG. 7 is a flowchart for explaining an example flow in an encoding process.
Figure 8:
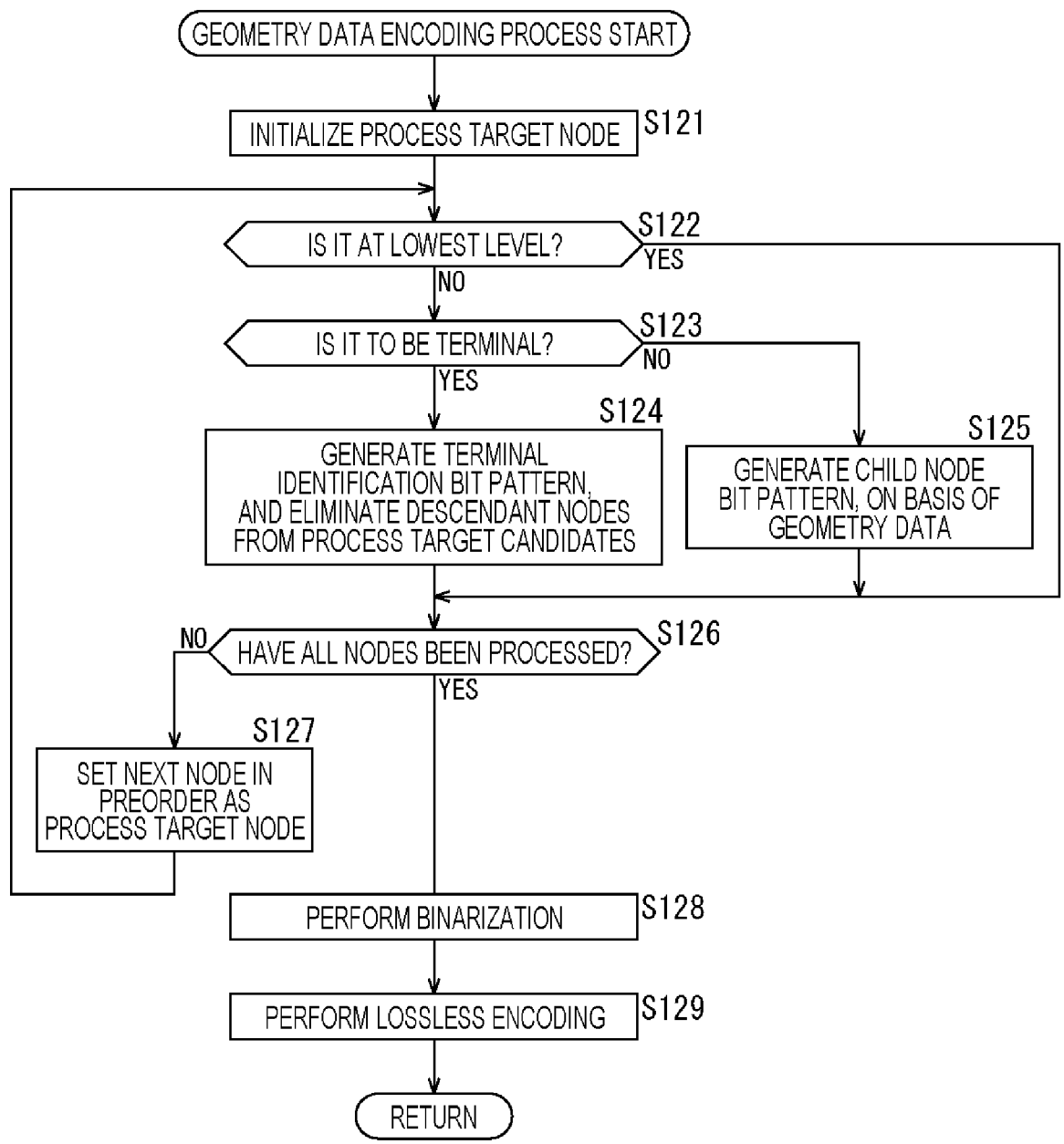
FIG. 8 is a flowchart for explaining an example flow in a geometry data encoding process.

Next, an example flow in the geometry data encoding process to be performed in step S104 in FIG. 7 is described, with reference to the flowchart shown in FIG. 8.

When the geometry data encoding process is started, the Octree depth control unit 231 initializes the processing target node in the Octree pattern in step S121.

In step S122, the Octree depth control unit 231 determines whether or not the level of the processing target node is the lowest level. When the level of the processing target node is determined not to be the lowest level, the process moves on to step S123.

In step S123, the Octree depth control unit 231 determines whether or not the processing target node is to be turned into a terminal. When it is determined that the processing target node is to be turned into a terminal, or that the processing target node is to be turned into a leaf node, the process moves on to step S124.

In step S124, the Octree construction unit 232 generates and sets a terminal identification bit pattern ("00000000", for example) for the processing target node to be turned into a terminal. The Octree construction unit 232 also excludes the descendant nodes of the processing target node from the processing target candidates. That is, the processing target node is turned into a leaf node, and any child node belonging to the leaf node is not formed. After the process in step S124 is completed, the process moves on to step S126.

When it is determined in step S123 that the processing target node is not to be turned into a terminal, on the other hand, the process moves on to step S125.

In step S125, for the processing target node not to be turned into a terminal, the Octree construction unit 232 generates a "bit pattern of a child node", which is a bit string having a bit pattern indicating in which one of the regions formed by dividing the region corresponding to the processing target node by eight (2×2×2) a point exists, on the basis of the geometry data. The Octree construction unit 232 then sets the bit string in the processing target node. After the process in step S125 is completed, the process moves on to step S126.

When it is determined in step S122 that the level of the processing target node is the lowest level, which is the level with the same resolution as (the voxels of) the geometry data, on the other hand, the processes in steps S123 through S125 are skipped, and the process moves on to step S126. That is, any bit string is not set in a node at the lowest level.

In step S126, the Octree depth control unit 231 determines whether or not all the nodes have been processed. When it is determined that the Octree pattern corresponding to the geometry data has not been constructed, and there is an unprocessed node, the process moves on to step S127.

In step S127, the Octree depth control unit 231 sets the processing target node as the next node in the preorder. After the processing target node is updated, the process returns to step S122. That is, the respective processes in steps S122 through S127 are performed for each node of the Octree pattern corresponding to the geometry data.

When it is determined in step S126 that the Octree pattern corresponding to the geometry data has been constructed, and all the nodes have been processed, the process then moves on to step S128.

In step S128, the binarization unit 222 binarizes the Octree pattern data corresponding to the geometry data generated by the above process.

In step S129, the lossless encoding unit 223 performs lossless encoding on the binary data obtained by the process in step S128, to generate a bit stream. Since the Octree pattern data includes the bit string of the terminal identification bit pattern as a result of the process in step S124, the lossless encoding unit 223 generates a bit stream containing the bit string of the terminal identification bit pattern.

When the process in step S129 is completed, the geometry data encoding process comes to an end, and the process returns to FIG. 7.

As the respective processes are performed as described above, the encoding device 100 can partially control the resolution of the points in a point cloud to be subjected to Octree encoding (or can partially control the resolution of a data group that can be turned into a tree structure). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

Note that the preorder has been described as an example of an Octree pattern scanning order. However, this scanning order may be any appropriate order, and is not necessarily the preorder. For example, the scanning order may be a leading order, a pre-order, a passing order, a middle order, an intermediate order, a passing-by order, a backward order, a subsequent order, a post-order, a return order, a level order, or the like.

<Another Example of the Encoding Unit>

Note that an Octree pattern may be edited after generation, and a desired node at a higher level than the lowest level may be turned into a leaf node.

Figure 9:
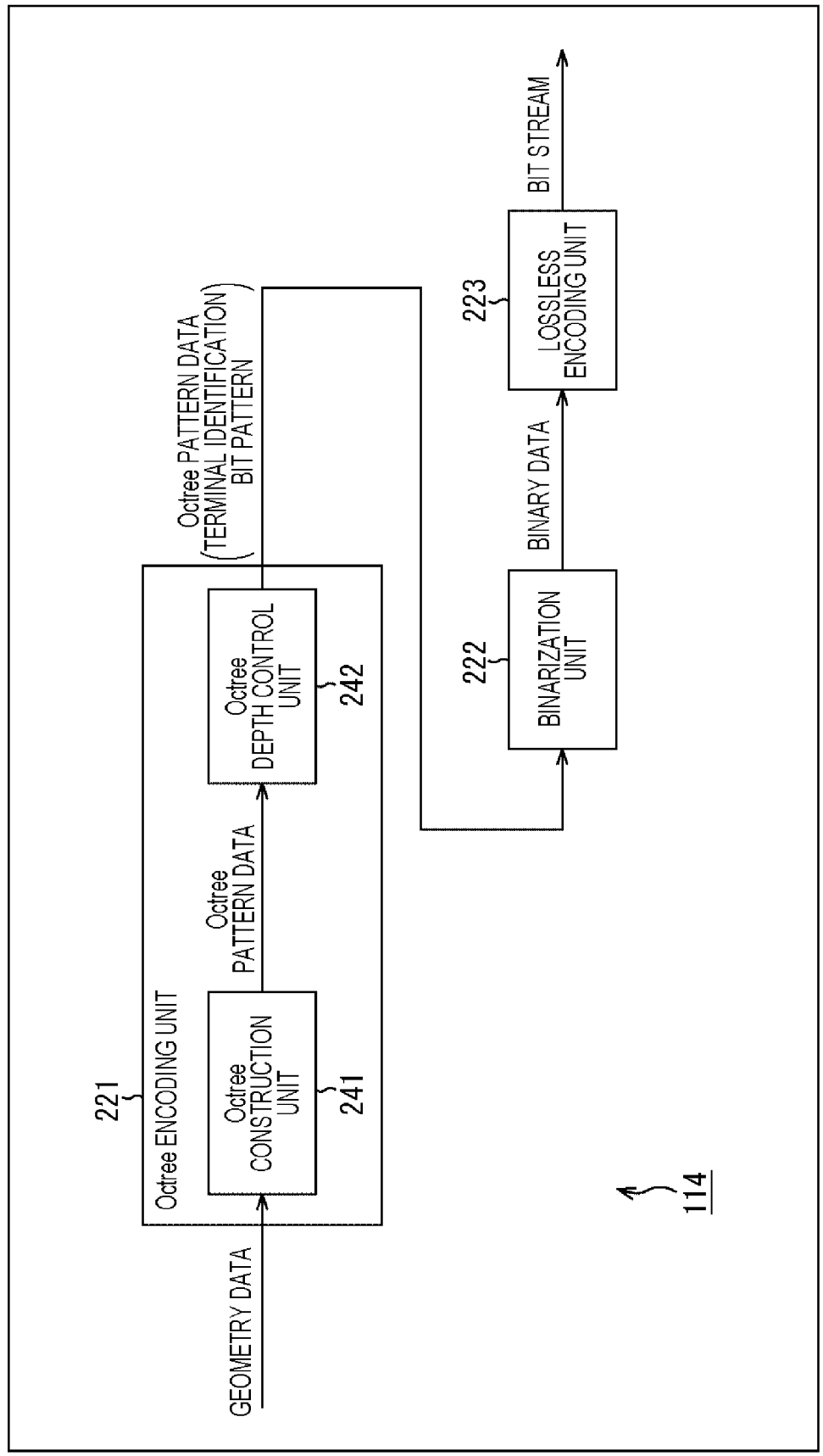
FIG. 9 is a block diagram showing a principal example configuration of an encoding unit.

FIG. 9 is a block diagram showing a principal example configuration of the encoding unit 114 (FIG. 3) in that case. As shown in FIG. 9, the encoding unit 114 in this case includes the Octree encoding unit 221, the binarization unit 222, and the lossless encoding unit 223, as in the case illustrated in FIG. 6.

However, the Octree encoding unit 221 includes an Octree construction unit 241 and an Octree depth control unit 242. The Octree construction unit 241 performs a process relating to construction of an Octree pattern. For example, the Octree construction unit 241 performs general Octree encoding, to construct an Octree pattern on the basis of geometry data and generate Octree pattern data corresponding to the geometry data.

The Octree depth control unit 242 performs control relating to the depth of the Octree pattern. For example, the Octree depth control unit 242 edits the Octree pattern constructed by the Octree construction unit 241, and turns a desired node at a higher level than the lowest level into a leaf node. That is, the Octree depth control unit 242 deletes the descendant nodes belonging to the desired node at the higher level than the lowest level of the Octree pattern, and turns the desired node into a leaf node. For the desired node, the Octree depth control unit 242 further sets the above described "bit string of the terminal identification bit pattern" (for example, a bit string having a bit pattern "00000000"). The Octree encoding unit 221 (the Octree depth control unit 242) supplies the binarization unit 222 with Octree pattern data including the "bit string of the terminal identification bit pattern".

Note that the Octree encoding unit 221 (each of the Octree construction unit 241 and the Octree depth control unit 242) may have any configuration. For example, the Octree encoding unit 221 may include a CPU, a ROM, a RAM, and the like, and the CPU may load a program and data stored in the ROM or the like into the RAM, and execute the program, to perform a process relating to Octree encoding.

The binarization unit 222 binarizes the Octree pattern data, to generate binary data. The lossless encoding unit 223 performs lossless encoding on the binary data, to generate a bit stream.

By doing so, the encoding unit 114 can set the "bit string of the terminal identification bit pattern" in the node to be a leaf node, while forming an Octree pattern.

When a node is terminated at a higher level than the lowest level of an Octree pattern in this case, the Octree pattern data generated by the Octree encoding unit 221 also includes the bit string of the terminal identification bit pattern. That is, the lossless encoding unit 223 also generates a bit stream containing the bit string (depth control information) of the terminal identification bit pattern in this case.

Thus, the encoding unit 114 in this case can also partially control the resolution of the points in a point cloud to be subjected to Octree encoding (or can partially control the resolution of a data group that can be turned into a tree structure). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

<Flow in an Encoding Process>

In this case, the flow in an encoding process to be performed by the encoding device 100 is also similar to that in the case described above with reference to the flowchart shown in FIG. 7, and therefore, explanation thereof is not made herein.

<Flow in the Geometry Data Encoding Process>

Figure 10:
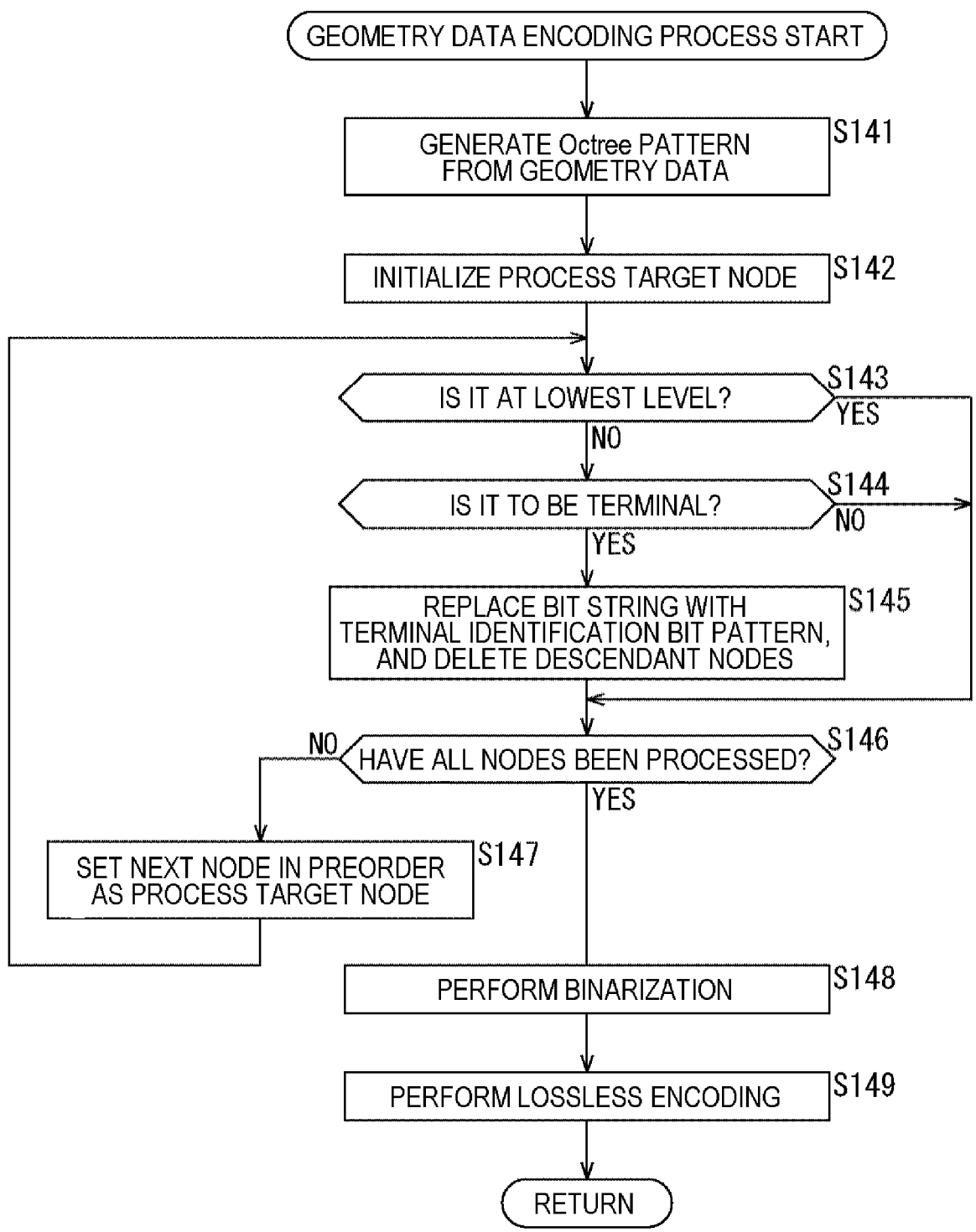
FIG. 10 is a flowchart for explaining an example flow in a geometry data encoding process.

Next, an example flow in the geometry data encoding process to be performed in step S104 in FIG. 7 in this case is described, with reference to the flowchart shown in FIG. 10.

When the geometry data encoding process is started in this case, the Octree construction unit 241 in step S141 constructs an Octree pattern from the geometry data, and generates the Octree pattern data.

In step S142, the Octree depth control unit 242 initializes the processing target node in the Octree pattern.

In step S143, the Octree depth control unit 242 determines whether or not the level of the processing target node is the lowest level. When the level of the processing target node is determined not to be the lowest level, the process moves on to step S144.

In step S144, the Octree depth control unit 242 determines whether or not the processing target node is to be turned into a terminal. When it is determined that the processing target node is to be turned into a terminal, or that the processing target node is to be turned into a leaf node, the process moves on to step S145.

In step S145, the Octree depth control unit 242 replaces the bit string set in the processing target node to be turned into a terminal, with a terminal identification bit pattern ("00000000", for example). The Octree depth control unit 242 also deletes the descendant nodes of the processing target node in the Octree pattern. That is, the processing target node is turned into a leaf node, and the descendant nodes belonging to the leaf node are deleted. After the process in step S145 is completed, the process moves on to step S146.

When it is determined in step S144 that the processing target node is not to be turned into a terminal, on the other hand, the process in step S145 is skipped, and the process moves on to step S146. That is, in this case, the processing target node is not edited.

When it is determined in step S143 that the level of the processing target node is the lowest level, which is the level with the same resolution as (the voxels of) the geometry data, on the other hand, the processes in steps S144 and 5145 are skipped, and the process moves on to step S146. That is, any bit string is not set in a node at the lowest level, and therefore, no editing is performed.

In step S146, the Octree depth control unit 242 determines whether or not all the nodes of the Octree pattern generated in step S141 have been processed. When it is determined that there is an unprocessed node, the process moves on to step S147.

In step S147, the Octree depth control unit 242 sets the processing target node as the next node in the preorder. After the processing target node is updated, the process returns to step S143. That is, the respective processes in steps S143 through S147 are performed for each node of the Octree pattern corresponding to the geometry data.

When it is determined in step S146 that all the nodes have been processed, the process then moves on to step S148.

In step S148, the binarization unit 222 binarizes the Octree pattern data corresponding to the geometry data generated by the above process.

In step S149, the lossless encoding unit 223 performs lossless encoding on the binary data obtained by the process in step S148, to generate a bit stream. Since the Octree pattern data includes the bit string of the terminal identification bit pattern as a result of the process in step S145, the lossless encoding unit 223 generates a bit stream containing the bit string of the terminal identification bit pattern.

When the process in step S149 is completed, the geometry data encoding process comes to an end, and the process returns to FIG. 7.

As the respective processes are performed as described above, the encoding device 100 in this case can also partially control the resolution of the points in a point cloud to be subjected to Octree encoding (or can partially control the resolution of a data group that can be turned into a tree structure). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

Note that the preorder has been described as an example of an Octree pattern scanning order. However, this scanning order may be any appropriate order, and is not necessarily the preorder. For example, the scanning order may be a leading order, a pre-order, a passing order, a middle order, an intermediate order, a passing-by order, a backward order, a subsequent order, a post-order, a return order, a level order, or the like.

<Decoding Device>

A decoding device that decodes a bit stream generated by the encoding device 100 decodes the bit stream, and constructs an Octree pattern including a leaf node at a different level from the lowest level, on the basis of depth control information indicating that a leaf node is to be formed at a different level from the lowest level based on information specifying the depth of the Octree pattern. Accordingly, this decoding device can correctly decode a bit stream generated by the encoding device 100.

Figure 11:
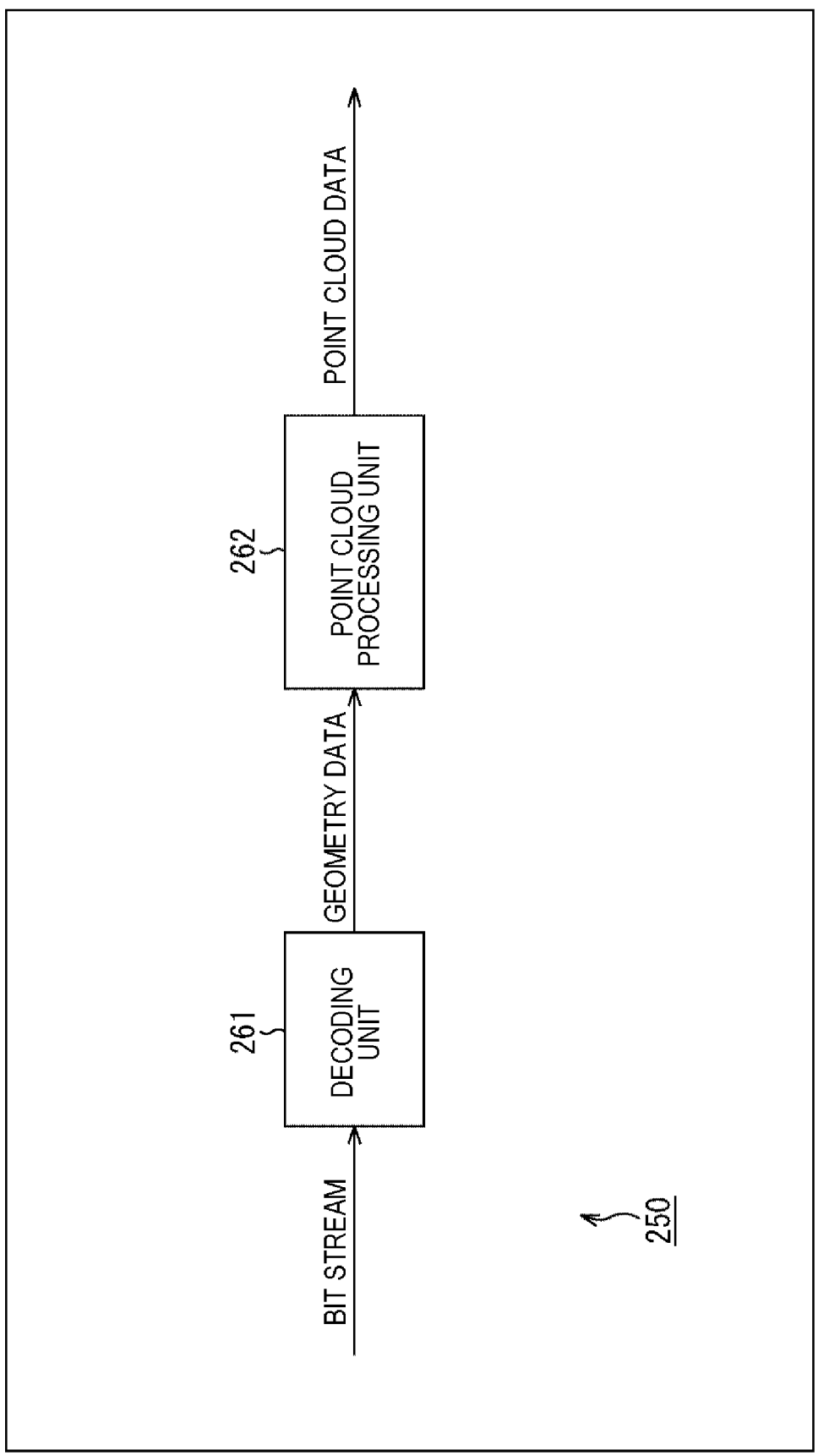
FIG. 11 is a block diagram showing a principal example configuration of a decoding device.

FIG. 11 is a block diagram showing a principal example configuration of a decoding device as an embodiment of an information processing device to which the present technology is applied. A decoding device 250 shown in FIG. 11 is a decoding device compatible with the encoding device 100 shown in FIG. 3. For example, the decoding device 250 decodes encoded data of a point cloud generated by the encoding device 100, and restores the data of the point cloud.

As shown in FIG. 11, the decoding device 250 includes a decoding unit 261 and a point cloud processing unit 262.

The decoding unit 261 performs a process relating to decoding of a bit stream. For example, the decoding unit 261 decodes the bit stream by a decoding method compatible with the encoding method used by the encoding unit 114 (FIG. 3), and reconstructs the Octree pattern. As described above, a bit stream generated by the encoding device 100 contains "depth control information indicating that a leaf node is to be formed at a different level from the lowest level based on information specifying the depth of an Octree pattern". On the basis of the "depth control information", the decoding unit 261 constructs an Octree pattern including a leaf node at a different level from the lowest level.

Accordingly, the decoding unit 261 can correctly decode a bit stream generated by the encoding unit 114. Thus, the decoding device 250 can partially control the resolution of the points in a point cloud to be subjected to Octree encoding (or can partially control the resolution of a data group that can be turned into a tree structure). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

As described above, this depth control information is any appropriate information, but may be a predetermined bit string indicating that "a particular node corresponding to the depth control information at a higher level than the lowest level of the Octree pattern is a leaf node", for example.

With this arrangement, the decoding unit 261 detects the "predetermined bit string", to easily recognize "the particular node being a leaf node".

Further, as described above, this "predetermined bit string" is set in a leaf node at a higher level than the lowest level of the Octree pattern, and has a bit pattern (a terminal identification bit pattern) indicating that the node in which the "predetermined bit string" is set is a leaf node.

That is, the position of the leaf node at the higher level than the lowest level of the Octree pattern is indicated by the position of the "bit string (depth control information)". Accordingly, when decoding the bit stream to reconstruct the Octree pattern, the decoding unit 261 can check the position of the "bit string (depth control information)", to detect the leaf node at the higher level than the lowest level of the Octree pattern. That is, it is possible to correctly decode an Octree pattern including a leaf node at a higher level than the lowest level.

Note that, as described above, the bit pattern (the terminal identification bit pattern) of the "predetermined bit string" may be a bit pattern not to be used for a bit string to be set in a node that is not a leaf node of the Octree pattern. For example, in the example case illustrated in B of FIG. 5, a bit string having a bit pattern "00000000" (a terminal identification bit pattern) is assigned to the right node (a leaf node) at the level that is one level higher than the lowest level.

The decoding unit 261 then reconstructs geometry data (voxel data) from the Octree pattern (Octree pattern data). The decoding unit 261 supplies the reconstructed geometry data (voxel data) to the point cloud processing unit 262.

Note that the decoding unit 261 may have any configuration. For example, the decoding unit 261 may include a CPU, a ROM, a RAM, and the like, and the CPU may load a program and data stored in the ROM or the like into the RAM, and execute the program, to perform a process relating to decoding.

The point cloud processing unit 262 performs a process relating to restoration of point cloud data. For example, the point cloud processing unit 262 converts the geometry data (voxel data) supplied from the decoding unit 261 into point cloud data (or generates decoded point cloud data). Note that the point cloud processing unit 262 may further convert the decoded point cloud data into mesh data.

The point cloud processing unit 262 outputs the generated decoded point cloud data (or mesh data) to the outside of the decoding device 250. The output decoded point cloud data (or mesh data) may be subjected to image processing by a processing unit (not shown) in a subsequent stage, for example, so that the decoded point cloud data can be displayed as image information on a monitor or the like. Alternatively, the decoded point cloud data may be transmitted by a communication unit (not shown) to another device via a predetermined transmission path, or may be recorded into a recording medium (not shown).

Note that the point cloud processing unit 262 may have any configuration. For example, the point cloud processing unit 262 may include a CPU, a ROM, a RAM, and the like, and the CPU may load a program and data stored in the ROM or the like into the RAM, and execute the program, to perform a process relating to restoration of point cloud data.

<Decoding Unit>

Figure 12:
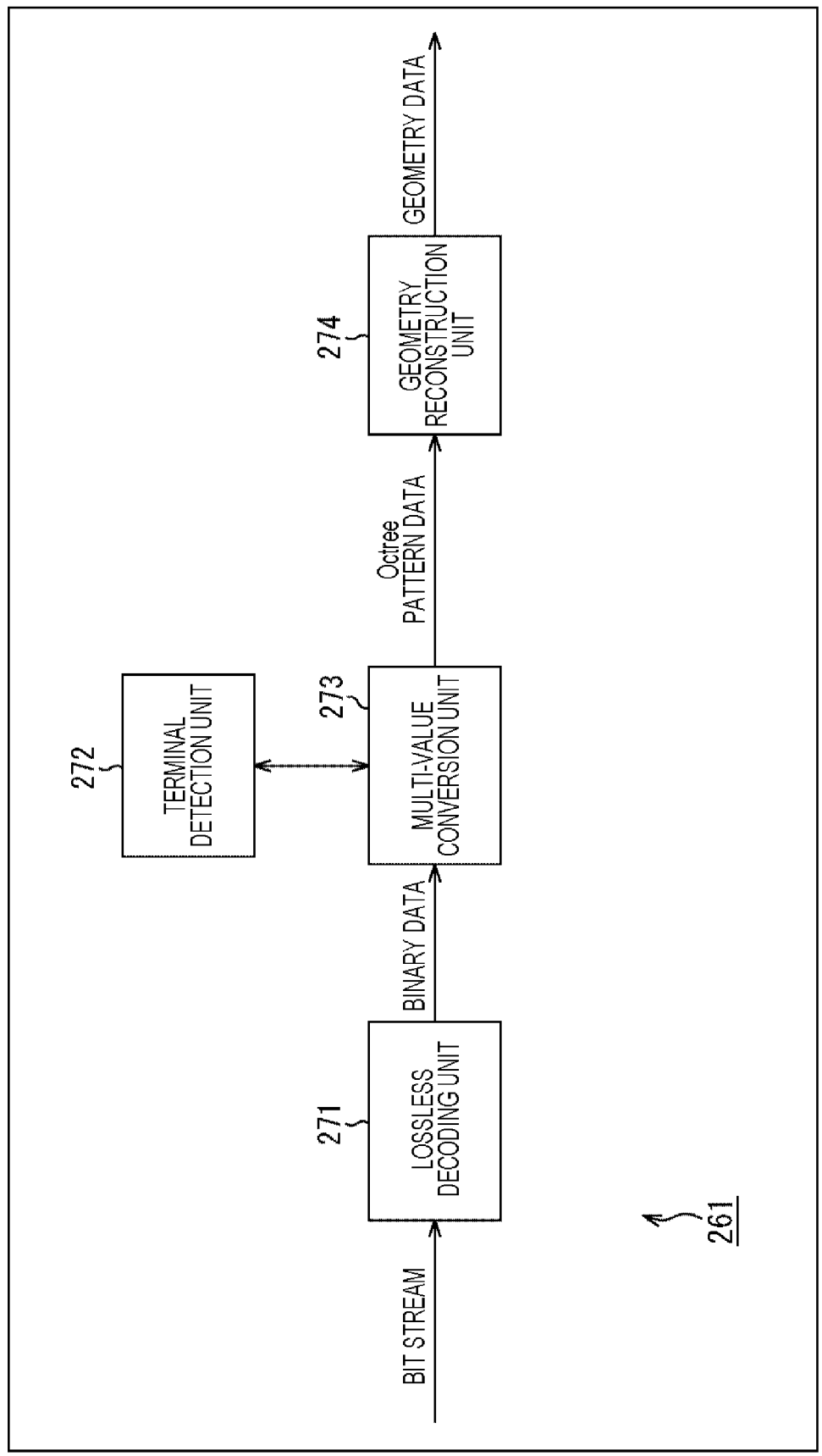
FIG. 12 is a block diagram showing a principal example configuration of a decoding unit.

FIG. 12 is a block diagram showing a principal example configuration of the decoding unit 261. As shown in FIG. 12, the decoding unit 261 includes a lossless decoding unit 271, a terminal detection unit 272, a multi-value conversion unit 273, and a geometry reconstruction unit 274.

The lossless decoding unit 271 performs a process relating to lossless decoding. For example, the lossless decoding unit 271 performs lossless decoding on the bit stream generated by the encoding device 100 by a method compatible with the lossless encoding unit 223, to obtain binary data. This lossless decoding method may be any method that is compatible with the lossless encoding method being used by the lossless encoding unit 223. For example, the lossless decoding method may be CABAC.

As described above, this bit stream contains the bit strings of the respective nodes of the Octree pattern, and "depth control information (the bit string of a terminal identification bit pattern)" or the like set in a leaf node at a higher level than the lowest level, for example. Therefore, the lossless decoding unit 271 extracts these pieces of information by decoding the bit stream, and supplies the extracted information as binary data to the multi-value conversion unit 273. Further, a header or a parameter set included in this bit stream contains "information specifying the depth of the Octree pattern". The lossless decoding unit 271 also extracts this information by decoding the bit stream, and supplies the information as binary data to the multi-value conversion unit 273.

Note that the lossless decoding unit 271 may have any configuration. For example, the lossless decoding unit 271 may include a CPU, a ROM, a RAM, and the like, and the CPU may load a program and data stored in the ROM or the like into the RAM, and execute the program, to perform a process relating to lossless decoding.

The terminal detection unit 272 performs a process relating to detection of a terminal node. The multi-value conversion unit 273 performs a process relating to multi-value conversion. For example, the multi-value conversion unit 273 performs multi-value conversion on the binary data supplied from the lossless decoding unit 271, to reconstruct an Octree pattern and generate Octree pattern data. At this stage, the terminal detection unit 272 detects the bit string of the terminal identification bit pattern included in the Octree pattern obtained through the multi-value conversion of the binary data at the multi-value conversion unit 273, for example. The terminal detection unit 272 also controls the multi-value conversion unit 273 in accordance with the detection result, to control the reconstruction of the Octree pattern.

For example, when detecting the bit string of the terminal identification bit pattern, the terminal detection unit 272 controls the multi-value conversion unit 273, to turn the node into a terminal (a leaf node) in the reconstruction of the Octree pattern, and prohibit construction of any descendant node belonging to the node. By doing so, the multi-value conversion unit 273 can reconstruct the Octree pattern, so that a leaf node is formed at a higher level than the lowest level of the Octree pattern specified by the "information specifying the depth of the Octree pattern".

The multi-value conversion unit 273 supplies the Octree pattern data obtained in this manner to the geometry reconstruction unit 274.

Note that the terminal detection unit 272 may have any configuration. For example, the terminal detection unit 272 may include a CPU, a ROM, a RAM, and the like, and the CPU may load a program and data stored in the ROM or the like into the RAM, and execute the program, to perform a process relating to detection of a terminal.

Further, the multi-value conversion unit 273 may have any configuration. For example, the multi-value conversion unit 273 may include a CPU, a ROM, a RAM, and the like, and the CPU may load a program and data stored in the ROM or the like into the RAM, and execute the program, to perform a process relating to multi-value conversion.

The geometry reconstruction unit 274 performs a process relating to reconstruction of geometry data. For example, the geometry reconstruction unit 274 reconstructs geometry data, using the Octree pattern data supplied from the multi-value conversion unit 273. The geometry reconstruction unit 274 supplies the obtained geometry data to the point cloud processing unit 262 (FIG. 11).

Note that the geometry reconstruction unit 274 may have any configuration. For example, the geometry reconstruction unit 274 may include a CPU, a ROM, a RAM, and the like, and the CPU may load a program and data stored in the ROM or the like into the RAM, and execute the program, to perform a process relating to reconstruction of geometry data.

As described above, the lossless decoding unit 271 through multi-value conversion unit 273 decode a bit stream, and constructs an Octree pattern including a leaf node at a different level from the lowest level, on the basis of depth control information indicating that a leaf node is to be formed at a different level from the lowest level based on information specifying the depth of the Octree pattern.

Thus, the resolution of points can be partially controlled in a point cloud to be subjected to Octree encoding (or the resolution of a data group that can be turned into a tree structure can be partially controlled). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

Note that the method of decoding a bit stream may be any method that is compatible with the encoding method, and is not limited to the above described example. For example, a bit stream may be decoded with CAVLC. That is, in this case, the bit stream has been encoded with CAVLC. In that case, instead of the lossless decoding unit 271 and the multi-value conversion unit 273, a lossless decoding unit that conducts CAVLC may be provided.

<Flow in a Decoding Process>

An example flow in a decoding process to be performed by the decoding device 250 having the above configuration is now described with reference to the flowchart shown in FIG. 13.

When a decoding process is started, in step S161, the decoding unit 261 decodes a supplied bit stream, to reconstruct an Octree pattern in which a leaf node is formed at a different level from the lowest level based on information specifying the depth of the octree pattern, and reconfigure the geometry data corresponding to the Octree pattern data.

In step S162, the point cloud processing unit 262 restores the point cloud data from the geometry data obtained in step S161.

In step S163, the point cloud processing unit 262 outputs the point cloud data (the decoded point cloud data) restored in step S162 to the outside of the decoding device 250.

When the process in step S163 is completed, the decoding process comes to an end.

<Flow in the Bit Stream Decoding Process>

Figure 13:
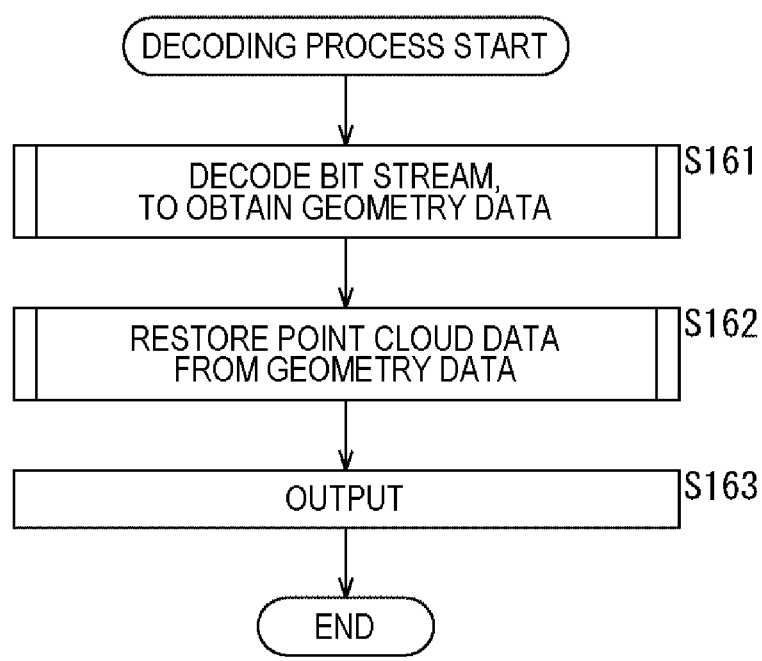
FIG. 13 is a flowchart for explaining an example flow in a decoding process.
Figure 14:
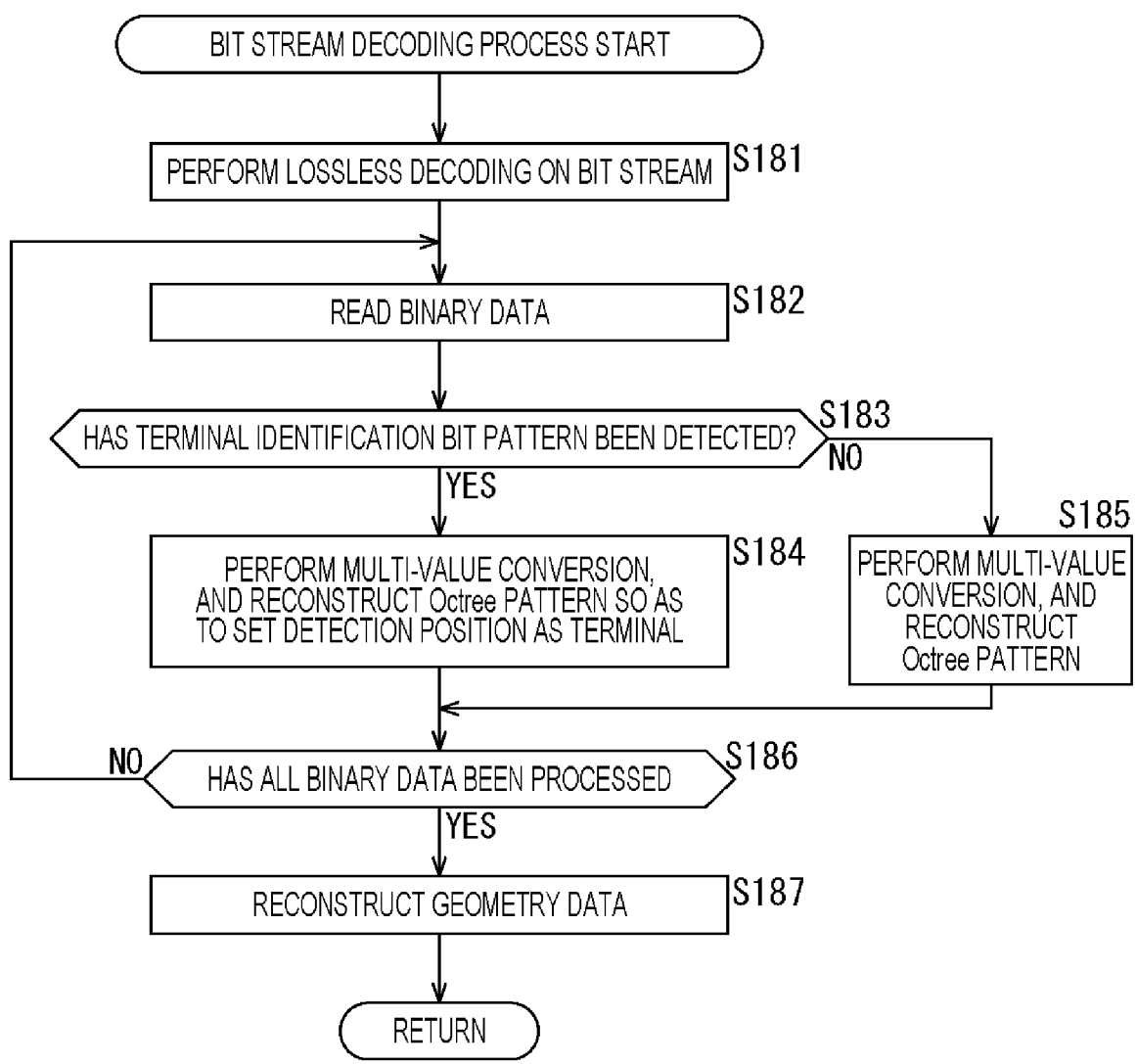
FIG. 14 is a flowchart for explaining an example flow in a bit stream decoding process.

Referring now to the flowchart shown in FIG. 14, an example flow in the bit stream decoding process to be performed in step S161 in FIG. 13 is described.

When the bit stream decoding process is started, the lossless decoding unit 271 in step S181 performs lossless decoding on the bit stream, to generate binary data.

In step S182, the multi-value conversion unit 273 reads the binary data obtained in step S181.

In step S183, the terminal detection unit 272 causes the multi-value conversion unit 273 to decode the read binary data, and determines whether or not the bit string of the terminal identification bit pattern is included in the obtained Octree pattern data. When the terminal identification bit pattern is detected from the Octree pattern data, and it is determined that the bit string of the terminal identification bit pattern is included in the Octree pattern data, the process moves on to step S184.

In step S184, under the control of the terminal detection unit 272, the multi-value conversion unit 273 performs multi-value conversion on the binary data, and reconstructs the Octree pattern so that the detection position (a node) at which the terminal identification bit pattern has been detected is turned into a terminal (a leaf node). That is, the depth control information (the bit string of the terminal identification bit pattern) is reflected in the Octree pattern to be reconstructed.

After the process in step S184 is completed, the process moves on to step S186. When it is determined in step S183 that the terminal identification bit pattern has not been detected (the bit string of the terminal identification bit pattern is not included in the Octree pattern data), on the other hand, the process moves on to step S185.

In step S185, the multi-value conversion unit 273 performs multi-value conversion on the binary data, and reconstructs the Octree pattern in a similar manner to that in the case of a general Octree pattern. After the process in step S185 is completed, the process moves on to step S186.

In step S186, the multi-value conversion unit 273 determines whether or not all the binary data has been processed. When there exists unprocessed binary data, the process returns to step S182, with the unprocessed binary data being the new processing target. That is, the processes in steps S182 through S186 are performed for all the binary data. When it is determined in step S186 that all the binary data has been processed, the process then moves on to step S187.

In step S187, the geometry reconstruction unit 274 reconstructs geometry data, using the Octree pattern data obtained through the above process.

When the process in step S187 is completed, the bit stream decoding process comes to an end, and the process returns to FIG. 13.

As the respective processes are performed as described above, the decoding device 250 can partially control the resolution of the points in a point cloud to be subjected to Octree encoding (or can partially control the resolution of a data group that can be turned into a tree structure). In other words, even when the resolution of the points in a point cloud is partially controlled, Octree encoding can be applied

3. Second Embodiment

<end_of_node_one_bit>

Note that "depth control information" is any appropriate information, but may be "predetermined flag information indicating that, in a bit stream, a particular node corresponding to the depth control information at a higher level than the lowest level of the Octree pattern is a leaf node", for example.

With this arrangement, "the particular node being a leaf node" can be easily recognized on the decoding side, on the basis of the "predetermined flag information" included in the bit stream.

Figure 15:
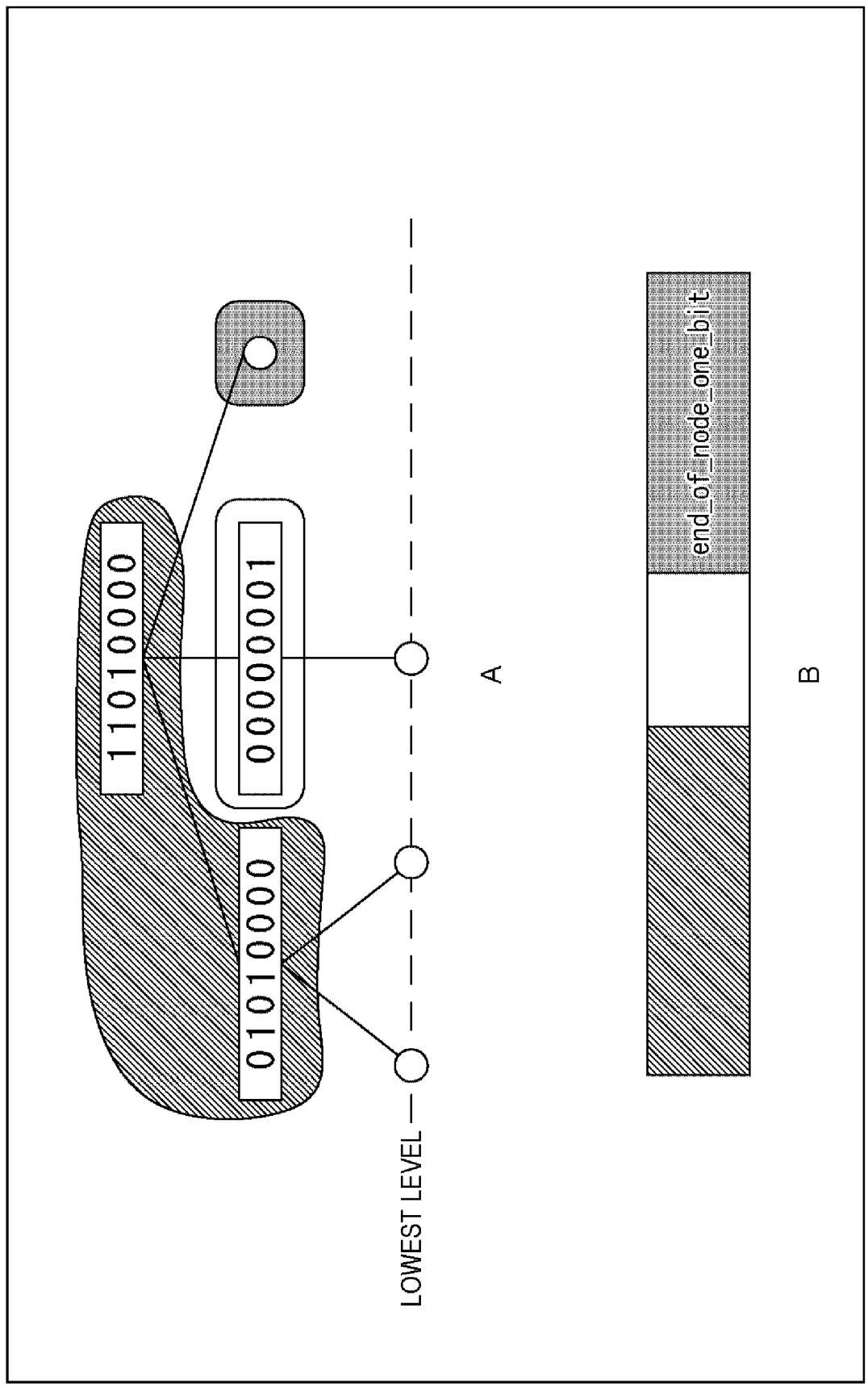
FIG. 15 is a diagram for explaining an example of depth control information.

For example, as shown in A of FIG. 15, in an Octree pattern, information about the respective nodes is arranged in a predetermined scanning order (the preorder, for example), and is sequentially encoded. Accordingly, in the bit stream, the bit streams of the respective nodes are arranged in the scanning order, as shown in B of FIG. 15, for example. In the bit stream shown in B of FIG. 15, the nodes included in the hatched region in the Octree pattern shown in A of FIG. 15, the node included in the white region in the Octree pattern, and the node included in the gray region in the Octree pattern are arranged in this order, for example.

Here, the node included in the gray region in the Octree pattern shown in A of FIG. 15 is at a higher level than the lowest level, but is a terminal (a leaf node). In this case, as in the case of a node at the lowest level, a bit string is not set in the node, but "depth control information (the predetermined flag information) indicating a terminal may be set at the position corresponding to the node in the bit stream.

That is, the encoding unit 114 may insert the "predetermined flag information" indicating whether or not the node corresponding to the position is a leaf node, at the position corresponding to a leaf node at a higher level than the lowest level of the Octree pattern in the bit stream.

The position of the "predetermined flag information" indicates the position of a leaf node at a higher level than the lowest level of the Octree pattern. Accordingly, on the decoding side, the position of the "flag information (depth control information)" included in the bit stream is checked, so that the leaf node at the higher level than the lowest level of the Octree pattern can be detected. That is, it is possible to correctly decode an Octree pattern including a leaf node at a higher level than the lowest level.

In other words, with such "flag information (depth control information)", it is possible to express partial control on the resolution of the points in an Octree pattern. That is, the resolution of points can be partially controlled in a point cloud to be subjected to Octree encoding (or the resolution of a data group that can be turned into a tree structure can be partially controlled).

In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

For example, in the case of the bit stream in the example shown in B of FIG. 15, the syntax (flag information) "end_of_node_one_bit" is set, and the "end_of_node_one_bit" is inserted at the position corresponding to the node that is included in the gray region and is a leaf node in the bit stream. Accordingly, on the decoding side, this "end_of_node_one_bit" is detected, and thus, the node at the corresponding position being a leaf node can be easily detected.

Note that the name (syntax) of this "flag information" may be any appropriate name, and may be other than "end_of_node_one_bit". Further, the value of this "flag information (end_of_node_one_bit)" may also be any appropriate value. For example, the value may be "1", or may be "0". Furthermore, this "flag information" may be formed with a plurality of bits. Further, this "flag information" may include information that is not information indicating a leaf node. Furthermore, this "flag information" may be set in all the nodes, and the value thereof may indicate whether or not the node is a leaf node.

Further, this "flag information" may be inserted at a position other than the position of the corresponding node in a bit stream, if the correspondence relationship with a leaf node has been made clear. For example, this "flag information" may be collectively stored in a header, a parameter set, or the like. Alternatively, this "flag information" may be included in a bit stream different from the bit stream of the Octree pattern data.

In these cases, information indicating which "flag information" corresponds to which leaf node is also necessary.

<Encoding Unit>

Figure 16:
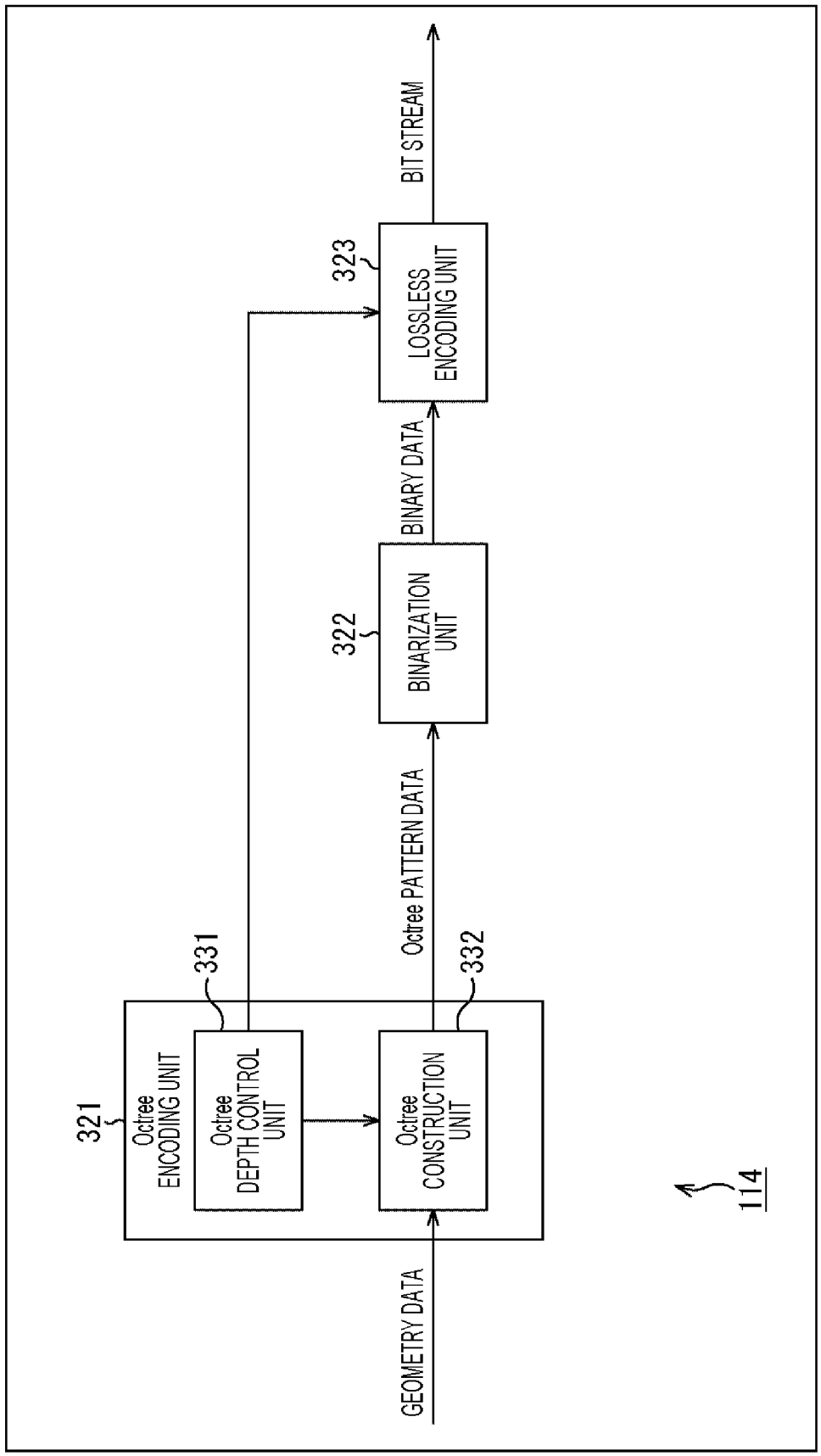
FIG. 16 is a block diagram showing a principal example configuration of an encoding unit.

FIG. 16 is a block diagram showing a principal example configuration of the encoding unit 114 (FIG. 3) in this case. As shown in FIG. 16, the encoding unit 114 in this case includes an Octree encoding unit 321, a binarization unit 322, and a lossless encoding unit 323.

The Octree encoding unit 321 performs a process relating to Octree encoding. For example, the Octree encoding unit 321 performs Octree encoding on the geometry data (positional information) of voxel data supplied from the voxel setting unit 113, to generate Octree pattern data. When a desired node at a different level from the lowest level is to be turned into a leaf node in that stage, the Octree encoding unit 321 specifies the position of the desired node.

As shown in FIG. 16, the Octree encoding unit 321 includes an Octree depth control unit 331 and an Octree construction unit 332.

The Octree depth control unit 331 performs control relating to the depth of an Octree pattern. The Octree construction unit 332 performs a process relating to construction of an Octree pattern. For example, the Octree construction unit 332 constructs an Octree pattern on the basis of geometry data, and generates Octree pattern data corresponding to the geometry data. The Octree depth control unit 331 controls the construction of the Octree pattern, to control the depth of the Octree pattern.

For example, when the Octree construction unit 332 generates an Octree pattern by performing Octree encoding on geometry data, the Octree depth control unit 331 controls the Octree construction unit 332, so that a desired node at a higher level than the lowest level of the Octree pattern can be turned into a leaf node. That is, a node can be terminated (not to form any descendant node) at a higher level than the lowest level of the Octree pattern. Further, the Octree depth control unit 331 specifies the desired node as the node to be turned into a leaf node.

The Octree encoding unit 321 (the Octree construction unit 332) supplies the generated Octree pattern data to the binarization unit 322. The Octree encoding unit 321 (the Octree depth control unit 331) also supplies information regarding the specified node to the lossless encoding unit 323.

By doing so, the encoding unit 114 can specify the node to be turned into a leaf node, while forming an Octree pattern.

Note that the Octree encoding unit 321 (each of the Octree depth control unit 331 and the Octree construction unit 332) may have any configuration. For example, the Octree encoding unit 321 may include a CPU, a ROM, a RAM, and the like, and the CPU may load a program and data stored in the ROM or the like into the RAM, and execute the program, to perform a process relating to Octree encoding.

The binarization unit 322 performs a process relating to binarization. For example, the binarization unit 322 binarizes the Octree pattern data supplied from the Octree encoding unit 321, to generate binary data.

The binarization unit 322 supplies the generated binary data to the lossless encoding unit 323.

Note that the binarization unit 322 may have any configuration. For example, the binarization unit 322 may include a CPU, a ROM, a RAM, and the like, and the CPU may load a program and data stored in the ROM or the like into the RAM, and execute the program, to perform a process relating to binarization.

The lossless encoding unit 323 performs a process relating to lossless encoding. For example, the lossless encoding unit 323 performs lossless encoding on the binary data supplied from the binarization unit 322, to generate a bit stream (which is the encoded data of the Octree pattern data). This method of performing lossless encoding may be any appropriate method, and may be CABAC, for example.

On the basis of the information supplied from the Octree depth control unit 331, the lossless encoding unit 323 also inserts the above described "predetermined flag information (end_of_node_one_bit)" at the position corresponding to the node specified as the node to be turned into a leaf node by the Octree depth control unit 331 in the bit stream.

The lossless encoding unit 323 also stores information specifying the depth (the number of levels) of the Octree pattern of the Octree pattern data into a header, a parameter set, or the like, which is included in the bit stream, for example.

The lossless encoding unit 323 outputs the generated bit stream to the outside of the encoding unit 114 (in other words, the outside of the encoding device 100).

Note that the lossless encoding unit 323 may have any configuration. For example, the lossless encoding unit 323 may include a CPU, a ROM, a RAM, and the like, and the CPU may load a program and data stored in the ROM or the like into the RAM, and execute the program, to perform a process relating to lossless encoding.

As described above, when a node is terminated at a higher level than the lowest level of an Octree pattern, the lossless encoding unit 323 inserts the predetermined flag information (depth control information) at the position corresponding to the node specified by the Octree encoding unit 221 in the bit stream.

Thus, the resolution of points can be partially controlled in a point cloud to be subjected to Octree encoding (or the resolution of a data group that can be turned into a tree structure can be partially controlled). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

Note that any appropriate method may be used for encoding Octree pattern data. For example, Octree pattern data may be encoded with context-based adaptive variable length code (CAVLC). In that case, instead of the binarization unit 222 and the lossless encoding unit 223, a lossless encoding unit that conducts CAVLC may be provided.

<Flow in an Encoding Process>

In this case, the flow in an encoding process to be performed by the encoding device 100 is also similar to that in the case described above with reference to the flowchart shown in FIG. 7, and therefore, explanation thereof is not made herein.

<Flow in the Geometry Data Encoding Process>

Figure 17:
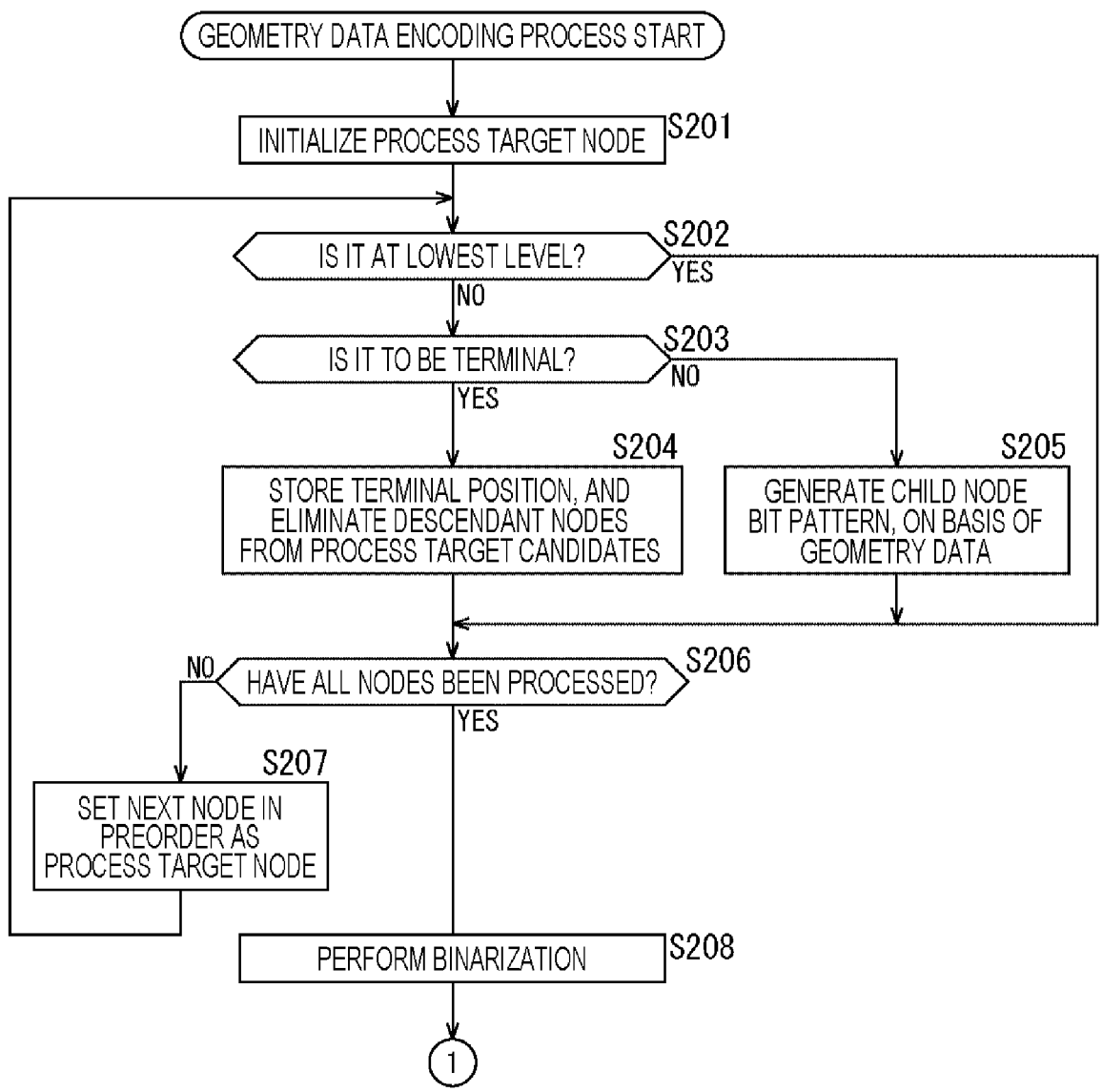
FIG. 17 is a flowchart for explaining an example flow in a geometry data encoding process.
Figure 18:
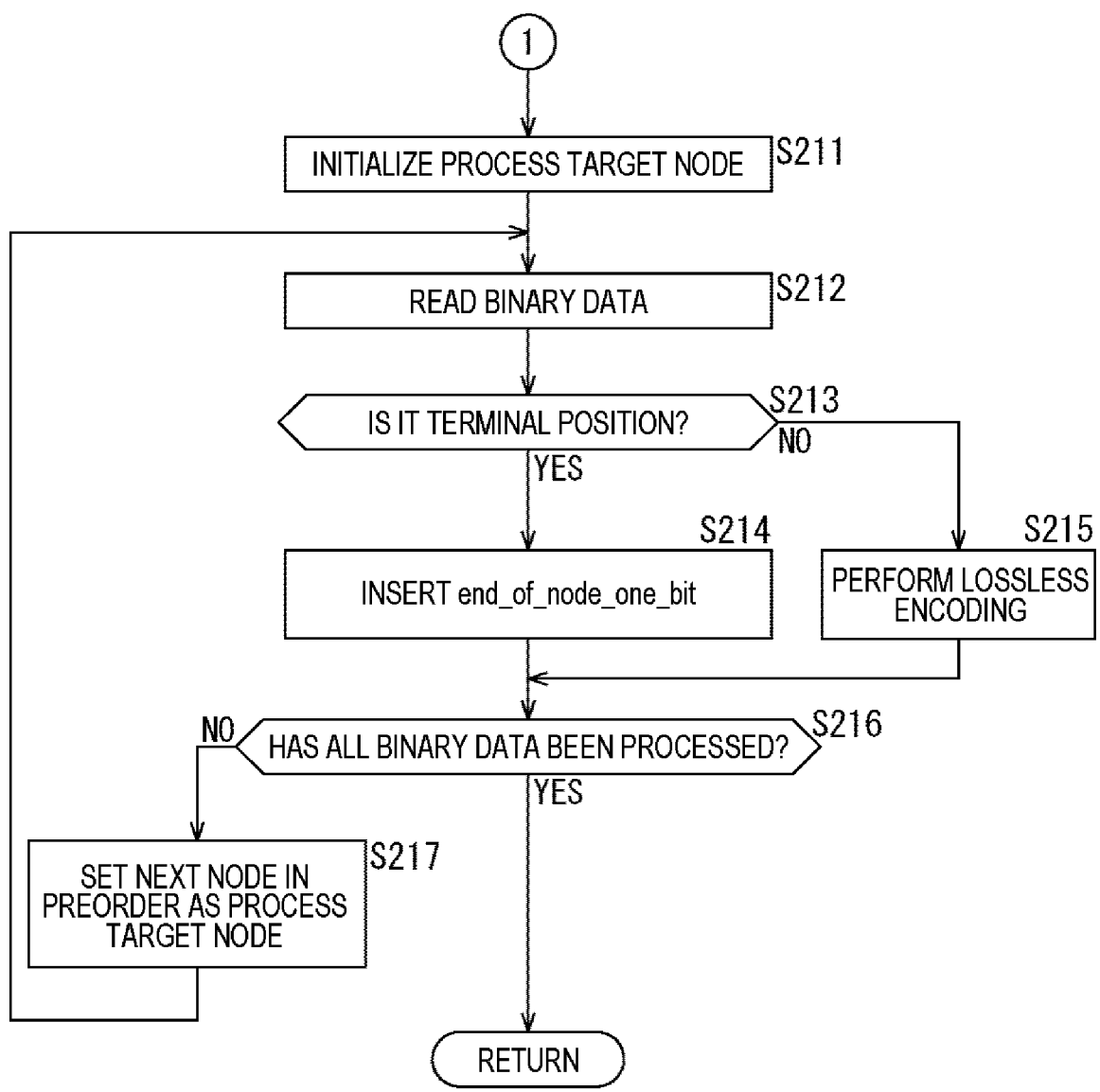
FIG. 18 is a flowchart for explaining an example flow in the geometry data encoding process continued from FIG. 17.

Next, an example flow in the geometry data encoding process to be performed in step S104 in FIG. 7 in this case is described, with reference to the flowchart shown in FIGS. 17 and 18.

When the geometry data encoding process is started, the Octree depth control unit 331 initializes the processing target node in the Octree pattern in step S201 in FIG. 17.

In step S202, the Octree depth control unit 331 determines whether or not the level of the processing target node is the lowest level. When the level of the processing target node is determined not to be the lowest level, the process moves on to step S203.

In step S203, the Octree depth control unit 331 determines whether or not the processing target node is to be turned into a terminal. When it is determined that the processing target node is to be turned into a terminal, or that the processing target node is to be turned into a leaf node, the process moves on to step S204.

In step S204, the Octree depth control unit 331 stores (specifies) the processing target node as the node to be turned into a terminal (or as a terminal position). Further, the Octree construction unit 332 excludes the descendant nodes of the processing target node from the processing target candidates. That is, the processing target node is turned into a leaf node, and any child node belonging to the leaf node is not formed. After the process in step S204 is completed, the process moves on to step S206. That is, any bit string is not set in the leaf node at a higher level than the lowest level.

When it is determined in step S203 that the processing target node is not to be turned into a terminal, on the other hand, the process moves on to step S205.

In step S205, for the processing target node not to be turned into a terminal, the Octree construction unit 332 generates a "bit pattern of a child node", which is a bit string having a bit pattern indicating in which one of the regions formed by dividing the region corresponding to the processing target node by eight (2×2×2) a point exists, on the basis of the geometry data. The Octree construction unit 332 then sets the bit string in the processing target node. After the process in step S205 is completed, the process moves on to step S206.

When it is determined in step S202 that the level of the processing target node is the lowest level, which is the level with the same resolution as (the voxels of) the geometry data, on the other hand, the processes in steps S203 through S205 are skipped, and the process moves on to step S206. That is, any bit string is not set in a node at the lowest level.

In step S206, the Octree depth control unit 331 determines whether or not all the nodes have been processed. When it is determined that the Octree pattern corresponding to the geometry data has not been constructed, and there is an unprocessed node, the process moves on to step S207.

In step S207, the Octree depth control unit 331 sets the processing target node as the next node in the preorder. After the processing target node is updated, the process returns to step S202. That is, the respective processes in steps S202 through S207 are performed for each node of the Octree pattern corresponding to the geometry data.

When it is determined in step S206 that the Octree pattern corresponding to the geometry data has been constructed, and all the nodes have been processed, the process then moves on to step S208.

In step S208, the binarization unit 322 binarizes the Octree pattern data corresponding to the geometry data generated by the above process. After the process in step S208 is completed, the process moves on to FIG. 18.

In step S211 of FIG. 18, the lossless encoding unit 323 initializes the processing target node.

In step S212, the lossless encoding unit 323 reads the binary data of the processing target node generated in step S208 in FIG. 17.

In step S213 in FIG. 18, the lossless encoding unit 323 determines whether or not the processing target node is the terminal position stored (specified) in step S204 in FIG. 17. When the processing target node is determined to be the terminal position, the process moves on to step S214.

In step S214, the lossless encoding unit 323 inserts the predetermined flag information (end_of_node_one_bit) at the position (which is the terminal position) corresponding to the processing target node in the bit stream. After the process in step S214 is completed, the process moves on to step S216.

When the processing target node is determined not to be the terminal position in step S213, on the other hand, the process moves on to step S215.

In step S215, the lossless encoding unit 323 performs lossless encoding on the binary data of the processing target node. After the process in step S215 is completed, the process moves on to step S216.

In step S216, the lossless encoding unit 323 determines whether or not all the binary data has been processed. When it is determined that there exists unprocessed binary data, the process moves on to step S217.

In step S217, the lossless encoding unit 323 sets the processing target node as the next node in the preorder. After the processing target node is updated, the process returns to step S212. That is, the respective processes in steps S212 through S217 are performed on the binary data of each node of the Octree pattern.

When it is determined in step S216 that all the binary data has been processed, on the other hand, the geometry data encoding process comes to an end, and the process returns to FIG. 7.

As the respective processes are performed as described above, the encoding device 100 in this case can also partially control the resolution of the points in a point cloud to be subjected to Octree encoding (or can partially control the resolution of a data group that can be turned into a tree structure). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

Note that the preorder has been described as an example of an Octree pattern scanning order. However, this scanning order may be any appropriate order, and is not necessarily the preorder. For example, the scanning order may be a leading order, a pre-order, a passing order, a middle order, an intermediate order, a passing-by order, a backward order, a subsequent order, a post-order, a return order, a level order, or the like.

<Another Example of the Encoding Unit>

Note that an Octree pattern may be edited after generation, a desired node at a higher level than the lowest level may be turned into a leaf node, and the desired node may be specified as the node to be turned into a leaf node.

Figure 19:
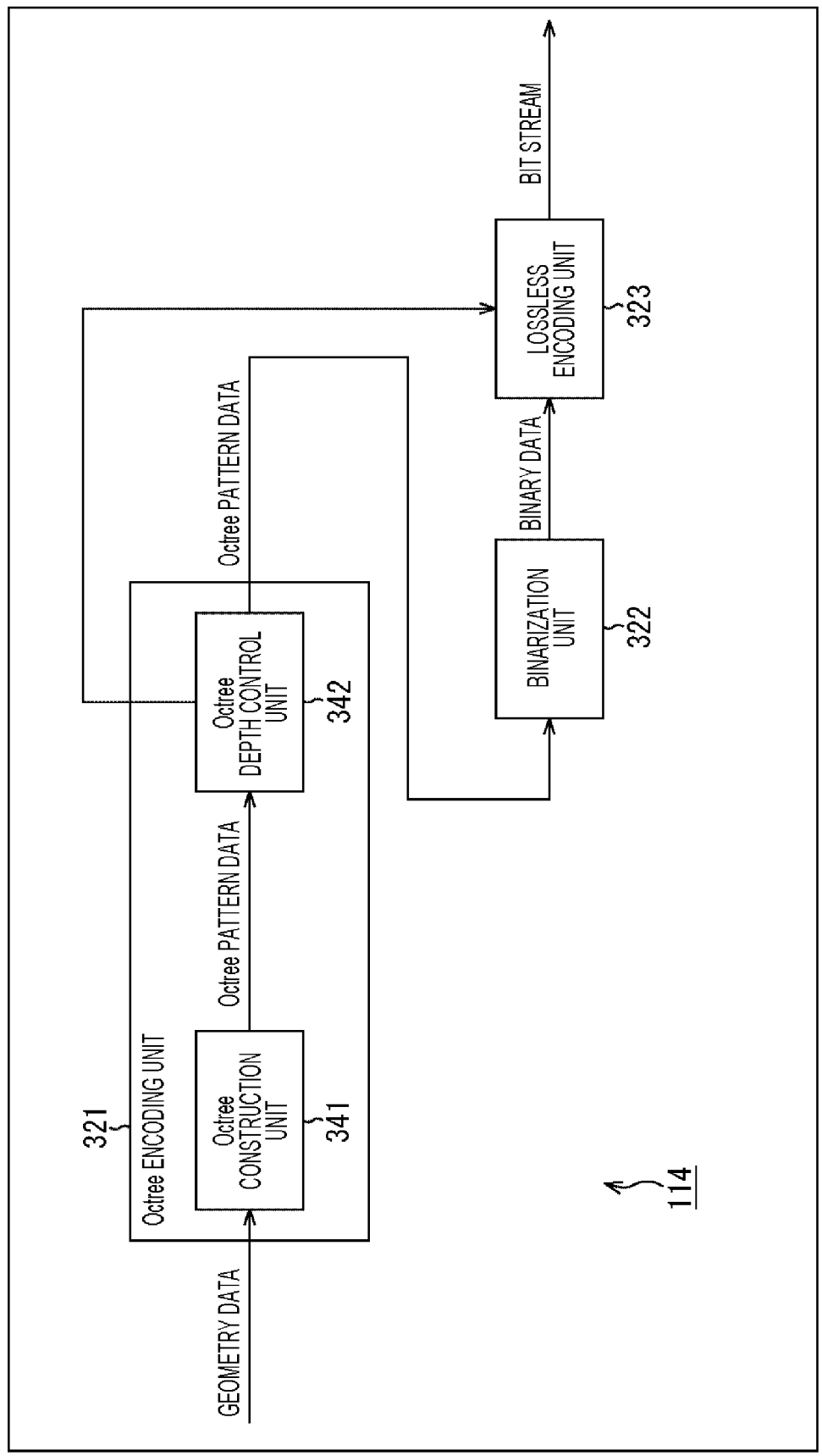
FIG. 19 is a block diagram showing a principal example configuration of an encoding unit.

FIG. 19 is a block diagram showing a principal example configuration of the encoding unit 114 (FIG. 3) in that case. As shown in FIG. 19, the encoding unit 114 in this case includes the Octree encoding unit 321, the binarization unit 322, and the lossless encoding unit 323, as in the case illustrated in FIG. 16.

However, the Octree encoding unit 321 includes an Octree construction unit 341 and an Octree depth control unit 342. The Octree construction unit 341 performs a process relating to construction of an Octree pattern. For example, the Octree construction unit 341 performs general Octree encoding, to construct an Octree pattern on the basis of geometry data and generate Octree pattern data corresponding to the geometry data.

The Octree depth control unit 342 performs control relating to the depth of an Octree pattern. For example, the Octree depth control unit 342 edits the Octree pattern constructed by the Octree construction unit 341, and turns a desired node at a higher level than the lowest level into a leaf node. That is, the Octree depth control unit 342 deletes the descendant nodes belonging to the desired node at the higher level than the lowest level of the Octree pattern, and turns the desired node into a leaf node. Further, the Octree depth control unit 342 specifies (stores) the desired node as the node to be turned into a leaf node. The Octree encoding unit 321 (the Octree depth control unit 342) supplies the generated Octree pattern data to the binarization unit 322. The Octree encoding unit 321 (the Octree depth control unit 342) also supplies information indicating the specified node to the lossless encoding unit 323.

Note that the Octree encoding unit 321 (each of the Octree construction unit 341 and the Octree depth control unit 342) may have any configuration. For example, the Octree encoding unit 321 may include a CPU, a ROM, a RAM, and the like, and the CPU may load a program and data stored in the ROM or the like into the RAM, and execute the program, to perform a process relating to Octree encoding.

The binarization unit 322 performs a process relating to binarization, as in the case illustrated in FIG. 16. For example, the binarization unit 322 binarizes the Octree pattern data supplied from the Octree encoding unit 321 (the Octree depth control unit 342), to generate binary data. The binarization unit 322 supplies the generated binary data to the lossless encoding unit 323.

The lossless encoding unit 323 performs a process relating to lossless encoding, as in the case illustrated in FIG. 16. For example, the lossless encoding unit 323 performs lossless encoding on the binary data supplied from the binarization unit 322, to generate a bit stream (which is the encoded data of the Octree pattern data).

On the basis of the information supplied from the Octree encoding unit 321 (the Octree depth control unit 342), the lossless encoding unit 323 also inserts the above described "predetermined flag information (end_of_node_one_bit)" at the position corresponding to the node specified as the node to be turned into a leaf node by the Octree depth control unit 342 in the bit stream.

The lossless encoding unit 323 also stores information specifying the depth (the number of levels) of the Octree pattern of the Octree pattern data into a header, a parameter set, or the like, which is included in the bit stream, for example. The lossless encoding unit 323 outputs the generated bit stream to the outside of the encoding unit 114 (in other words, the outside of the encoding device 100).

That is, in this case, the lossless encoding unit 223 also generates a bit stream including the "predetermined flag information (end_of_node_one_bit)" (depth control information).

Thus, the encoding unit 114 in this case can also partially control the resolution of the points in a point cloud to be subjected to Octree encoding (or can partially control the resolution of a data group that can be turned into a tree structure). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

<Flow in an Encoding Process>

In this case, the flow in an encoding process to be performed by the encoding device 100 is also similar to that in the case described above with reference to the flowchart shown in FIG. 7, and therefore, explanation thereof is not made herein.

Figure 20:
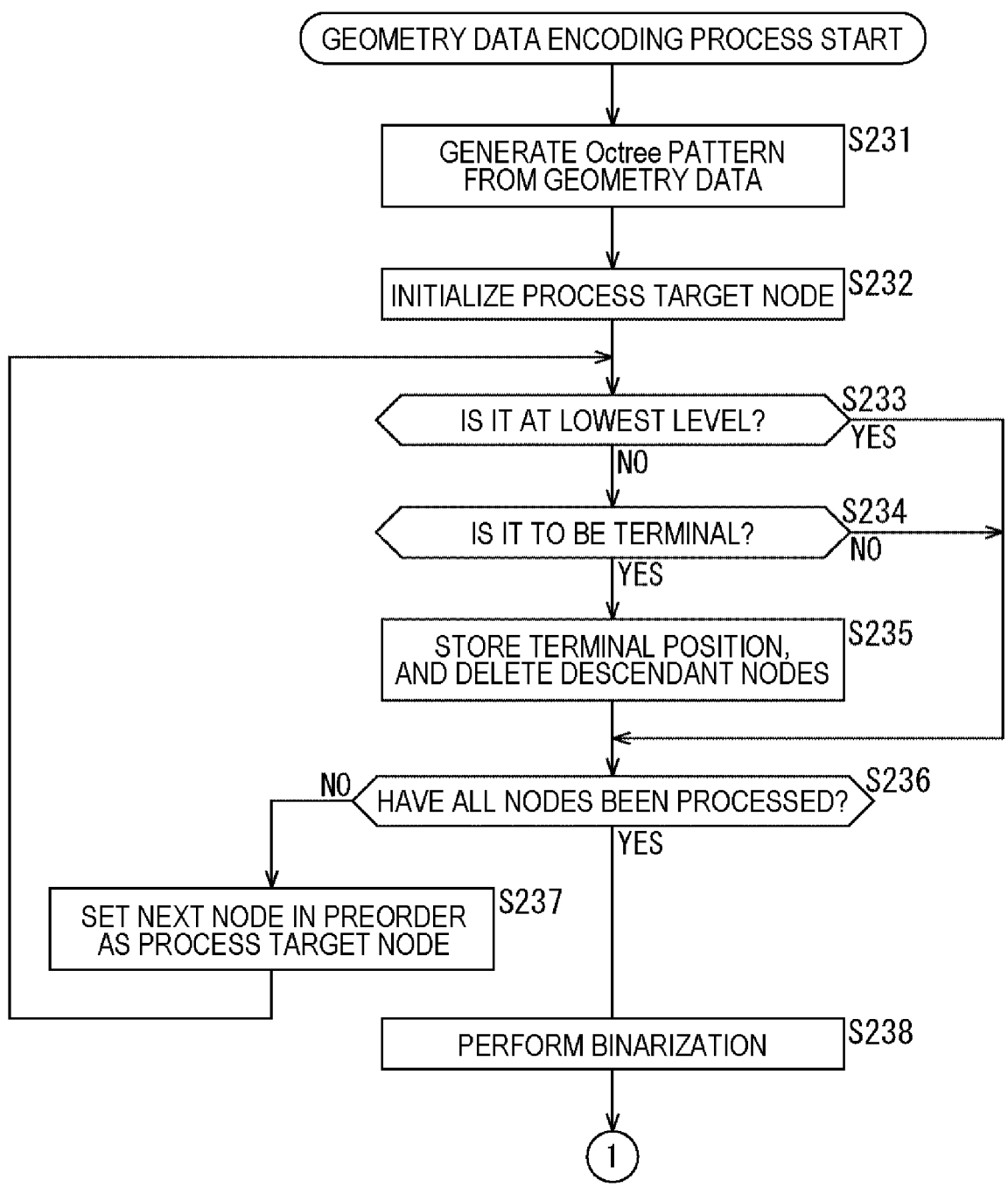
FIG. 20 is a flowchart for explaining an example flow in a geometry data encoding process.
Figure 21:
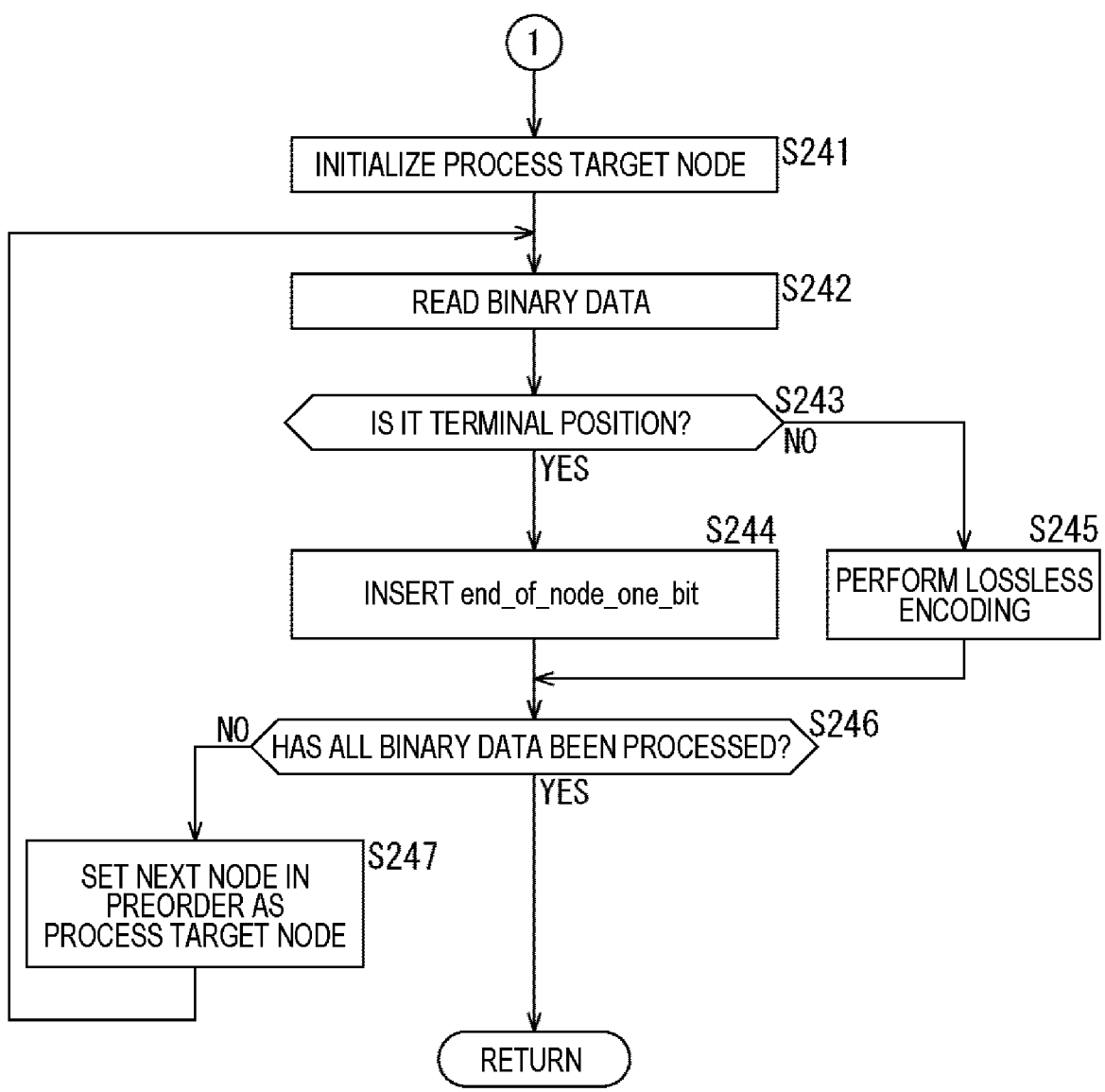
FIG. 21 is a flowchart for explaining an example flow in the geometry data encoding process continued from FIG. 20.

<Flow in the Geometry Data Encoding Process>Next, an example flow in the geometry data encoding process to be performed in step S104 in FIG. 7 in this case is described, with reference to the flowchart shown in FIGS. 20 and 21.

When the geometry data encoding process is started in this case, the Octree construction unit 341 in step S231 in FIG. 20 constructs an Octree pattern from the geometry data, and generates the Octree pattern data.

In step S232, the Octree depth control unit 342 initializes the processing target node in the Octree pattern.

In step S233, the Octree depth control unit 342 determines whether or not the level of the processing target node is the lowest level. When the level of the processing target node is determined not to be the lowest level, the process moves on to step S234.

In step S234, the Octree depth control unit 342 determines whether or not the processing target node is to be turned into a terminal. When it is determined that the processing target node is to be turned into a terminal, or that the processing target node is to be turned into a leaf node, the process moves on to step S235.

In step S235, the Octree depth control unit 342 stores (specifies) the processing target node as the node to be turned into a terminal (or as a terminal position). Further, the Octree construction unit 341 deletes the descendant nodes of the processing target node. That is, the processing target node is turned into a leaf node, and the descendant nodes belonging to the leaf node are deleted. After the process in step S235 is completed, the process moves on to step S236.

When it is determined in step S234 that the processing target node is not to be turned into a terminal, on the other hand, the process in step S235 is skipped, and the process moves on to step S236. That is, a node not to be turned into a terminal is not edited (remaining as generated by the Octree construction unit 341).

When it is determined in step S233 that the level of the processing target node is the lowest level, which is the level with the same resolution as (the voxels of) the geometry data, on the other hand, the processes in steps S234 and S235 are skipped, and the process moves on to step S236. That is, any bit string is not set in a node at the lowest level, and therefore, no editing is performed (the node remains as generated by the Octree construction unit 341).

In step S236, the Octree depth control unit 342 determines whether or not all the nodes of the Octree pattern generated in step S231 have been processed. When it is determined that there is an unprocessed node, the process moves on to step S237.

In step S237, the Octree depth control unit 342 sets the processing target node as the next node in the preorder. After the processing target node is updated, the process returns to step S233. That is, the respective processes in steps S233 through S237 are performed for each node of the Octree pattern corresponding to the geometry data.

When it is determined in step S236 that all the nodes have been processed, the process then moves on to step S238.

In step S238, the binarization unit 322 binarizes the Octree pattern data corresponding to the geometry data generated by the above process. After the process in step S238 is completed, the process moves on to FIG. 21.

In step S241 in FIG. 21, the lossless encoding unit 323 initializes the processing target node.

In step S242, the lossless encoding unit 323 reads the binary data of the processing target node generated in step S238 in FIG. 20.

In step S243 in FIG. 21, the lossless encoding unit 323 determines whether or not the processing target node is the terminal position stored (specified) in step S204 in FIG. 20. When the processing target node is determined to be the terminal position, the process moves on to step S244 in FIG. 21.

In step S244, the lossless encoding unit 323 inserts the predetermined flag information (end_of_node_one_bit) at the position (which is the terminal position) corresponding to the processing target node in the bit stream. After the process in step S244 is completed, the process moves on to step S246.

When the processing target node is determined not to be the terminal position in step S243, on the other hand, the process moves on to step S245.

In step S245, the lossless encoding unit 323 performs lossless encoding on the binary data of the processing target node. After the process in step S245 is completed, the process moves on to step S246.

In step S246, the lossless encoding unit 323 determines whether or not all the binary data has been processed. When it is determined that there exists unprocessed binary data, the process moves on to step S247.

In step S247, the lossless encoding unit 323 sets the processing target node as the next node in the preorder. After the processing target node is updated, the process returns to step S242. That is, the respective processes in steps S242 through S247 are performed on the binary data of each node of the Octree pattern.

When it is determined in step S246 that all the binary data has been processed, on the other hand, the geometry data encoding process comes to an end, and the process returns to FIG. 7.

As the respective processes are performed as described above, the encoding device 100 in this case can also partially control the resolution of the points in a point cloud to be subjected to Octree encoding (or can partially control the resolution of a data group that can be turned into a tree structure). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

Note that the preorder has been described as an example of an Octree pattern scanning order. However, this scanning order may be any appropriate order, and is not necessarily the preorder. For example, the scanning order may be a leading order, a pre-order, a passing order, a middle order, an intermediate order, a passing-by order, a backward order, a subsequent order, a post-order, a return order, a level order, or the like.

<Decoding Device>

The decoding device 250 that decodes the bit stream generated by the encoding device 100 in this case also has a configuration similar to that of the case described above with reference to FIG. 11.

In this case, however, the depth control information may be predetermined flag information (end_of_node_one_bit) indicating whether or not "in the bit stream, a particular node corresponding to the depth control information at a higher level than the lowest level of the Octree pattern is a leaf node", for example.

With this arrangement, the decoding unit 261 detects the "predetermined flag information" in the bit stream, to easily recognize that "the particular node is a leaf node".

Further, as described above, the "predetermined flag information" is inserted at the position corresponding to a leaf node at a higher level than the lowest level of the Octree pattern in the bit stream, and indicates whether or not the node corresponding to the position is a leaf node.

That is, the position of the leaf node at the higher level than the lowest level of the Octree pattern is indicated by the position of the "flag information (depth control information)" inserted into the bit stream. Accordingly, when decoding the bit stream to reconstruct the Octree pattern, the decoding unit 261 detects (specifies) the position of the "flag information (depth control information)" in the bit stream, to reconstruct the Octree pattern so that the leaf node at the higher level than the lowest level of the Octree pattern is formed. That is, it is possible to correctly decode an Octree pattern including a leaf node at a higher level than the lowest level.

<Decoding Unit>

Figure 22:
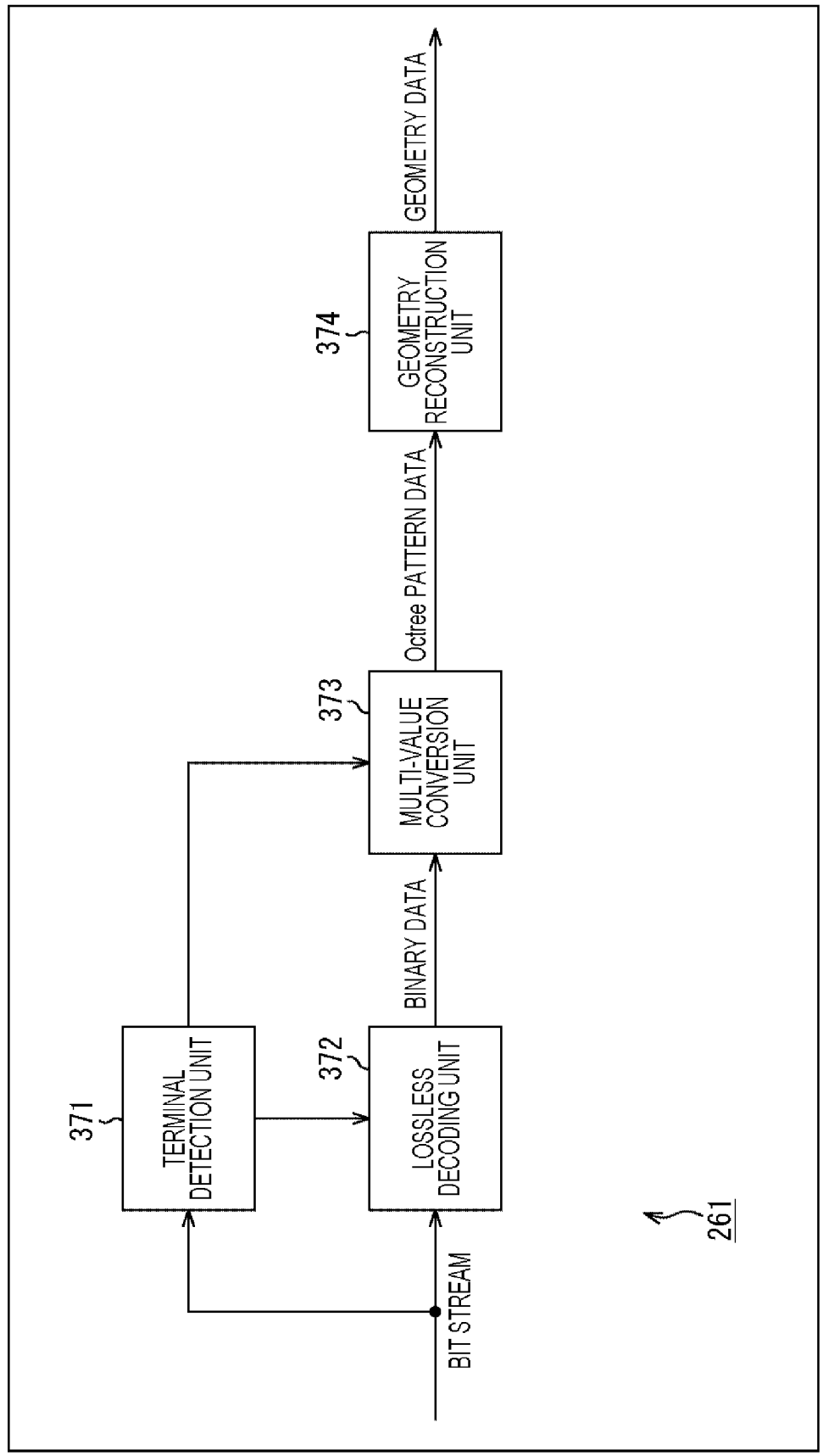
FIG. 22 is a block diagram showing a principal example configuration of a decoding unit.

FIG. 22 is a block diagram showing a principal example configuration of the decoding unit 261 in this case. As shown in FIG. 22, the decoding unit 261 includes a terminal detection unit 371, a lossless decoding unit 372, a multi-value conversion unit 373, and a geometry reconstruction unit 374.

The terminal detection unit 371 performs a process relating to detection of a terminal node. For example, the terminal detection unit 371 detects the "predetermined flag information (end_of_node_one_bit)" inserted into a bit stream generated by the encoding device 100, and specifies (stores) the position as a terminal position. The terminal detection unit 371 supplies the detection result to the lossless decoding unit 372 and the multi-value conversion unit 373.

Note that the terminal detection unit 371 may have any configuration. For example, the terminal detection unit 371 may include a CPU, a ROM, a RAM, and the like, and the CPU may load a program and data stored in the ROM or the like into the RAM, and execute the program, to perform a process relating to detection of a terminal.

The lossless decoding unit 372 performs a process relating to lossless decoding. For example, the lossless decoding unit 372 performs lossless decoding on the bit stream generated by the encoding device 100 by a method compatible with the lossless encoding unit 323, to obtain binary data. This lossless decoding method may be any method that is compatible with the lossless encoding method being used by the lossless encoding unit 323. For example, the lossless decoding method may be CABAC.

Further, at that stage, the lossless decoding unit 372 deletes the "predetermined flag information (end_of_node_one_bit)" from the terminal position detected by the terminal detection unit 371 (the position at which "the predetermined flag information (end_of_node_one_bit)" was inserted) in the bit stream.

The lossless decoding unit 372 supplies the binary data obtained as above to the multi-value conversion unit 373.

Note that the lossless decoding unit 372 may have any configuration. For example, the lossless decoding unit 372 may include a CPU, a ROM, a RAM, and the like, and the CPU may load a program and data stored in the ROM or the like into the RAM, and execute the program, to perform a process relating to lossless decoding.

The multi-value conversion unit 373 performs a process relating to multi-value conversion. For example, the multi-value conversion unit 373 performs multi-value conversion on the binary data supplied from the lossless decoding unit 372, to reconstruct an Octree pattern and generate Octree pattern data. At that stage, the terminal detection unit 371 controls the multi-value conversion unit 373 in accordance with the result of the terminal position detection, to control the reconstruction of the Octree pattern.

For example, in reconstructing the Octree pattern, the multi-value conversion unit 373 converts the node corresponding to the terminal position detected (specified) by the terminal detection unit 371 in the bit stream into a terminal (a leaf node), and prohibits construction of any descendant node belonging to the node. By doing so, the multi-value conversion unit 373 can reconstruct the Octree pattern, so that a leaf node is formed at a higher level than the lowest level of the Octree pattern specified by the "information specifying the depth of the Octree pattern".

The multi-value conversion unit 373 supplies the Octree pattern data obtained in this manner to the geometry reconstruction unit 374.

Note that the multi-value conversion unit 373 may have any configuration. For example, the multi-value conversion unit 373 may include a CPU, a ROM, a RAM, and the like, and the CPU may load a program and data stored in the ROM or the like into the RAM, and execute the program, to perform a process relating to multi-value conversion.

The geometry reconstruction unit 374 performs a process relating to reconstruction of geometry data. For example, the geometry reconstruction unit 374 reconstructs geometry data, using the Octree pattern data supplied from the multi-value conversion unit 373. The geometry reconstruction unit 374 supplies the obtained geometry data to the point cloud processing unit 262 (FIG. 11).

Note that the geometry reconstruction unit 374 may have any configuration. For example, the geometry reconstruction unit 374 may include a CPU, a ROM, a RAM, and the like, and the CPU may load a program and data stored in the ROM or the like into the RAM, and execute the program, to perform a process relating to reconstruction of geometry data.

As described above, the terminal detection unit 371 through the multi-value conversion unit 373 decode a bit stream, and construct an Octree pattern including a leaf node at a different level from the lowest level, on the basis of the predetermined flag information (depth control information) inserted into the bit stream.

Thus, the resolution of points can be partially controlled in a point cloud to be subjected to Octree encoding (or the resolution of a data group that can be turned into a tree structure can be partially controlled). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

Note that the method of decoding a bit stream may be any method that is compatible with the encoding method, and is not limited to the above described example. For example, a bit stream may be decoded with CAVLC. That is, in this case, the bit stream has been encoded with CAVLC. In that case, instead of the lossless decoding unit 372 and the multi-value conversion unit 373, a lossless decoding unit that conducts CAVLC may be provided.

<Flow in a Decoding Process>

In this case, the flow in a decoding process to be performed by the decoding device 250 is also similar to that in the case described above with reference to the flowchart shown in FIG. 13, and therefore, explanation thereof is not made herein.

<Flow in the Bit Stream Decoding Process>

Figure 23:
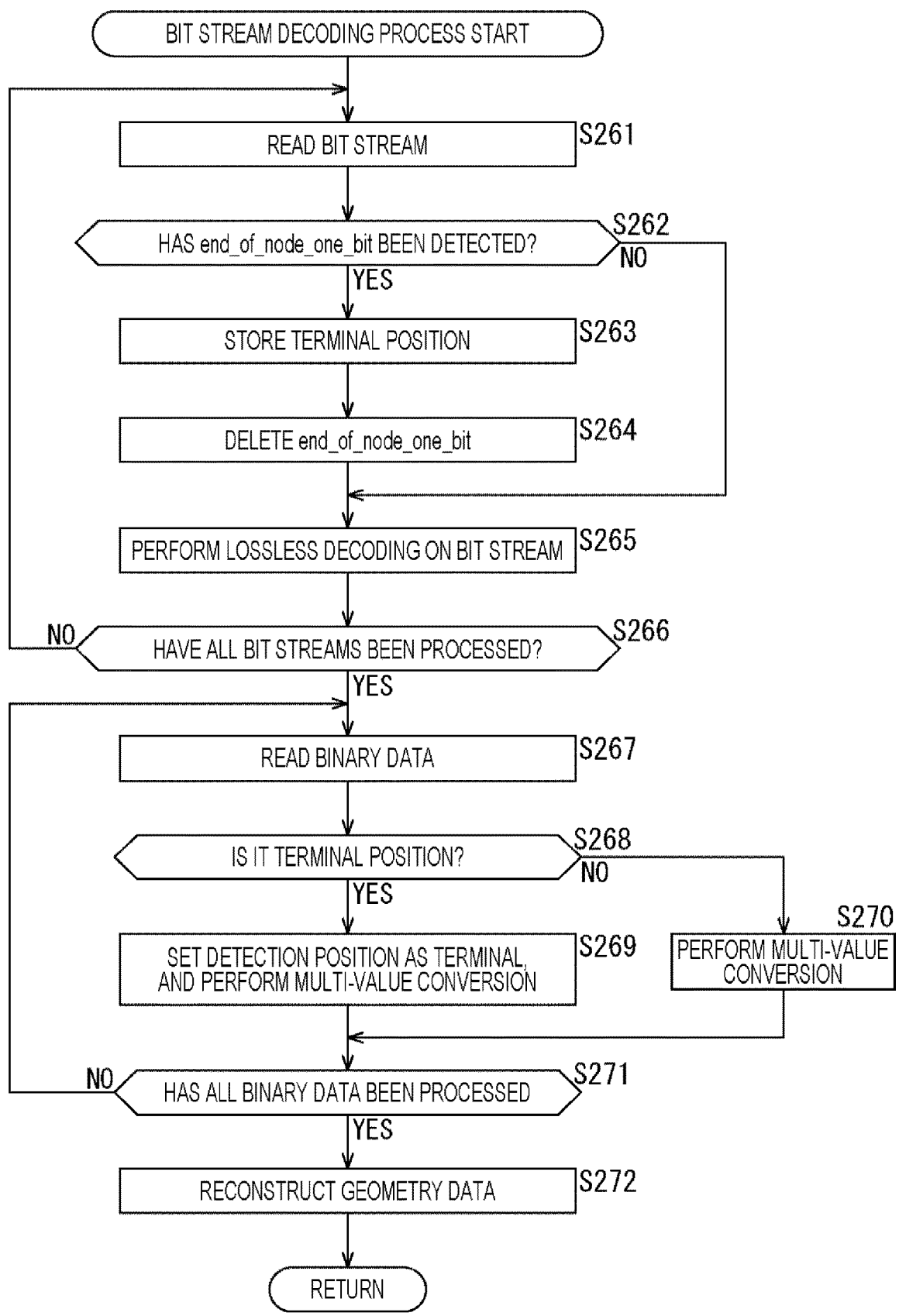
FIG. 23 is a flowchart for explaining an example flow in a bit stream decoding process.

Referring now to the flowchart shown in FIG. 23, an example flow in the bit stream decoding process to be performed in step S161 in FIG. 13 is described.

When the bit stream decoding process is started, the terminal detection unit 371 reads the bit stream in step S261.

In step S262, the terminal detection unit 371 searches the bit stream for the predetermined flag information (end_of_node_one_bit), and determines whether or not the predetermined flag information has been detected. When it is determined that the predetermined flag information (end_of_node_one_bit) has been detected, the process moves on to step S263.

In step S263, the terminal detection unit 371 stores (specifies) the position at which the predetermined flag information (end_of_node_one_bit) has been detected as a terminal position.

In step S264, the lossless decoding unit 372 deletes the predetermined flag information (end_of_node_one_bit) from the terminal position specified in step S263 in the bit stream read in step S261.

After the process in step S264 is completed, the process moves on to step S265. When it is determined in step S262 that the predetermined flag information (end_of_node_one_bit) has not been detected, on the other hand, the processes in steps S263 and S264 are skipped, and the process moves on to step S265.

In step S265, the lossless decoding unit 372 performs lossless decoding on the bit stream read in step S261.

In step S266, the lossless decoding unit 372 determines whether or not all the bit streams have been processed. When it is determined that there is an unprocessed bit stream, the process returns to step S261.

The processes in steps S261 through S266 are repeatedly performed for the respective bit streams. When it is determined in step S266 that all the bit streams have been processed, the process moves on to step S267.

In step S267, the multi-value conversion unit 373 reads the binary data obtained through the process in step S265.

In step S268, the multi-value conversion unit 373 determines whether or not the terminal position specified in step S263 is included in the binary data. When it is determined that the terminal position is included, the process moves on to step S269.

In step S269, the multi-value conversion unit 373 performs multi-value conversion on the binary data, with the node corresponding to the terminal position being a terminal (a leaf node). That is, the multi-value conversion unit 373 performs multi-value conversion on the binary data, and reconstructs the Octree pattern in which the node corresponding to the terminal position is a terminal (a leaf node). That is, the depth control information (the bit string of the terminal identification bit pattern) is reflected in the Octree pattern to be reconstructed.

After the process in step S269 is completed, the process moves on to step S271. When it is determined in step S268 that the terminal position is not included in the binary data, on the other hand, the process moves on to step S270.

In step S270, the multi-value conversion unit 373 performs multi-value conversion on the binary data, and reconstructs the Octree pattern in a manner similar to that in the case of a general Octree pattern. After the process in step S270 is completed, the process moves on to step S271.

In step S271, the multi-value conversion unit 373 determines whether or not all the binary data has been processed. When there exists unprocessed binary data, the process returns to step S267, with the unprocessed binary data being the new processing target. That is, the processes in steps S267 through S271 are performed for all the binary data. When it is determined in step S271 that all the binary data has been processed, the process then moves on to step S272.

In step S272, the geometry reconstruction unit 374 reconstructs geometry data, using the Octree pattern data obtained through the above process.

When the process in step S272 is completed, the bit stream decoding process comes to an end, and the process returns to FIG. 13.

As the respective processes are performed as described above, the decoding device 250 can partially control the resolution of the points in a point cloud to be subjected to Octree encoding (or can partially control the resolution of a data group that can be turned into a tree structure). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

4. Third Embodiment

<split_voxel_flag>

Note that "depth control information" may be any appropriate information, but may be "addition information regarding addition of a descendant node to a particular node corresponding to the depth control information at the lowest level of the Octree pattern", for example. With this arrangement, the descendant node for the particular node can be added on the decoding side, on the basis of the "addition information" included in a bit stream.

Further, the addition information may be inserted at the position corresponding to the node at the lowest level of the Octree pattern to which the descendant node is to be added in the bit stream. With this arrangement, on the decoding side, the node to which the descendant node is to be added (or the node corresponding to the addition information) can be easily specified from the position at which the "addition information" has been inserted.

Figure 24:
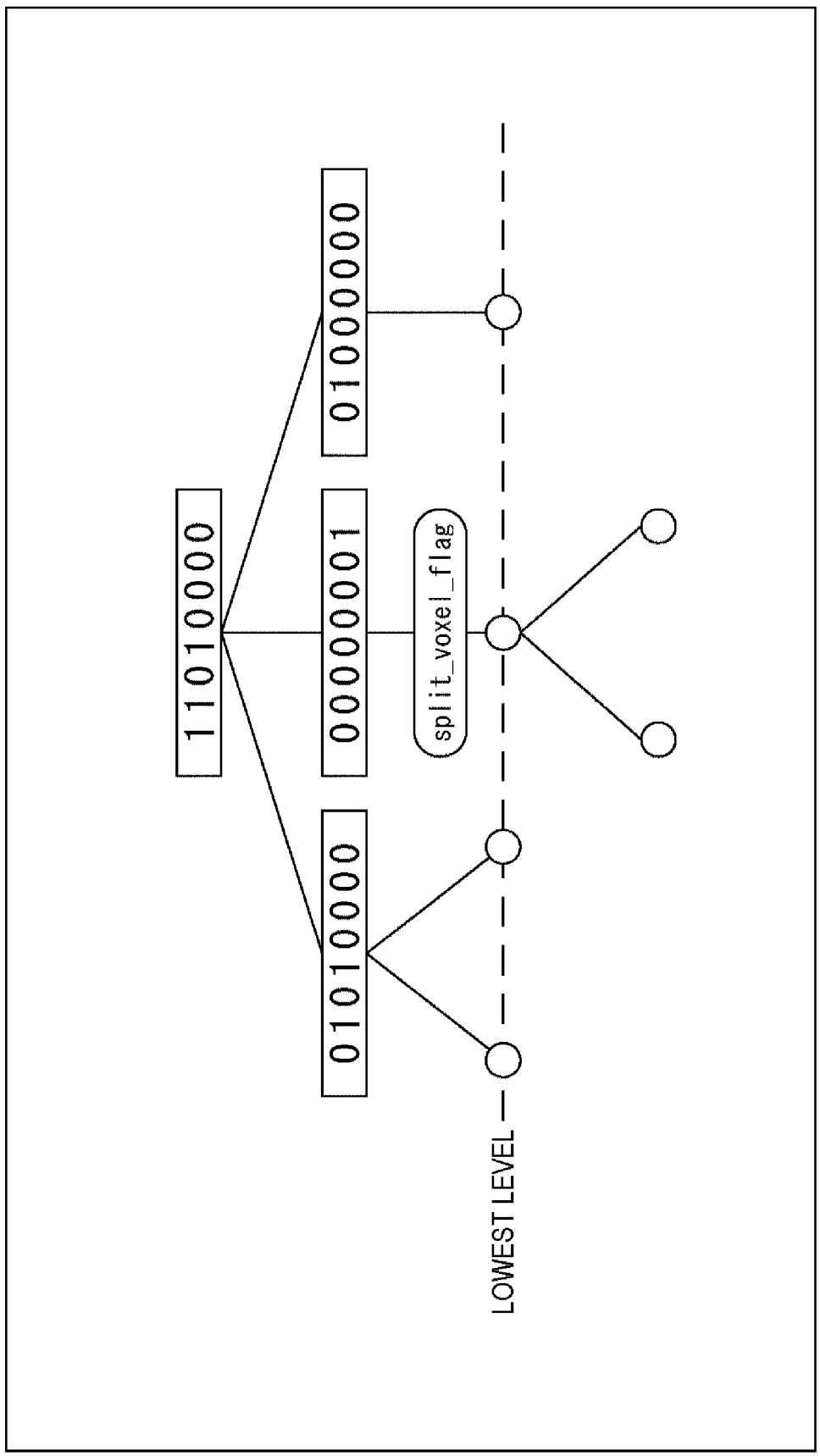
FIG. 24 is a diagram for explaining an example of depth control information.

For example, "addition information" is set for some of the nodes at the lowest level, as in the Octree pattern shown in FIG. 24. This "addition information" includes information regarding addition of descendant nodes. This "addition information" may include any appropriate specific contents. For example, the "addition information" may include predetermined flag information (split_voxel_flag) indicating whether or not the node corresponding to the position at which the addition information has been inserted in the bit stream is further divided. Further, the "addition information" may also include information regarding the depth of the descendant nodes to be added, for example. With this arrangement, descendant nodes having more various configurations can be added on the basis of the addition information.

For example, in the case illustrated in FIG. 24, "predetermined flag information (split_voxel_flag)" is set as the addition information in the second node from the right at the lowest level in the Octree pattern. On the basis of this information, child nodes are added to this node.

In other words, with such "addition information (depth control information)", it is possible to express partial control on the resolution of the points in an Octree pattern. That is, the resolution of points can be partially controlled in a point cloud to be subjected to Octree encoding (or the resolution of a data group that can be turned into a tree structure can be partially controlled).

In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

Note that the name (syntax) of this "flag information" may be any appropriate name, and may be other than "split_voxel_flag". The value of this "flag information (split_voxel_flag)" may also be any appropriate value. For example, the value may be "1", or may be "0". Furthermore, this "flag information" may be formed with a plurality of bits. Further, this "flag information" may include information that is not information indicating a leaf node. Furthermore, this "flag information" may be set in all the nodes, and the value thereof may indicate whether or not a descendant node is to be added. Note that this "flag information" may include information indicating all the configurations of descendant nodes, and the "flag information" set in the nodes at the lowest level of the Octree pattern (the lowest level based on the information specifying the depth of the Octree pattern) may express all the descendant nodes to be added. That is, when descendent nodes of a plurality of hierarchical levels are added, for example, all the descendant nodes to be added may be expressed by one piece of "flag information" set in the nodes at the lowest level of the Octree pattern. Further, this "flag information" may include only information regarding the divisions of the set nodes. That is, when descendent nodes of a plurality of hierarchical levels are added, for example, this "flag information" may be set in each of the descendant nodes, so that the descendant nodes of the plurality of hierarchical levels are expressed.

Further, this "flag information" may be inserted at a position other than the position of the corresponding node in a bit stream, if the correspondence relationship with a leaf node has been made clear. For example, this "flag information" may be collectively stored in a header, a parameter set, or the like. Alternatively, this "flag information" may be included in a bit stream different from the bit stream of the Octree pattern data. In these cases, information indicating which "flag information" corresponds to which leaf node is also necessary.

<Encoding Unit>

Figure 25:
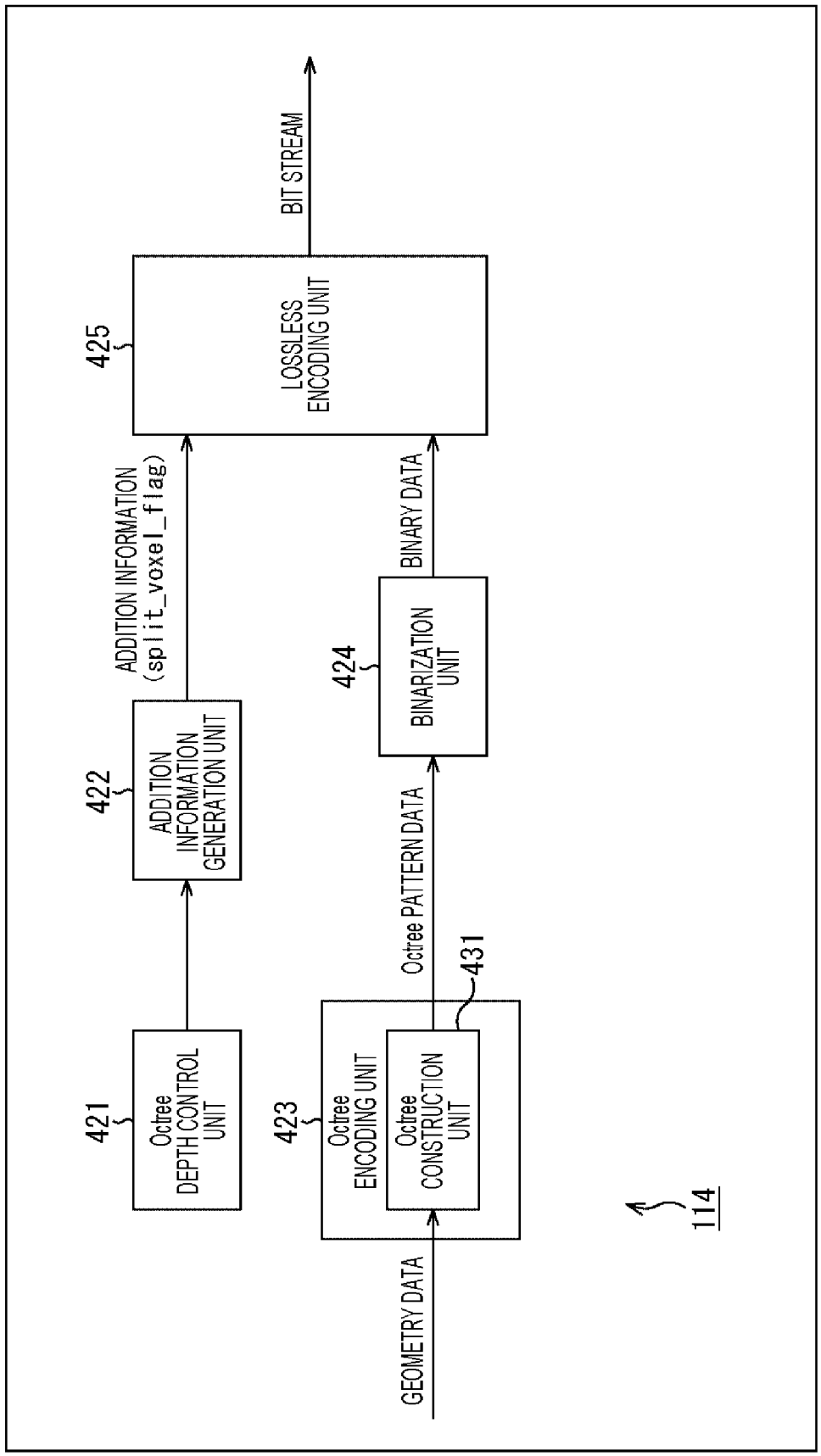
FIG. 25 is a block diagram showing a principal example configuration of an encoding unit.

FIG. 25 is a block diagram showing a principal example configuration of the encoding unit 114 (FIG. 3) in this case. As shown in FIG. 25, the encoding unit 114 in this case includes an Octree depth control unit 421, an addition information generation unit 422, an Octree encoding unit 423, a binarization unit 424, and a lossless encoding unit 425.

The Octree depth control unit 421 performs control relating to the depth of an Octree pattern. For example, the Octree depth control unit 421 controls the addition information generation unit 422, to control generation of addition information (which is addition of a descendant node), and control the depth of an Octree pattern.

Note that the Octree depth control unit 421 may have any configuration. For example, the Octree depth control unit 421 may include a CPU, a ROM, a RAM, and the like, and the CPU may load a program and data stored in the ROM or the like into the RAM, and execute the program, to perform a process relating to Octree depth control.

The addition information generation unit 422 generates addition information for a node (a leaf node at the lowest level) designated by the Octree depth control unit 421. The addition information generation unit 422 supplies the generated addition information to the lossless encoding unit 425.

Note that the addition information generation unit 422 may have any configuration. For example, the addition information generation unit 422 may include a CPU, a ROM, a RAM, and the like, and the CPU may load a program and data stored in the ROM or the like into the RAM, and execute the program, to perform a process relating to generation of addition information.

The Octree encoding unit 423 performs a process relating to Octree encoding. For example, the Octree encoding unit 423 performs Octree encoding on the geometry data (positional information) of voxel data supplied from the voxel setting unit 113, to generate Octree pattern data.

As shown in FIG. 25, the Octree encoding unit 423 includes an Octree construction unit 431.

The Octree construction unit 431 performs a process relating to construction of an Octree pattern. For example, the Octree construction unit 431 constructs an Octree pattern on the basis of geometry data, and generates Octree pattern data corresponding to the geometry data. The Octree encoding unit 423 (the Octree construction unit 431) supplies the generated Octree pattern data to the binarization unit 424.

Note that the Octree encoding unit 423 (the Octree construction unit 431) may have any configuration. For example, the Octree encoding unit 423 may include a CPU, a ROM, a RAM, and the like, and the CPU may load a program and data stored in the ROM or the like into the RAM, and execute the program, to perform a process relating to Octree encoding.

The binarization unit 424 performs a process relating to binarization. For example, the binarization unit 424 binarizes the Octree pattern data supplied from the Octree encoding unit 423, to generate binary data. The binarization unit 424 supplies the generated binary data to the lossless encoding unit 425.

Note that the binarization unit 424 may have any configuration. For example, the binarization unit 424 may include a CPU, a ROM, a RAM, and the like, and the CPU may load a program and data stored in the ROM or the like into the RAM, and execute the program, to perform a process relating to binarization.

The lossless encoding unit 425 performs a process relating to lossless encoding. For example, the lossless encoding unit 425 performs lossless encoding on the binary data supplied from the binarization unit 424, to generate a bit stream (which is the encoded data of the Octree pattern data). This method of performing lossless encoding may be any appropriate method, and may be CABAC, for example.

The lossless encoding unit 425 also performs lossless encoding on the addition information supplied from the addition information generation unit 422, and inserts the addition information at the position corresponding to the leaf node to which a descendant node is to be added in the bit stream. The lossless encoding unit 425 further stores information specifying the depth (the number of levels) of the Octree pattern of the Octree pattern data into a header, a parameter set, or the like, which is included in the bit stream.

The lossless encoding unit 425 outputs the generated bit stream to the outside of the encoding unit 114 (in other words, the outside of the encoding device 100).

Note that the lossless encoding unit 425 may have any configuration. For example, the lossless encoding unit 425 may include a CPU, a ROM, a RAM, and the like, and the CPU may load a program and data stored in the ROM or the like into the RAM, and execute the program, to perform a process relating to lossless encoding.

As described above, when a descendant node is further added to a leaf node at the lowest level of an Octree pattern, the lossless encoding unit 425 inserts the addition information (depth control information) at the position corresponding to the node in the bit stream.

Thus, the resolution of points can be partially controlled in a point cloud to be subjected to Octree encoding (or the resolution of a data group that can be turned into a tree structure can be partially controlled). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

Note that any appropriate method may be used for encoding Octree pattern data. For example, Octree pattern data may be encoded with context-based adaptive variable length code (CAVLC). In that case, instead of the binarization unit 424 and the lossless encoding unit 425, a lossless encoding unit that conducts CAVLC may be provided.

<Flow in an Encoding Process>

In this case, the flow in an encoding process to be performed by the encoding device 100 is also similar to that in the case described above with reference to the flowchart shown in FIG. 7, and therefore, explanation thereof is not made herein.

<Flow in the Geometry Data Encoding Process>

Figure 26:
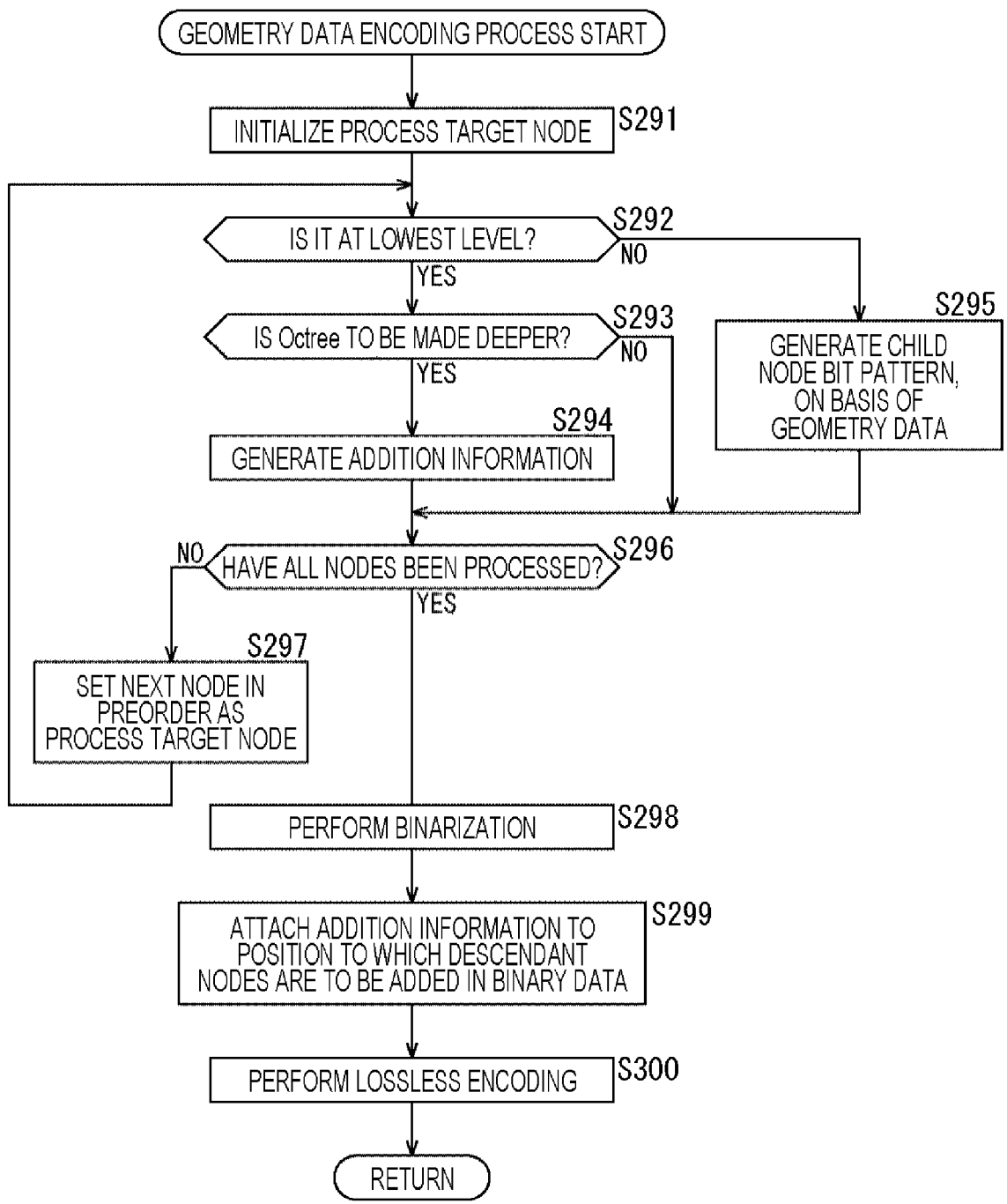
FIG. 26 is a flowchart for explaining an example flow in a geometry data encoding process.

Next, an example flow in the geometry data encoding process to be performed in step S104 in FIG. 7 in this case is described, with reference to the flowchart shown in FIG. 26.

When the geometry data encoding process is started, the Octree depth control unit 421 initializes the processing target node in the Octree pattern in step S291 in FIG. 26.

In step S292, the Octree depth control unit 421 determines whether or not the level of the processing target node is the lowest level. When the level of the processing target node is determined not to be the lowest level, the process moves on to step S293.

In step S293, the Octree depth control unit 421 determines whether or not to deepen the Octree at the processing target node, or whether or not to add a child node. When it is determined that the Octree is to be made deeper (a child node is to be added), the process moves on to step S294.

In step S294, the addition information generation unit 422 generates addition information including information (split_voxel_flag or the like, for example) regarding the descendant node to be added to the processing target node.

After the process in step S294 is completed, the process moves on to step S296. When it is determined in step S293 that the Octree is not to be made deeper (that is, any child node is not to be added to the processing target node), on the other hand, the process in step S294 is skipped, and the process moves on to step S296.

When the processing target node is determined not to be at the lowest level in step S292, on the other hand, the process moves on to step S295.

In step S295, on the basis of the geometry data, the Octree encoding unit 423 (the Octree construction unit 431) generates a bit string having the bit pattern of a child node, and sets the bit string in processing target node. After the process in step S295 is completed, the process moves on to step S296.

In step S296, the Octree depth control unit 421 determines whether or not all the nodes have been processed. When it is determined that the Octree pattern corresponding to the geometry data has not been constructed, and there is an unprocessed node, the process moves on to step S297.

In step S297, the Octree depth control unit 421 sets the processing target node as the next node in the preorder. After the processing target node is updated, the process returns to step S292. That is, the respective processes in steps S292 through S297 are performed for each node of the Octree pattern corresponding to the geometry data.

When it is determined in step S296 that the Octree pattern corresponding to the geometry data has been constructed, and all the nodes have been processed, the process then moves on to step S298.

In step S298, the binarization unit 424 binarizes the Octree pattern data corresponding to the geometry data generated by the above process.

In step S299, the lossless encoding unit 425 adds the addition information to the position corresponding to the node to which a descendant node is to be added in the binary data.

In step S300, the lossless encoding unit 425 performs lossless encoding on the binary data, to generate a bit stream.

When the process in step S300 is completed, the geometry data encoding process comes to an end, and the process returns to FIG. 7.

As the respective processes are performed as described above, the encoding device 100 in this case can also partially control the resolution of the points in a point cloud to be subjected to Octree encoding (or can partially control the resolution of a data group that can be turned into a tree structure). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

Note that the preorder has been described as an example of an Octree pattern scanning order. However, this scanning order may be any appropriate order, and is not necessarily the preorder. For example, the scanning order may be a leading order, a pre-order, a passing order, a middle order, an intermediate order, a passing-by order, a backward order, a subsequent order, a post-order, a return order, a level order, or the like.

<Decoding Device>

The decoding device 250 that decodes the bit stream generated by the encoding device 100 in this case also has a configuration similar to that of the case described above with reference to FIG. 11.

In this case, however, the depth control information may be "addition information regarding addition of a descendant node to a particular node corresponding to the depth control information at the lowest level of the Octree pattern", for example.

With this arrangement, the decoding unit 261 detects the "addition information" in the bit stream, to easily recognize "the descendant node to be added to the particular node".

Note that, as described above, this "addition information" may be inserted at the position corresponding to the node at the lowest level of the Octree pattern to which the descendant node is to be added in the bit stream. That is, the position of the node (a leaf node) to which a descendant node is to be added at the lowest level of the Octree pattern may be indicated by the position of the "addition information (depth control information)" inserted into the bit stream.

Also, as described above, the "addition information" may include predetermined flag information (split_voxel_flag) indicating whether or not the node corresponding to the position at which the addition information has been inserted in the bit stream is further divided. Further, as described above, the "addition information" may also include information regarding the depth of the descendant nodes to be added. With this arrangement, descendant nodes having more various configurations can be added on the basis of the addition information.

With this arrangement, when decoding a bit stream to reconstruct an Octree pattern, the decoding unit 261 detects (specifies) the position of the "addition information (depth control information)" in the bit stream, to reconstruct the Octree pattern so that descendant nodes are added to the node corresponding to the addition information at the lowest level of the Octree pattern. That is, it is possible to correctly decode an Octree pattern including descendant nodes added to a leaf node at the lowest level.

<Decoding Unit>

Figure 27:
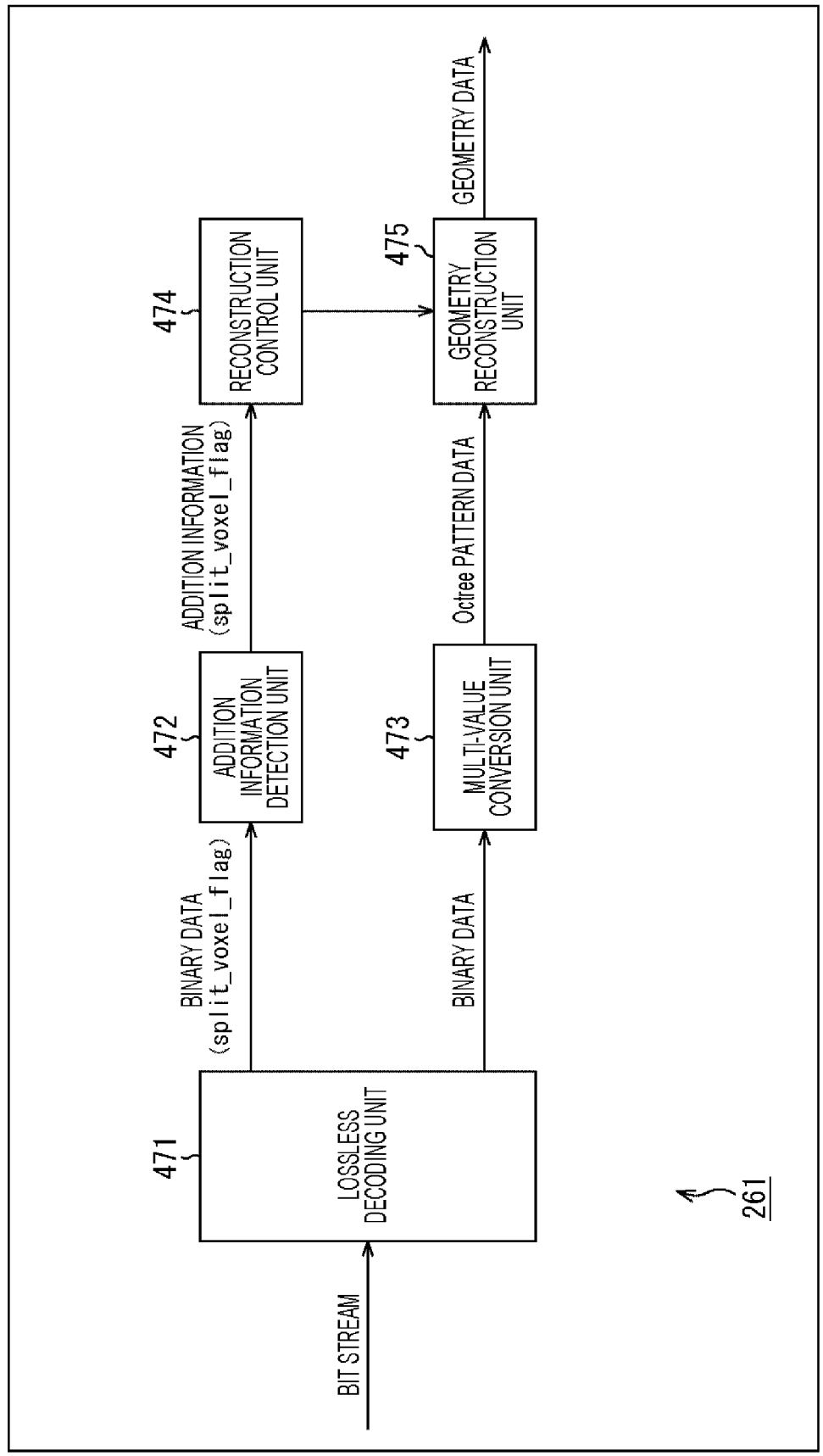
FIG. 27 is a block diagram showing a principal example configuration of a decoding unit.

FIG. 27 is a block diagram showing a principal example configuration of the decoding unit 261 in this case. As shown in FIG. 27, the decoding unit 261 includes a lossless decoding unit 471, an addition information detection unit 472, a multi-value conversion unit 473, a reconstruction control unit 474, and a geometry reconstruction unit 475.

The lossless decoding unit 471 performs a process relating to lossless decoding. For example, the lossless decoding unit 471 performs lossless decoding on a bit stream generated by the encoding device 100 by a method compatible with the lossless encoding unit 425, to obtain binary data. This lossless decoding method may be any method that is compatible with the lossless encoding method being used by the lossless encoding unit 425. For example, the lossless decoding method may be CABAC.

The lossless decoding unit 471 supplies the binary data obtained as above to the addition information detection unit 472 and the multi-value conversion unit 473.

Note that the lossless decoding unit 471 may have any configuration. For example, the lossless decoding unit 471 may include a CPU, a ROM, a RAM, and the like, and the CPU may load a program and data stored in the ROM or the like into the RAM, and execute the program, to perform a process relating to lossless decoding.

The addition information detection unit 472 performs a process relating to detection of addition information. For example, the addition information detection unit 472 detects the addition information included in the bit stream. The addition information detection unit 472 then supplies the detected addition information to the reconstruction control unit 474.

Note that the addition information detection unit 472 may have any configuration. For example, the addition information detection unit 472 may include a CPU, a ROM, a RAM, and the like, and the CPU may load a program and data stored in the ROM or the like into the RAM, and execute the program, to perform a process relating to detection of addition information.

The multi-value conversion unit 473 performs a process relating to multi-value conversion. For example, the multi-value conversion unit 473 performs multi-value conversion on the binary data supplied from the lossless decoding unit 471, to reconstruct an Octree pattern and generate Octree pattern data. The multi-value conversion unit 473 supplies the Octree pattern data obtained in this manner to the geometry reconstruction unit 475.

Note that the multi-value conversion unit 473 may have any configuration. For example, the multi-value conversion unit 473 may include a CPU, a ROM, a RAM, and the like, and the CPU may load a program and data stored in the ROM or the like into the RAM, and execute the program, to perform a process relating to multi-value conversion.

The reconstruction control unit 474 performs a process relating to reconstruction control. For example, the reconstruction control unit 474 controls the geometry reconstruction unit 475 on the basis of the addition information detected by the addition information detection unit 472, so that the descendant node corresponding to the addition information is added to the node corresponding to the addition information at the lowest level in the Octree pattern, and geometry data reflecting the addition is reconstructed.

Note that the reconstruction control unit 474 may have any configuration. For example, the reconstruction control unit 474 may include a CPU, a ROM, a RAM, and the like, and the CPU may load a program and data stored in the ROM or the like into the RAM, and execute the program, to perform a process relating to reconstruction control.

The geometry reconstruction unit 475 performs a process relating to reconstruction of geometry data. For example, under the control of the reconstruction control unit 474, the geometry reconstruction unit 475 reconstructs geometry data, using the Octree pattern data supplied from the multi-value conversion unit 373. That is, the geometry reconstruction unit 475 adds the descendant node corresponding to the addition information to the node corresponding to the addition information at the lowest level of the Octree pattern, and thus, reconstructs geometry data reflecting the addition.

The geometry reconstruction unit 475 supplies the obtained geometry data to the point cloud processing unit 262 (FIG. 11).

Note that the geometry reconstruction unit 475 may have any configuration. For example, the geometry reconstruction unit 475 may include a CPU, a ROM, a RAM, and the like, and the CPU may load a program and data stored in the ROM or the like into the RAM, and execute the program, to perform a process relating to reconstruction of geometry data.

As described above, the lossless decoding unit 471 through the geometry reconstruction unit 475 decode a bit stream, construct an Octree pattern including a leaf node at a different level from the lowest level on the basis of predetermined flag information (depth control information) inserted into the bit stream, and reconstruct geometry data based on the Octree pattern. That is, the decoding unit 261 can obtain an Octree pattern whose resolution is partially controlled, and obtain the geometry data corresponding to the Octree pattern.

Thus, the resolution of points can be partially controlled in a point cloud to be subjected to Octree encoding (or the resolution of a data group that can be turned into a tree structure can be partially controlled). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

Note that the method of decoding a bit stream may be any method that is compatible with the encoding method, and is not limited to the above described example. For example, a bit stream may be decoded with CAVLC. That is, in this case, the bit stream has been encoded with CAVLC. In that case, instead of the lossless decoding unit 471 and the multi-value conversion unit 473, a lossless decoding unit that conducts CAVLC may be provided.

<Flow in a Decoding Process>

In this case, the flow in a decoding process to be performed by the decoding device 250 is also similar to that in the case described above with reference to the flowchart shown in FIG. 13, and therefore, explanation thereof is not made herein.

<Flow in the Bit Stream Decoding Process>

Figure 28:
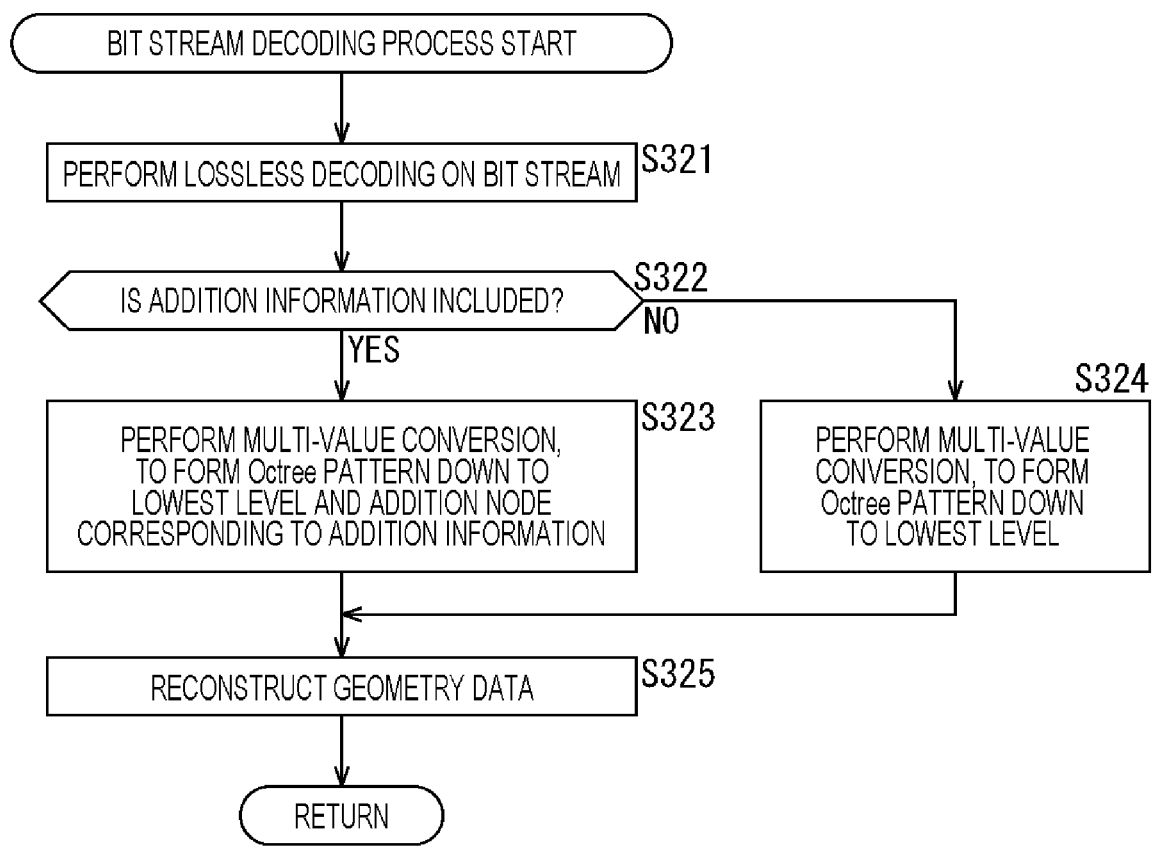
FIG. 28 is a flowchart for explaining an example flow in a bit stream decoding process.

Referring now to the flowchart shown in FIG. 28, an example flow in the bit stream decoding process to be performed in step S161 in FIG. 13 is described.

When the bit stream decoding process is started, the lossless decoding unit 471 in step S321 performs lossless decoding on the bit stream, to obtain binary data.

In step S322, the addition information detection unit 472 determines whether or not addition information is included in the binary data obtained in step S321. When it is determined that addition information is included in the binary data, the process moves on to step S323.

In step S323, the multi-value conversion unit 473 performs multi-value conversion on the binary data, to generate Octree pattern data down to the lowest level. Further, on the basis of the detected addition information, the reconstruction control unit 474 adds the descendant node corresponding to the addition information, to the node corresponding to the addition information at the lowest level of the Octree pattern. After the process in step S323 is completed, the process moves on to step S325.

When it is determined in step S322 that the addition information is not included in the binary data, on the other hand, the process moves on to step S324.

In step S324, the multi-value conversion unit 473 performs multi-value conversion on the binary data, to generate Octree pattern data down to the lowest level. After the process in step S324 is completed, the process moves on to step S325.

In step S325, the geometry reconstruction unit 475 reconstructs the geometry data corresponding to the Octree pattern. When a descendant node is added to the Octree pattern, the geometry reconstruction unit 475 reconstructs geometry data reflecting the addition.

When the process in step S325 is completed, the bit stream decoding process comes to an end, and the process returns to FIG. 13.

As the respective processes are performed as described above, the decoding device 250 can partially control the resolution of the points in a point cloud to be subjected to Octree encoding (or can partially control the resolution of a data group that can be turned into a tree structure). In other words, even when the resolution of the points in a point cloud is partially controlled, Octree encoding can be applied (or even when the resolution of a data group is partially controlled, the data group can be turned into a tree structure). Thus, a decrease in encoding efficiency can be prevented.

5. Other Aspects

<Control Information>

The control information relating to the present technology described in each of the above embodiments may be transmitted from the encoding side to the decoding side. For example, control information (enabled flag, for example) for controlling whether or not to allow (or prohibit) application of the present technology described above may be transmitted. Further, control information specifying the upper limit and/or the lower limit of a block size to which the present technology described above is allowed (or prohibited) to be applied may be transmitted, for example.

<Software>

The above described series of processes can be performed by hardware or can be performed by software. Alternatively, some processes can be executed by hardware, and the other processes can be executed by software. When the series of processes are to be performed by software, the program that forms the software is installed into a computer. Here, the computer may be a computer incorporated into special-purpose hardware, or may be a general-purpose personal computer or the like that can execute various kinds of functions when various kinds of programs are installed thereinto, for example.

FIG. 29 is a block diagram showing an example configuration of the hardware of a computer that performs the above described series of processes in accordance with a program.

In a computer 900 shown in FIG. 29, a central processing unit (CPU) 901, a read only memory (ROM) 902, and a random access memory (RAM) 903 are connected to one another by a bus 904.

An input/output interface 910 is also connected to the bus 904. An input unit 911, an output unit 912, a storage unit 913, a communication unit 914, and a drive 915 are connected to the input/output interface 910.

The input unit 911 is formed with a keyboard, a mouse, a microphone, a touch panel, an input terminal, and the like, for example. The output unit 912 is formed with a display, a speaker, an output terminal, and the like, for example. The storage unit 913 is formed with a hard disk, a RAM disk, a nonvolatile memory, or the like, for example. The communication unit 914 is formed with a network interface, for example. The drive 915 drives a removable medium 921 such as a magnetic disk, an optical disk, a magnetooptical disk, or a semiconductor memory.

In the computer having the above described structure, the CPU 901 loads a program stored in the storage unit 913 into the RAM 903 via the input/output interface 910 and the bus 904, for example, and executes the program, so that the above described series of processes is performed. The RAM 903 also stores data necessary for the CPU 901 to perform various processes and the like as necessary.

The program to be executed by the computer (the CPU 901) may be recorded on the removable medium 921 as a packaged medium or the like to be used, for example. In that case, the program can be installed into the storage unit 913 via the input/output interface 910 when the removable medium 921 is mounted on the drive 915. Alternatively, this program can be provided via a wired or wireless transmission medium such as a local area network, the Internet, or digital satellite broadcasting. In that case, the program may be received by the communication unit 914, and be installed into the storage unit 913. Also, this program may be installed beforehand into the ROM 902 or the storage unit 913.

<Supplement>

Embodiments of the present technology are not limited to the above described embodiments, and various modifications may be made to them without departing from the scope of the present technology.

For example, the present technology may also be embodied as a configuration of a device or a system, such as a processor serving as a system large scale integration (LSI) or the like, a module using processors or the like, a unit using modules or the like, a set (or a configuration in a device) having other functions added to the unit, or the like.

Note that, in the present specification, a system means an assembly of components (devices, modules (parts), and the like), and not all the components need to be provided in the same housing. In view of this, devices that are housed in different housings and are connected to one another via a network form a system, and one device having modules housed in one housing is also a system.

Further, each processing unit described above may be formed with any configuration that has the functions of the processing unit described above. For example, each processing unit may be formed with an appropriate circuit, an LSI, a system LSI, a processor, a module, a unit, a set, a device, an apparatus, a system, or the like. Alternatively, some of these configurations may be combined. For example, configurations of the same type, such as a plurality of circuits and a plurality of processors, may be combined, or configurations of different types, such as a circuit and an LSI, may be combined.

Furthermore, any configuration described above as one device (or one processing unit) may be divided into a plurality of devices (or processing units), for example. Conversely, any configuration described above as a plurality of devices (or processing units) may be combined into one device (or one processing unit). Furthermore, it is of course possible to add components other than those described above to the configuration of any of the devices (or processing units). Further, some components of a device (or processing unit) may be incorporated into the configuration of another device (or processing unit) as long as the configuration and the functions of the entire system remain substantially the same.

The present technology can also be embodied in a cloud computing configuration in which one function is shared among a plurality of devices via a network, and processing is performed by the devices cooperating with one another, for example.

Further, the above described program can be executed by any appropriate device, for example. In that case, the device should have necessary functions (function blocks and the like) so that necessary information can be obtained.

Meanwhile, the respective steps described with reference to the above described flowcharts can be carried out by one device or can be shared among a plurality of devices, for example. Furthermore, when a plurality of processes is included in one step, the plurality of processes included in the step can be performed by one device or can be shared among a plurality of devices. In other words, a plurality of processes included in one step may be performed as processes of a plurality of steps. Conversely, processes described as a plurality of steps may be collectively performed as one step.

A program to be executed by a computer may be a program for performing the processes in the steps according to the program in chronological order in accordance with the sequence described in this specification, or may be a program for performing processes in parallel or performing a process when necessary, such as when there is a call. That is, as long as there is no contradiction, the processes in the respective steps may be performed in a different order from the above described order. Further, the processes in the steps according to this program may be executed in parallel with the processes according to another program, or may be executed in combination with the processes according to another program.

As long as there is no inconsistency, the plurality of the present technologies described in this specification can be implemented independently of one another. It is of course also possible to implement a combination of some of the plurality of the present technologies. For example, part or all of the present technology described in one of the embodiments may be implemented in combination with part or all of the present technology described in another one of the embodiments. Further, part or all of the present technology described above may be implemented in combination with some other technology not described above.

Note that the present technology may also be embodied in the configurations described below.

(1) An information processing device including an encoding unit that encodes Octree pattern data that is the data of an Octree pattern, to generate a bit stream containing depth control information indicating that a leaf node is to be formed at a different level from the lowest level based on information specifying a depth of the Octree pattern.

(2) The information processing device according to (1), in which the depth control information is a predetermined bit string indicating that a particular node corresponding to the depth control information at a higher level than the lowest level of the Octree pattern is a leaf node.

(3) The information processing device according to (2), in which the predetermined bit string is set in a node at a higher level than the lowest level of the Octree pattern in the Octree pattern data, and has a bit pattern indicating that the node in which the predetermined bit string is set is a leaf node, and the encoding unit encodes the Octree pattern data in which the predetermined bit string is set in a leaf node at a higher level than the lowest level of the Octree pattern, to generate the bit stream.

(4) The information processing device according to (3), in which the bit pattern of the predetermined bit string is a bit pattern that is not used for a bit string to be set in a node that is not a leaf node of the Octree pattern.

(5) The information processing device according to (4), in which the bit pattern is "00000000".

(6) The information processing device according to any one of (3) to (5), further including a setting unit that sets the predetermined bit string in a desired node at a different level from the lowest level of the Octree pattern, in which the encoding unit encodes the Octree pattern data including the predetermined bit string set by the setting unit, to generate the bit stream.

(7) The information processing device according to (6), in which
the setting unit sets the bit string, to turn a desired node at a higher level than the lowest level of the Octree pattern into a leaf node when voxel data obtained by quantizing point cloud data is subjected to Octree encoding to generate the Octree pattern.

(8) The information processing device according to (6), in which
the setting unit turns a desired node at a higher level than the lowest level of the Octree pattern into a leaf node in the Octree pattern data, and sets the bit string.

(9) The information processing device according to any one of (1) to (8), in which,
in the bit stream, the depth control information is predetermined flag information indicating whether or not a particular node corresponding to the depth control information at a higher level than the lowest level of the Octree pattern is a leaf node.

(10) The information processing device according to (9), in which
the encoding unit inserts the predetermined flag information at a position corresponding to a leaf node at a higher level than the lowest level of the Octree pattern in the bit stream, the predetermined flag information indicating whether or not the node corresponding to the position is a leaf node.

(11) The information processing device according to (10), further including
a specifying unit that specifies a node to be turned into a leaf node at a different level from the lowest level of the Octree pattern, in which the encoding unit inserts the predetermined flag information at a position corresponding to the node specified by the specifying unit in the bit stream.

(12) The information processing device according to (11), in which
the specifying unit specifies a desired node as a node to be turned into a leaf node, to turn the desired node at a higher level than the lowest level of the Octree pattern into a leaf node when voxel data obtained by quantizing point cloud data is subjected to Octree encoding to generate the Octree pattern.

(13) The information processing device according to (11), in which
the specifying unit turns a desired node at a higher level than the lowest level of the Octree pattern into a leaf node in the Octree pattern data, and specifies the desired node as a node to be turned into a leaf node.

(14) The information processing device according to any one of (1) to (13), in which
the depth control information is addition information regarding addition of a descendant node to a particular node corresponding to the depth control information at the lowest level of the Octree pattern.

(15) The information processing device according to (14), in which
the encoding unit inserts the addition information at a position corresponding to a node at the lowest level of the Octree pattern in the bit stream, the descendant node being added to the node.

(16) The information processing device according to (15), in which
the addition information includes predetermined flag information indicating whether or not the node corresponding to the position at which the addition information has been inserted in the bit stream is further divided.

(17) The information processing device according to (16), in which
the addition information further includes information regarding a depth of the descendant node to be added.

(18) The information processing device according to any one of (14) to (17), further including
a generating unit that generates the addition information, in which the encoding unit inserts the addition information generated by the generating unit at a position corresponding to a node to which the descendant node is to be added at the lowest level of the Octree pattern in the bit stream.

(19) An information processing method including
encoding Octree pattern data that is the data of an Octree pattern, to generate a bit stream containing depth control information indicating that a leaf node is to be formed at a different level from the lowest level based on information specifying a depth of the Octree pattern.

(21) An information processing device including
a decoding unit that decodes a bit stream, to construct an Octree pattern including a leaf node at a different level from the lowest level, on the basis of depth control information indicating that the leaf node is to be formed at a different level from the lowest level based on information specifying a depth of the Octree pattern.

(22) The information processing device according to (21), in which
the depth control information is a predetermined bit string indicating that a particular node corresponding to the depth control information at a higher level than the lowest level of the Octree pattern is a leaf node.

(23) The information processing device according to (22), in which
the predetermined bit string is set in a leaf node at a higher level than the lowest level of the Octree pattern, and has a bit pattern indicating that the node in which the predetermined bit string is set is a leaf node.

(24) The information processing device according to (23), in which
the bit pattern of the predetermined bit string is a bit pattern that is not used for a bit string to be set in a node that is not a leaf node of the Octree pattern.

(25) The information processing device according to (24), in which
the bit pattern is "00000000".

(26) The information processing device according to any one of (21) to (25), in which,
in the bit stream, the depth control information is predetermined flag information indicating whether or not a particular node corresponding to the depth control information at a higher level than the lowest level of the Octree pattern is a leaf node.

(27) The information processing device according to (26), in which
the predetermined flag information is inserted at a position corresponding to a leaf node at a higher level than the lowest level of the Octree pattern in the bit stream, and indicates whether or not the node corresponding to the position is a leaf node.

(28) The information processing device according to (27), further including
a detecting unit that detects the predetermined flag information included in the bit stream, in which the decoding unit constructs the Octree pattern, on the basis of the predetermined flag information detected by the detecting unit.

(29) The information processing device according to any one of (21) to (28), in which the depth control information is addition information regarding addition of a descendant node to a particular node corresponding to the depth control information at the lowest level of the Octree pattern.

(30) The information processing device according to (29), in which the addition information is inserted at a position corresponding to a node at the lowest level of the Octree pattern in the bit stream, the descendant node being added to the node.

(31) The information processing device according to (30), in which the addition information includes predetermined flag information indicating whether or not the node corresponding to the position at which the addition information has been inserted in the bit stream is further divided.

(32) The information processing device according to (31), in which the addition information further includes information regarding a depth of the descendant node to be added.

(33) The information processing device according to any one of (30) to (32), further including a detecting unit that detects the addition information included in the bit stream, in which the decoding unit adds the descendant node corresponding to the addition information generated at a node at the lowest level of the Octree pattern, on the basis of the addition information detected by the detecting unit.

(34) An information processing method including decoding a bit stream, to construct an Octree pattern including a leaf node at a different level from the lowest level, on the basis of depth control information indicating that the leaf node is to be formed at a different level from the lowest level based on information specifying a depth of the Octree pattern.

REFERENCE SIGNS LIST

100 Encoding device
101 Control unit
111 Preprocessing unit
112 Bounding box setting unit
113 Voxel setting unit
114 Encoding unit
221 Octree encoding unit
222 Binarization unit
223 Lossless encoding unit
231 Octree depth control unit
232 Octree construction unit
241 Octree construction unit
242 Octree depth control unit
250 Decoding device
261 Decoding unit
262 Point cloud processing unit
271 Lossless decoding unit
272 Terminal detection unit
273 Multi-value conversion unit
274 Geometry reconstruction unit
321 Octree encoding unit
322 Binarization unit
323 Lossless encoding unit
331 Octree depth control unit
332 Octree construction unit
341 Octree construction unit
342 Octree depth control unit
371 Terminal detection unit
372 Lossless decoding unit
373 Multi-value conversion unit
374 Geometry reconstruction unit
421 Octree depth control unit
422 Addition information generation unit
423 Octree encoding unit
424 Binarization unit
425 Lossless encoding unit
431 Octree construction unit
471 Lossless decoding unit
472 Addition information detection unit
473 Multi-value conversion unit
474 Reconstruction control unit
475 Geometry reconstruction unit
900 Computer

The invention claimed is:

1. An information processing device comprising
circuitry configured to
encode Octree pattern data that is data of an Octree pattern, to generate a bit stream containing depth control information indicating that a leaf node is to be formed at a different level from a lowest level based on information specifying a depth of the Octree pattern,
wherein the depth control information is a predetermined bit string indicating that a particular node corresponding to the depth control information at a higher level than the lowest level of the Octree pattern is a leaf node, and
wherein the predetermined bit string is set in a node at a higher level than the lowest level of the Octree pattern in the Octree pattern data, and has a bit pattern indicating that the node in which the predetermined bit string is set is a leaf node;
encode the Octree pattern data in which the predetermined bit string is set in a leaf node at a higher level than the lowest level of the Octree pattern, to generate the bit stream; and
set the predetermined bit string in a desired node at a different level from the lowest level of the Octree pattern,
wherein the circuitry is configured to encode the Octree pattern data including the predetermined bit string set in the desired node, to generate the bit stream.

2. An information processing device comprising
circuitry configured to encode Octree pattern data that is data of an Octree pattern, to generate a bit stream containing depth control information indicating that a leaf node is to be formed at a different level from a lowest level based on information specifying a depth of the Octree pattern, wherein
the depth control information is addition information regarding addition of a descendant node to a particular node corresponding to the depth control information at the lowest level of the Octree pattern.

3. The information processing device according to claim 2, wherein
the circuitry is configured to insert the addition information at a position corresponding to a node at the lowest level of the Octree pattern in the bit stream, the descendant node being added to the node.

4. The information processing device according to claim 3, wherein
the addition information includes predetermined flag information indicating whether or not a node corresponding to the position at which the addition information has been inserted in the bit stream is further divided.

5. The information processing device according to claim 4, wherein
the addition information further includes information regarding a depth of the descendant node to be added.

6. An information processing method comprising
encoding Octree pattern data that is data of an Octree pattern, to generate a bit stream containing depth control information indicating that a leaf node is to be formed at a different level from a lowest level based on information specifying a depth of the Octree pattern, wherein
the depth control information is addition information regarding addition of a descendant node to a particular node corresponding to the depth control information at the lowest level of the Octree pattern.

7. An information processing device comprising
circuitry configured to decode a bit stream, to construct an Octree pattern including a leaf node at a different level from a lowest level, on a basis of depth control information indicating that the leaf node is to be formed at a different level from the lowest level based on information specifying a depth of the Octree pattern, wherein
the depth control information is addition information regarding addition of a descendant node to a particular node corresponding to the depth control information at the lowest level of the Octree pattern.

8. The information processing device according to claim 7, wherein
the addition information is inserted at a position corresponding to a node at the lowest level of the Octree pattern in the bit stream, the descendant node being added to the node.

9. An information processing method comprising
decoding a bit stream, to construct an Octree pattern including a leaf node at a different level from a lowest level, on a basis of depth control information indicating that the leaf node is to be formed at a different level from the lowest level based on information specifying a depth of the Octree pattern, wherein
the depth control information is addition information regarding addition of a descendant node to a particular node corresponding to the depth control information at the lowest level of the Octree pattern.

* * * * *